US009530809B2

(12) United States Patent
Ishizaki et al.

(10) Patent No.: US 9,530,809 B2
(45) Date of Patent: Dec. 27, 2016

(54) LAYERED STRUCTURE, THIN FILM TRANSISTOR ARRAY, AND METHOD OF MANUFACTURING THE SAME

(71) Applicant: Toppan Printing Co., Ltd., Taito-ku, Tokyo (JP)

(72) Inventors: Mamoru Ishizaki, Tokyo (JP); Kaoru Hatta, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 0 days.

(21) Appl. No.: 14/664,683

(22) Filed: Mar. 20, 2015

(65) Prior Publication Data

US 2015/0221685 A1 Aug. 6, 2015

Related U.S. Application Data

(63) Continuation of application No. PCT/JP2013/005125, filed on Aug. 29, 2013.

(30) Foreign Application Priority Data

Sep. 26, 2012 (JP) ................................. 2012-212531

(51) Int. Cl.
*H01L 27/12* (2006.01)
*H01L 29/66* (2006.01)
*H01L 29/788* (2006.01)

(52) U.S. Cl.
CPC ......... *H01L 27/1292* (2013.01); *H01L 27/124* (2013.01); *H01L 27/1225* (2013.01);
(Continued)

(58) Field of Classification Search
CPC ............... H01L 27/1225; H01L 27/124; H01L 27/1251; H01L 27/1292; H01L 29/66825; H01L 29/788; H01L 27/1255; H01L 29/42384; H01L 21/707; H01L 21/7687; H01L 27/016; H01L 27/1108; H01L 27/3274; H01L 29/41733; H01L 29/4908
See application file for complete search history.

(56) References Cited

U.S. PATENT DOCUMENTS 6,040,589 A    3/2000 Zhang et al.
8,941,958 B2 * 1/2015 Tomatsu ............. H01L 27/0266
                                                361/56
(Continued)

FOREIGN PATENT DOCUMENTS

JP    H10-012735 A    1/1998
JP    2004-088121 A   3/2004
(Continued)

OTHER PUBLICATIONS

International Search Report dated Sep. 24, 2013 issued in Application No. PCT/JP2013/005125.

*Primary Examiner* — Jarrett Stark
*Assistant Examiner* — Bitew Dinke
(74) *Attorney, Agent, or Firm* — Foley & Lardner LLP

(57) ABSTRACT

A layered structure includes a first electrode layer on an insulating substrate, a first insulating film on the first electrode layer, a second electrode layer on the first insulating film, a second insulating film on the second electrode layer, and a third electrode layer on the second insulating film. The first electrode layer, an opening of the first insulating film, the second electrode layer, an opening of the second insulating film, and the third electrode layer have a stack structure that causes the first electrode layer and the second electrode layer to be connected. The third electrode layer relays or reinforces, through the opening of the second insulating film, a connection between the first electrode layer and the second electrode layer formed on the first insulating film.

7 Claims, 45 Drawing Sheets

(52) U.S. Cl.
CPC ...... H01L 27/1251 (2013.01); H01L 27/1255 (2013.01); H01L 29/66825 (2013.01); H01L 29/788 (2013.01); *H01L 2224/11* (2013.01)

(56) References Cited

U.S. PATENT DOCUMENTS

| | | | | |
|---|---|---|---|---|
| 2006/0208275 A1* | 9/2006 | Yun | G02F 1/133555 | 257/147 |
| 2007/0128760 A1* | 6/2007 | Subramanian | H01L 29/86 | 438/57 |
| 2007/0278488 A1* | 12/2007 | Hirabayashi | H01L 27/14603 | 257/59 |
| 2008/0197348 A1* | 8/2008 | Matsubara | H01L 27/283 | 257/40 |
| 2008/0239189 A1* | 10/2008 | Hatta | H01L 29/7869 | 349/46 |
| 2009/0121225 A1* | 5/2009 | Ishizaki | H01L 27/1225 | 257/59 |
| 2011/0318889 A1 | 12/2011 | Chida | | |
| 2012/0001189 A1* | 1/2012 | Matsubara | G02F 1/136286 | 257/59 |
| 2012/0218485 A1* | 8/2012 | Chikama | G02F 1/136213 | 349/39 |
| 2012/0241750 A1* | 9/2012 | Chikama | H01L 27/1248 | 257/71 |
| 2013/0039455 A1* | 2/2013 | Horiuchi | G11C 19/184 | 377/54 |
| 2013/0062607 A1* | 3/2013 | Yamazaki | H01L 27/0266 | 257/59 |
| 2013/0153904 A1* | 6/2013 | Nishimura | G02F 1/133345 | 257/57 |
| 2013/0215354 A1* | 8/2013 | Yoon | G02F 1/1309 | 349/46 |
| 2013/0285054 A1* | 10/2013 | Moriguchi | H01L 27/1225 | 257/43 |
| 2015/0108467 A1* | 4/2015 | Moriguchi | H01L 27/1225 | 257/43 |

FOREIGN PATENT DOCUMENTS

| | | | | |
|---|---|---|---|---|
| JP | 2010-056356 A | 3/2010 | | |
| JP | 2010-212326 A | 9/2010 | | |
| JP | 2010-258334 A | 11/2010 | | |
| JP | WO 2011135873 A1 * | 11/2011 | ........... G11C 19/184 | |
| JP | 2012-028761 A | 2/2012 | | |
| JP | WO 2012077682 A1 * | 6/2012 | ......... H01L 27/1225 | |

* cited by examiner

FIG. 6A
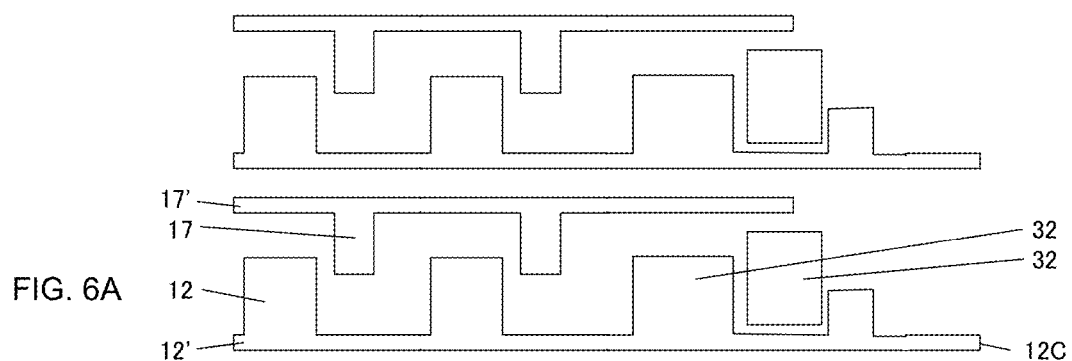
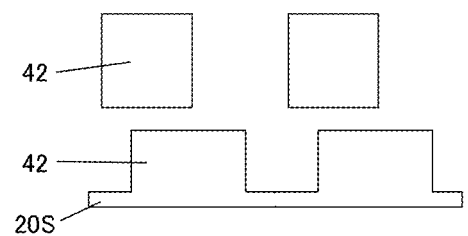
FIG. 6B
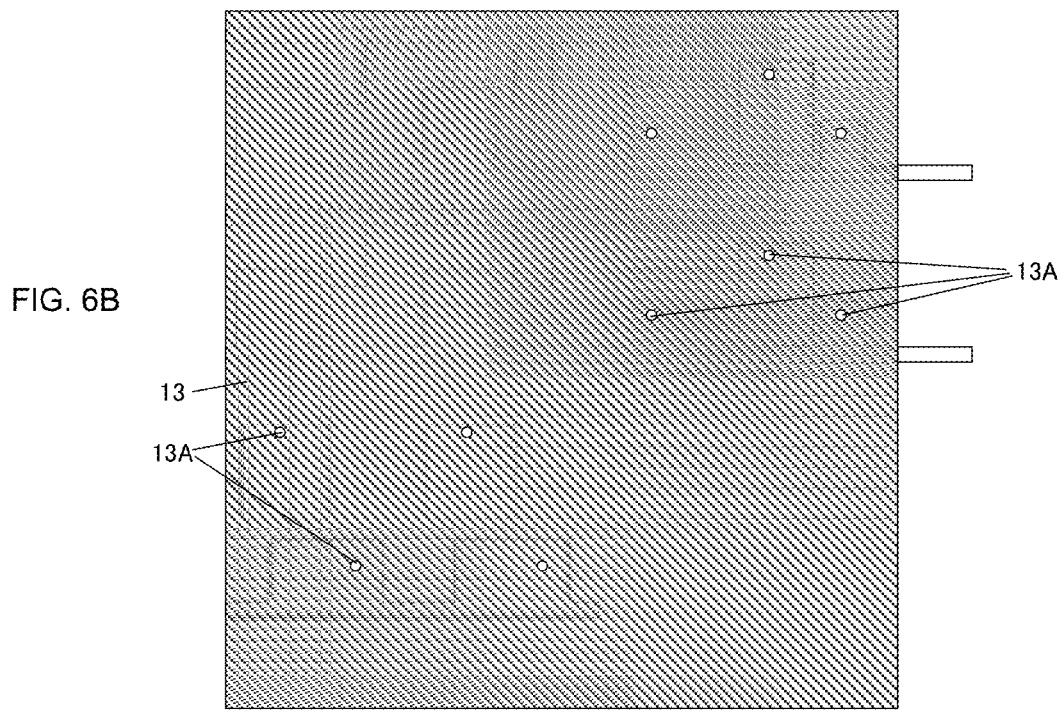

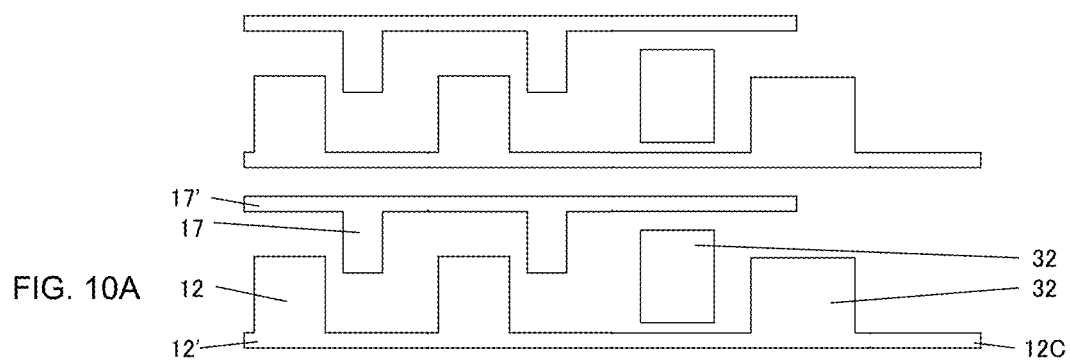
FIG. 10A
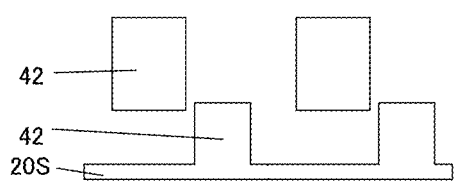
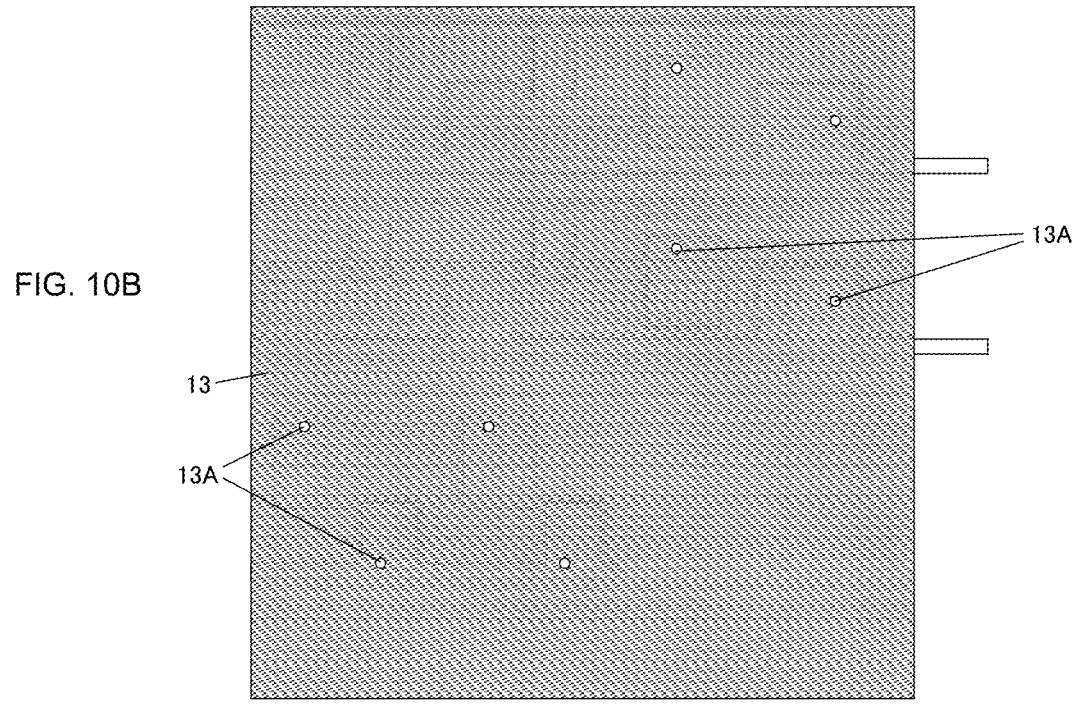
FIG. 10B

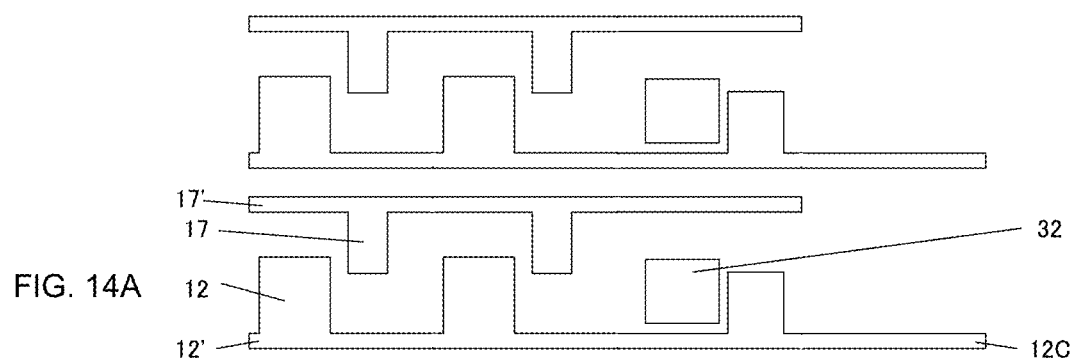
FIG. 14A
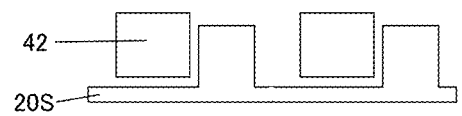
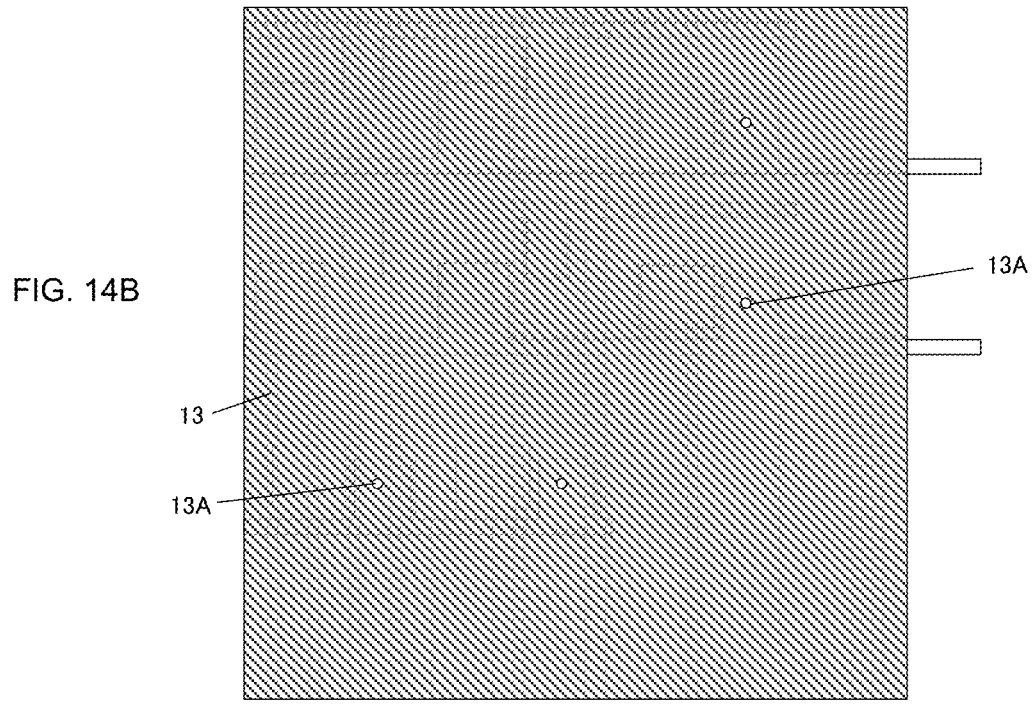
FIG. 14B

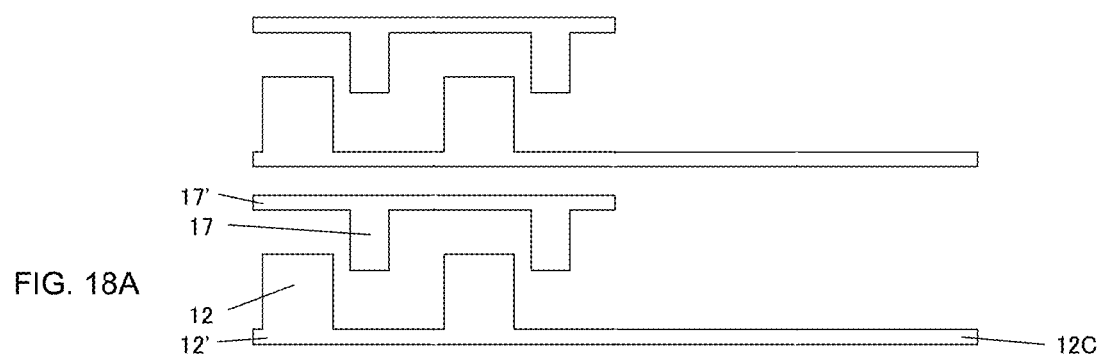
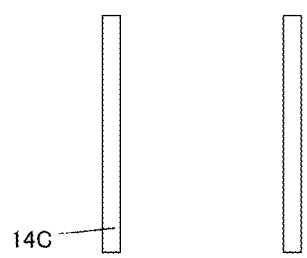
FIG. 18A
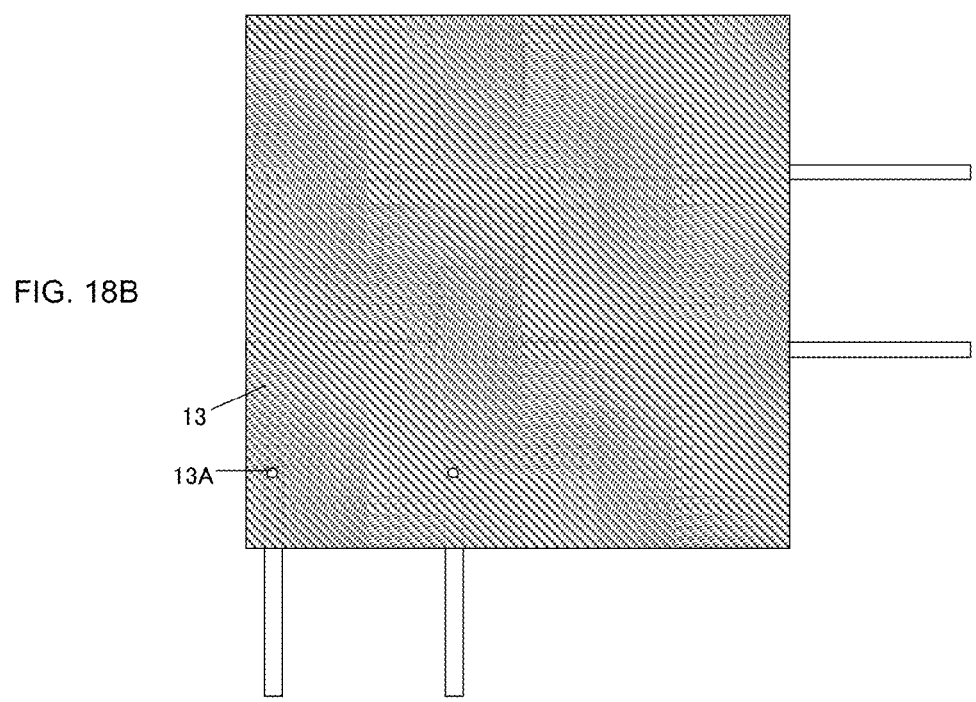
FIG. 18B

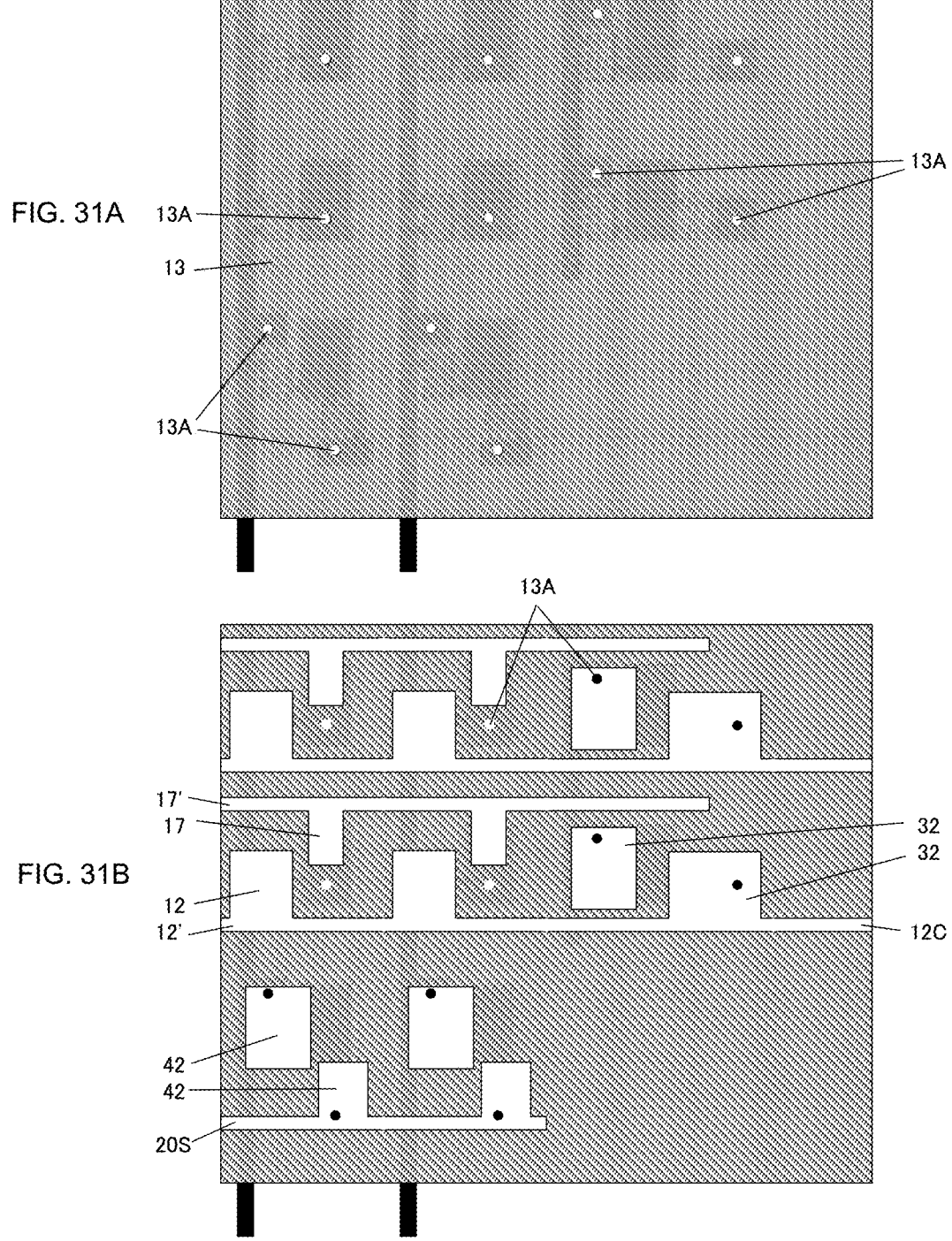

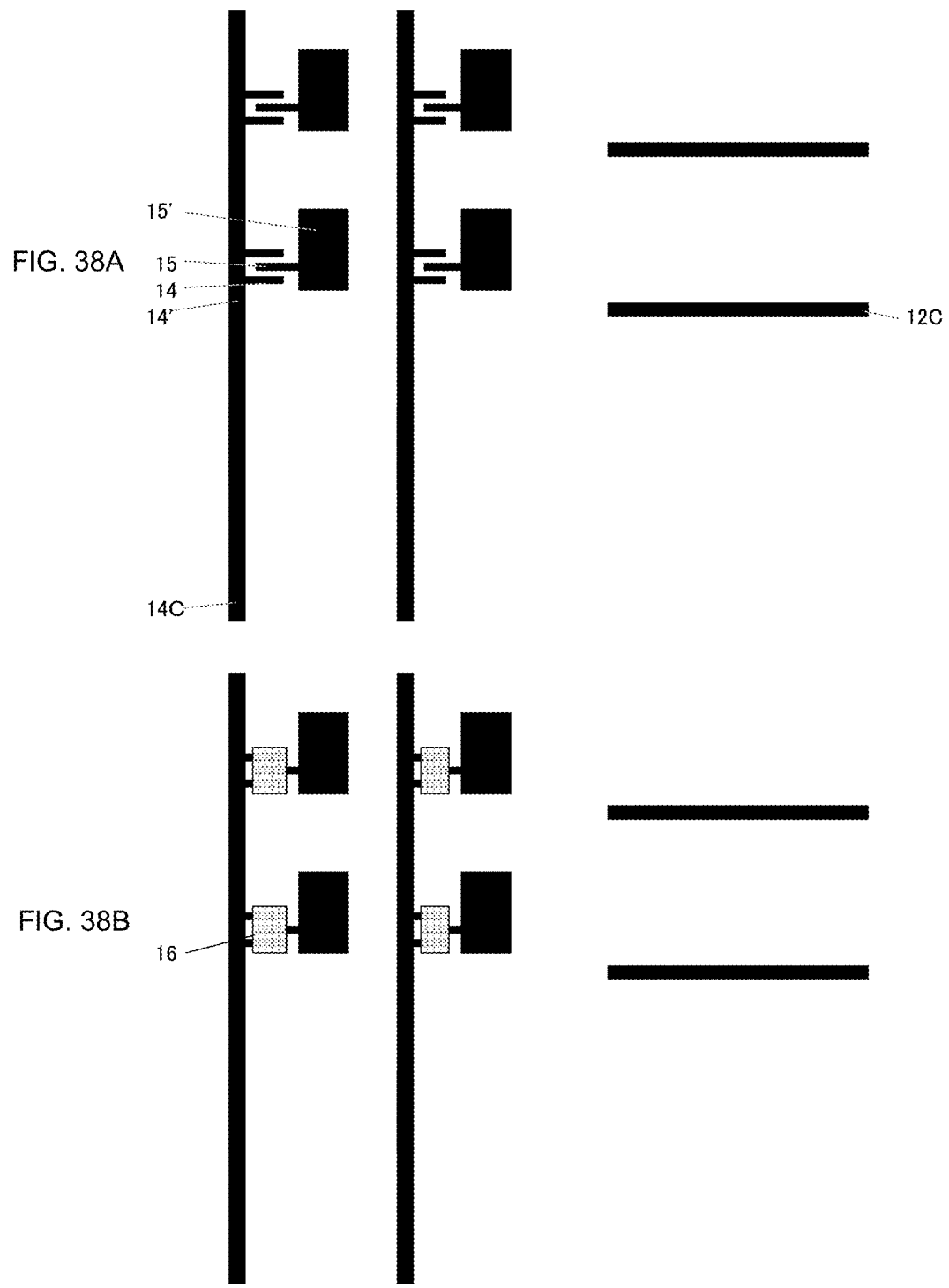

LAYERED STRUCTURE, THIN FILM TRANSISTOR ARRAY, AND METHOD OF MANUFACTURING THE SAME

CROSS-REFERENCE TO RELATED PATENT APPLICATIONS

This application is a continuation application filed under 35 U.S.C. 111(a) claiming the benefit under 35 U.S.C. §§120 and 365(c) of PCT International Application No. PCT/JP2013/005125 filed on Aug. 29, 2013, which is based upon and claims the benefit of priority of Japanese Application No. 2012-212531 filed on Sep. 26, 2012, the entire contents of which are hereby incorporated by reference in their entireties.

BACKGROUND

Technical Field

The present invention relates to layered structures, and, more particularly, to thin film transistors used for image display devices.

Background Art

Amorphous silicon (a-Si) thin film transistors (TFT) and polysilicon (poly-Si) thin film transistors on glass substrates employing transistor and IC technologies that use semiconductors as substrates have been manufacturered. These thin film transistors are used for liquid crystal displays as switches (see *Liquid Crystal Display Technology-Active Matrix LCD-*, edited by Shoichi Matsumoto, Sangyo Tosho (Nov. 11, 1996)). When a TFT is turned on by a selected voltage being applied to a wire for the gate, a signal voltage supplied to a source wire is applied to a pixel electrode connected to the drain. The applied voltage is stored in a storage capacitor comprised of the pixel electrode, a gate insulating film, and a capacitor electrode.

For TFT arrays, the workings of the source and those of the drain change depending on the polarity of an applied voltage, and so calling their names by work may create confusion. Thus, for convenience, one side of each TFT is referred to as source, and another side thereof is referred to as drain. In the present invention, one side of a TFT connected to a wire is referred to as a source, and another side connected to a pixel electrode is referred to as a drain.

Recently, there have been developed oxide semiconductors and organic semiconductors, and TFTs can be manufactured at a low temperature of not more than 200° C. This raises hopes for flexible displays made with plastic substrates; these flexible displays being more light in weight, difficult to break, and able to be thin in addition to being flexible. It is hoped that cheap, large-area displays based on TFTs can be fabricated by printing.

SUMMARY OF INVENTION

Technical Problem

An additional-layer connection step is easily performed during a conventional process of repeating a vacuum coating step and a photolithography and etching step. For example, let us consider the case of forming a second electrode layer 4 on a sample. The sample has a substrate 1 on which a first electrode layer 2 is mounted, and a first insulating film 3 having an opening is mounted on the first electrode layer 2. In this case, forming the second electrode layer 4 using vacuum coating, such as sputtering or evaporation coating, makes it possible to easily cover a recess of the insulating film 3. Thereafter, patterning of the second electrode layer 4 using photolithography and etching obtains the structure illustrated in FIGS. 45E and 45F.

However, it is difficult for thin-film printing, such as reverse offset printing, flexography, or the like, to cover the recess. For example, let us consider some cases of attempting to print the second electrode 4 on the sample; the sample has the substrate 1, the first electrode 2 formed on the substrate, and the first insulating film 3, the second electrode layer 4 being mounted on the first insulating film 3. This obtains the following different possible results:

1. The second electrode 4 is printed on only the insulating film 3 (see FIGS. 45A and 45B)
2. The second electrode layer 4 is printed on both the insulating film 3 and the bottom of the recess such that a portion of the second electrode layer 4 on the insulating film 3 is separated from a portion of the second electrode layer 4 on the bottom of the recess (see FIGS. 45C and 45D)
3. The second electrode layer 4 is printed on both the insulating film 3 and the bottom of the recess such that a portion of the second electrode layer 4 on the insulating film 3 is joined to a portion of the second electrode layer 4 on the bottom of the recess (see FIGS. 45E and 45F).

Note that, in FIGS. 45A to 45F, the cross sectional view is located on the left, and the plan view is located on the right.

As described above, there may be a problem of unstable connection between the first electrode layer 2 and the second electrode layer 4.

In view of the circumstances of the conventional art, the present invention aims to provide layered structures, thin film transistor arrays, and method of manufacturing them, which are capable of eliminating unstable connection between a first electrode layer and a second electrode layer, resulting in reliable connection between the first electrode layer and the second electrode layer.

Means for Solving Problem

In order to solve the problem, a first representative example of the invention is a layered structure. The layered structure includes a first electrode layer on an insulating substrate; a first insulating film on the first electrode layer; a second electrode layer on the first insulating film; a second insulating film on the second electrode layer; and a third electrode layer on the second insulating film. The first electrode layer, an opening of the first insulating film, the second electrode layer, an opening of the second insulating film, and the third electrode layer have a stack structure that causes the first electrode layer and the second electrode layer to be connected. The third electrode layer relays or reinforces, through the opening of the second insulating film, a connection between the first electrode layer in the opening of the first insulating film and the second electrode layer on the first insulating film.

A second representative example of the invention is a thin film transistor array. The thin film transistor array includes, on an insulating substrate, a first electrode layer. The first electrode layer includes a gate wire; a gate electrode connected to the gate wire; a capacitor wire; and a capacitor electrode connected to the capacitor wire. The thin film transistor array includes a gate insulating film on the first electrode layer; and a second electrode layer on the gate insulating film. The second electrode layer includes a source wire; a source electrode connected to the source wire; a drain electrode; and a pixel electrode connected to the drain electrode. The thin film transistor array includes a semiconductor located between the source electrode and the drain electrode. The gate electrode overlaps the semiconductor via the gate insulating film, and the capacitor electrode overlaps the pixel electrode via the gate insulating film. The thin film transistor array includes an interlayer insulating film having an opening on the pixel electrode; and a third electrode layer including an upper pixel electrode connected to the pixel electrode via the opening. Besides the upper pixel, the third electrode layer includes connection portions. In each portion, the first electrode layer, an opening of the gate insulating film, the second electrode layer, the opening of the interlayer insulating film, and the third electrode layer have a stack structure that causes the first electrode layer and the second electrode layer to be connected. The third electrode layer relays or reinforces, through the opening of the interlayer insulating film, a connection between the first electrode layer in the opening of the gate insulating film and the second electrode layer on the gate insulating film.

A third representative example of the invention is a thin film transistor array according to the second invention. The thin film transistor array further includes a common electrode around the thin film transistor array. The common electrode includes a gate common electrode and a source common electrode. The thin film transistor array includes gate protective elements located between the gate wires and the gate common electrode; and source protective elements located between the source wires and the source common electrode. The common electrode is directly connected to a ground potential or the ground potential via a resistor. The gate common electrode is included in the second electrode layer, and the source common electrode is included in the first electrode layer.

At least one of the gate protective elements and the source protective elements includes:

a pair of diode-connected thin film transistors connected in parallel to each other such that one of the diode-connected thin film transistors is opposite in direction to the other thereof;

a pair of diode-connected thin film transistors connected in series to each other such that one of the diode-connected thin film transistors is opposite in direction to the other thereof; or a floating-gate thin film transistor.

The third electrode layer relays or reinforces, as the connection between the first electrode layer and the second electrode layer, at least one of a short-circuit portion between a gate electrode and a source electrode of the gate protective element, a short-circuit portion between a gate electrode and a source electrode of the source protective element, a connection portion between the gate wire and the gate protective element, and a connection portion between the source protective element and the source common electrode.

A fourth representative example of the invention is the thin film transistor array according to the second invention. In the thin film transistor array, the gate connection electrode and the source connection electrode of the thin film transistor array are included in the first electrode layer. The third electrode layer relays or reinforces, as the connection between the first electrode layer and the second electrode layer, a connection portion between the source connection electrode and the source wire.

A fifth representative example of the invention is the thin film transistor array according to the second invention. In the thin film transistor, the gate connection electrode and the source connection electrode of the thin film transistor array are included in the second electrode layer. The third electrode layer relays or reinforces, as the connection between the first electrode layer and the second electrode layer, a connection portion between the gate wire and the gate connection electrode.

A sixth representative example of the invention is a thin film transistor array. The thin film transistor array includes, on an insulating substrate, a first electrode layer. The first electrode layer includes a source wire; a source electrode connected to the source wire; a drain electrode; and a pixel electrode connected to the drain electrode. The thin film transistor array includes a semiconductor between the source electrode and the drain electrode and includes a gate insulating film having an opening on the pixel electrode. The thin film transistor array includes a second electrode layer on the gate insulating film. The second electrode layer includes a gate wire; a gate electrode connected to the gate wire; a capacitor wire; and a capacitor electrode connected to the capacitor wire. The gate electrode overlaps the semiconductor via the gate insulating film, and the capacitor electrode overlaps the pixel electrode via the gate insulating film. The thin film transistor array includes an interlayer insulating film having an opening above the opening of the gate insulating film; and a third electrode layer including an upper pixel electrode connected to the pixel electrode via the opening of the interlayer insulating film. Besides the upper pixel, the third electrode layer includes connection portions. In each portion, the first electrode layer, the opening of the gate insulating film, the second electrode layer, the opening of the interlayer insulating film, and the third electrode layer have a stack structure that causes the first electrode layer and the second electrode layer to be connected. The third electrode layer relays or reinforces, through the opening of the interlayer insulating film, a connection between the first electrode layer in the opening of the gate insulating film and the second electrode layer on the gate insulating film.

A seventh representative example of the invention is the thin film transistor array according to the sixth invention. The thin film transistor array further includes a common electrode around the thin film transistor array. The common electrode includes a gate common electrode and a source common electrode. The thin film transistor array includes gate protective elements located between the gate wires and the gate common electrode, and source protective elements located between the source wires and the source common electrode. The common electrode is directly connected to a ground potential or the ground potential via a resistor. The gate common electrode is included in the first electrode layer, and the source common electrode is included in the second electrode layer.

At least one of the gate protective elements and the source protective elements includes:

a pair of diode-connected thin film transistors connected in parallel to each other such that one of the diode-connected thin film transistors is opposite in direction to the other thereof;

a pair of diode-connected thin film transistors connected in series to each other such that one of the diode-connected thin film transistors is opposite in direction to the other thereof; or a floating-gate thin film transistor.

The third electrode layer relays or reinforces, as the connection between the first electrode layer and the second electrode layer, at least one of:

a short-circuit portion between a drain electrode and a gate electrode of the gate protective element;

a short-circuit portion between a drain electrode and a gate electrode of the source protective element;

a connection portion between the gate protective element and the gate wire; and a connection portion between the source common electrode and the source protective element.

An eighth representative example of the invention is the thin film transistor array according to the sixth invention. In the thin film transistor array, the gate connection electrode and the source connection electrode of the thin film transistor array are included in the first electrode layer. The third electrode layer relays or reinforces, as the connection between the first electrode layer and the second electrode layer, a connection portion between the gate connection electrode and the gate wire.

A ninth representative example of the invention is the thin film transistor array according to the sixth invention. In the thin film transistor array, the gate connection electrode and the source connection electrode of the thin film transistor array are included in the second electrode layer. The third electrode layer relays or reinforces, as the connection between the first electrode layer and the second electrode layer, a connection portion between the source wire and the source connection electrode.

A tenth representative example of the invention is a method of manufacturing a layered structure. The method includes the step of forming a first electrode layer on an insulating substrate, and the step of depositing a first insulating film having an opening such that at least a portion of the first electrode layer is included in the opening. The method includes the step of forming a second electrode layer such that the second electrode layer overlaps or adjoins at least a portion of the opening of the first insulating film. The method includes the step of depositing a second insulating film having an opening such that the opening covers at least the portion of the first electrode layer included in the opening of the first insulating film, and includes a portion of the second electrode layer. The method includes the step of forming a third electrode layer such that the third electrode layer relays or reinforces, at least through the opening of the interlayer insulating film, a connection between the portion of the first electrode layer in the opening of the first insulating film and the portion of the second electrode layer on the first insulating film. The step of forming the second electrode layer forms the second electrode layer using printing.

An eleventh representative example of the invention is a method of manufacturing a thin film transistor array. The method includes the step of forming a first electrode layer on an insulating substrate. The first electrode layer includes a gate wire; a gate electrode connected to the gate wire; a capacitor wire; a capacitor electrode connected to the capacitor wire; gates of a gate protective element and a source protective element; and a source common electrode. The method includes the step of depositing, on the substrate on which the first electrode layer has been formed, a gate insulating film having openings to the gates of the gate protective element and source protective element and to the source common electrode. The method includes the step of forming, on the substrate on which the gate insulating film has been deposited, a second electrode layer. The second electrode layer including a source wire; a source electrode connected to the source wire; a drain electrode; a pixel electrode connected to the drain electrode; sources and drains of the gate protective element and the source protective element; and a gate common electrode. The method includes the step of forming semiconductors between the source electrodes and the drain electrodes, and the step of depositing an interlayer insulating film having openings located above the pixel electrode and the openings of the gate insulating film. The method includes the step of forming a third electrode layer. The third electrode layer includes an upper pixel electrode connected to the pixel electrode via a corresponding one of the openings of the interlayer insulating film on the pixel electrode. Besides the upper pixel electrodes, the third electrode includes four kinds of connection reinforcement electrode. The first connection reinforcement electrode is on a stack structure of the gate of the gate protective element, a corresponding one of the openings of the gate insulating film, the drain of the gate protective element, and a corresponding one of the openings of the interlayer insulating film in this order. The second connection reinforcement electrode is on a stack structure of the gate wire, a corresponding one of the openings of the gate insulating film, the source or drain of the gate protective element, and a corresponding one of the openings of the interlayer insulating film in this order. The third connection reinforcement electrode is on a stack structure of the gate of the source protective element, a corresponding one of the openings of the gate insulating film, the drain of the source protective element, and a corresponding one of the openings of the interlayer insulating film in this order. The fourth connection reinforcement electrode is on a stack structure of the source common electrode, a corresponding one of the openings of the gate insulating film, the source or drain of the source protective element, and a corresponding one of the openings of the interlayer insulating film in this order. The step of forming the second electrode layer forms the second electrode layer using printing.

A twelfth representative example of the invention is a method of manufacturing a thin film transistor array. The method includes the step of forming a first electrode layer on an insulating substrate. The first electrode layer includes a gate wire; a gate electrode connected to the gate wire; a gate connection electrode connected to the gate wire; a capacitor wire; a capacitor electrode connected to the capacitor wire; and a source connection electrode. The method includes the step of depositing a gate insulating film having an opening to the source connection electrode. The method includes the step of forming, on the substrate on which the gate insulating film has been deposited, a second electrode layer. The second electrode layer includes a source wire; a source electrode connected to the source wire; a drain electrode; and a pixel electrode connected to the drain electrode. The method includes the step of forming semiconductors between the source electrodes and the drain electrodes; and the step of depositing an interlayer insulating film having openings located above the pixel electrode and the opening of the gate insulating film. The method includes the step of forming a third electrode layer. The third electrode layer includes an upper pixel electrode connected to the pixel electrode via a corresponding one of the openings of the interlayer insulating film located above the pixel electrode. Besides the upper pixel electrodes, the third electrode includes a connection reinforcement electrode. The connection reinforcement electrode is on a stack structure of the source connection electrode, the opening of the gate insulating film, the source wire, and a corresponding one of the openings of the interlayer insulating film in this order. The step of forming the second electrode layer forms the second electrode layer using printing.

A thirteenth representative example of the invention is a method of manufacturing a thin film transistor array. The method includes the step of forming a first electrode layer on an insulating substrate. The first electrode layer includes a gate wire; a gate electrode connected to the gate wire; a capacitor wire; and a capacitor electrode connected to the capacitor wire. The method includes the step of depositing a gate insulating film having an opening on the gate wire, and the step of forming, on the substrate on which the gate insulating film has been deposited, a second electrode layer. The second electrode layer includes a source wire; a source electrode connected to the source wire; a source connection electrode connected to the source wire; a drain electrode; a pixel electrode connected to the drain electrode; and a gate connection electrode. The method includes the step of forming semiconductors between the source electrodes and the drain electrodes; and the step of depositing an interlayer insulating film having openings located above the pixel electrode and the opening of the gate insulating film. The method includes the step of forming a third electrode layer. The third electrode layer includes an upper pixel electrode connected to the pixel electrode via a corresponding one of the openings of the interlayer insulating film located above the pixel electrode; and a connection reinforcement electrode. The connection reinforcement electrode is on a stack structure of the gate wire, the opening of the gate insulating film, the gate connection electrode, and a corresponding one of the openings of the interlayer insulating film in this order. The step of forming the second electrode layer forms the second electrode layer using printing.

A fourteenth representative example of the invention is a method of manufacturing a thin film transistor array. The method includes the step of forming a first electrode layer on an insulating substrate. The first electrode layer includes a source wire; a source electrode connected to the source wire; a drain electrode; a pixel electrode connected to the drain electrode; drains and sources of a gate protective element and a source protective element; and a gate common electrode. The method includes the step of forming semiconductors between the source electrodes and the drain electrodes. The method includes the step of depositing, on the substrate on which the first electrode layer and the semiconductor have been formed, a gate insulating film having openings to the drains of the gate protective element and source protective element and to the gate common electrode. The method includes the step of forming, on the substrate on which the gate insulating film has been deposited, a second electrode layer. The second electrode layer includes a gate wire; a gate electrode connected to the gate wire; a capacitor wire; a capacitor electrode connected to the capacitor wire; gates of the gate protective element and source protective element; and a source common electrode. The method includes the step of depositing an interlayer insulating film having openings located above the pixel electrode and the openings of the gate insulating film; and the step of forming a third electrode layer. The third electrode layer includes an upper pixel electrode connected to the pixel electrode via a corresponding one of the openings of the interlayer insulating film located above the pixel electrode. Besides the upper pixel electrodes, the third electrode includes four kinds of connection reinforcement. The third electrode layer includes a first connection reinforcement electrode on a stack structure of the drain of the gate protective element, a corresponding one of the openings of the gate insulating film, the gate of the gate protective element, and a corresponding one of the openings of the interlayer insulating film in this order. The third electrode layer includes a second connection reinforcement electrode on a stack structure of the source and drain of the gate protective element, a corresponding one of the openings of the gate insulating film, the gate common electrode, and a corresponding one of the openings of the interlayer insulating film in this order. The third electrode layer includes a third connection reinforcement electrode on a stack structure of the drain of the source protective element, a corresponding one of the openings of the gate insulating film, the gate of the source protective element, and a corresponding one of the openings of the interlayer insulating film in this order. The third electrode layer includes a fourth connection reinforcement electrode on a stack structure of the source or drain of the source protective element, a corresponding one of the openings of the gate insulating film, the source common electrode, and a corresponding one of the openings of the interlayer insulating film in this order. The step of forming the second electrode layer forms the second electrode layer using printing.

A fifteenth representative example of the invention is a method of manufacturing a thin film transistor array. The method includes the step of forming a first electrode layer on an insulating substrate. The first electrode layer includes a source connection electrode; a source wire; a source electrode connected to the source wire; a drain electrode; a pixel electrode connected to the drain electrode; and a gate connection electrode. The method includes the step of forming a semiconductor between the source electrode and the drain electrode. The method includes the step of depositing a gate insulating film having an opening to the gate connection electrode. The method includes the step of forming, on the substrate on which the gate insulating film has been deposited, a second electrode layer. The second electrode layer includes a gate wire; a gate electrode connected to the gate wire; a capacitor wire; and a capacitor electrode connected to the capacitor wire. The method includes the step of depositing, on the substrate on which the first electrode layer, the semiconductor, gate insulating film and the second electrode layer have been formed, an interlayer insulating film having openings located above the pixel electrode and the opening of the gate insulating film. The method includes the step of forming a third electrode layer. The third electrode layer includes an upper pixel electrode connected to the pixel electrode via a corresponding one of the openings of the interlayer insulating film located above the pixel electrode. Besides the upper pixel electrode, The third electrode layer includes a connection reinforcement electrode on a stack structure of the gate connection electrode, the opening of the gate insulating film, the gate wire, and a corresponding one of the openings of the interlayer insulating film in this order. The step of forming the second electrode layer forms the second electrode layer using printing.

A sixteenth representative example of the invention is a method of manufacturing a thin film transistor array. The method includes the step of forming a first electrode layer on an insulating substrate. The first electrode layer includes a source wire; a source electrode connected to the source wire; a drain electrode; and a pixel electrode connected to the drain electrode. The method includes the step of forming a semiconductor between the source electrode and the drain electrode, and the step of depositing a gate insulating film having an opening to the source wire. The method includes the step of forming, on the substrate on which the gate insulating film has been deposited, a second electrode layer. The second electrode layer includes a gate connection electrode; a gate wire; a gate electrode connected to the gate wire; a capacitor wire; a capacitor electrode connected to the capacitor wire; and a source connection electrode. The method includes the step of depositing an interlayer insulating film having openings located above the pixel electrode and the opening of the gate insulating film. The method includes the step of forming a third electrode layer. The third electrode layer includes an upper pixel electrode connected to the pixel electrode via a corresponding one of the openings of the interlayer insulating film located above the pixel electrode. The third electrode layer also includes a connection reinforcement electrode on a stack structure of the source wire, the opening of the gate insulating film, the source connection electrode, and a corresponding one of the openings of the interlayer insulating film in this order. The step of forming the second electrode layer forms the second electrode layer using printing.

A seventeenth representative example of the invention is the method of manufacturing a layered structure according to the tenth invention. In the method, at least the step of forming the second electrode layer forms the second electrode layer using reverse-offset printing. An eighteenth representative example of the invention is the method of manufacturing a layered structure according to the tenth invention or seventeenth invention. In the method, at least the step of forming the third electrode layer forms the third electrode layer using screen printing or gravure-offset printing.

A nineteenth representative example of the invention is the method of manufacturing a thin film transistor array according to any one of the eleventh to sixteenth invention. In the method, at least the step of forming the second electrode layer forms the second electrode layer using reverse-offset printing. A twentieth representative example of the invention and a twenty-first representative example of the invention are the method of manufacturing a thin film transistor array according to any one of the eleventh to sixteenth invention and the nineteenth invention. In the method, at least the step of forming the third electrode layer forms the third electrode layer using screen printing or gravure-offset printing.

According to the first invention, the third electrode layer relays or reinforces the connection between the first electrode layer and the second electrode layer. Thus, the first invention offers a layered structure with the stable connection.

According to each of the second to fifth inventions, the third electrode layer relays or reinforces the connection between the first electrode layer and the second electrode layer. Thus, each of the second to fifth inventions provides bottom-gate thin film transistors each having the stable connection.

According to each of the sixth to ninth inventions, the third electrode layer relays or reinforces the connection between the first electrode layer and the second electrode layer. Thus, each of the sixth to ninth embodiments provides top-gate thin film transistors each having the stable connection.

Each of the tenth, seventeenth, and eighteenth inventions provides a method of manufacturing the corresponding layered structure in which the third electrode layer reinforces the connection between the first electrode layer and the second electrode layer.

Each of the eleventh to sixteenth inventions, the nineteenth to twenty-first inventions provides a method of manufacturing the corresponding thin film transistor array in which the third electrode layer reinforces the connection between the first electrode layer and the second electrode layer.

Effect of the Invention

Layered structures of the present inventions are each configured such that the third electrode layer reinforces a connection between the first electrode layer and the second electrode layer. This provides the layered structures each having the stable connection, and more particularly, provides thin film transistor arrays each having the stable connection.

BRIEF DESCRIPTION OF DRAWINGS

FIGS. 6A and 6B are plan views illustrating a manufacturing process of the thin film transistor array illustrated in FIG. 5;

FIGS. 10A and 10B are plan views illustrating a manufacturing process of the thin film transistor array illustrated in FIG. 9;

FIGS. 14A and 14B are plan views illustrating a manufacturing process of the thin film transistor array illustrated in FIG. 13;

FIGS. 18A and 18B are plan views illustrating a manufacturing process of the thin film transistor array illustrated in FIG. 17;

FIGS. 31A and 31B are plan views illustrating the manufacturing process of the thin film transistor array illustrated in FIG. 25;

FIGS. 38A and 38B are plan views illustrating a manufacturing process of the thin film transistor array illustrated in FIG. 37;

DESCRIPTION OF REPRESENTATIVE EMBODIMENT

Figure 1:
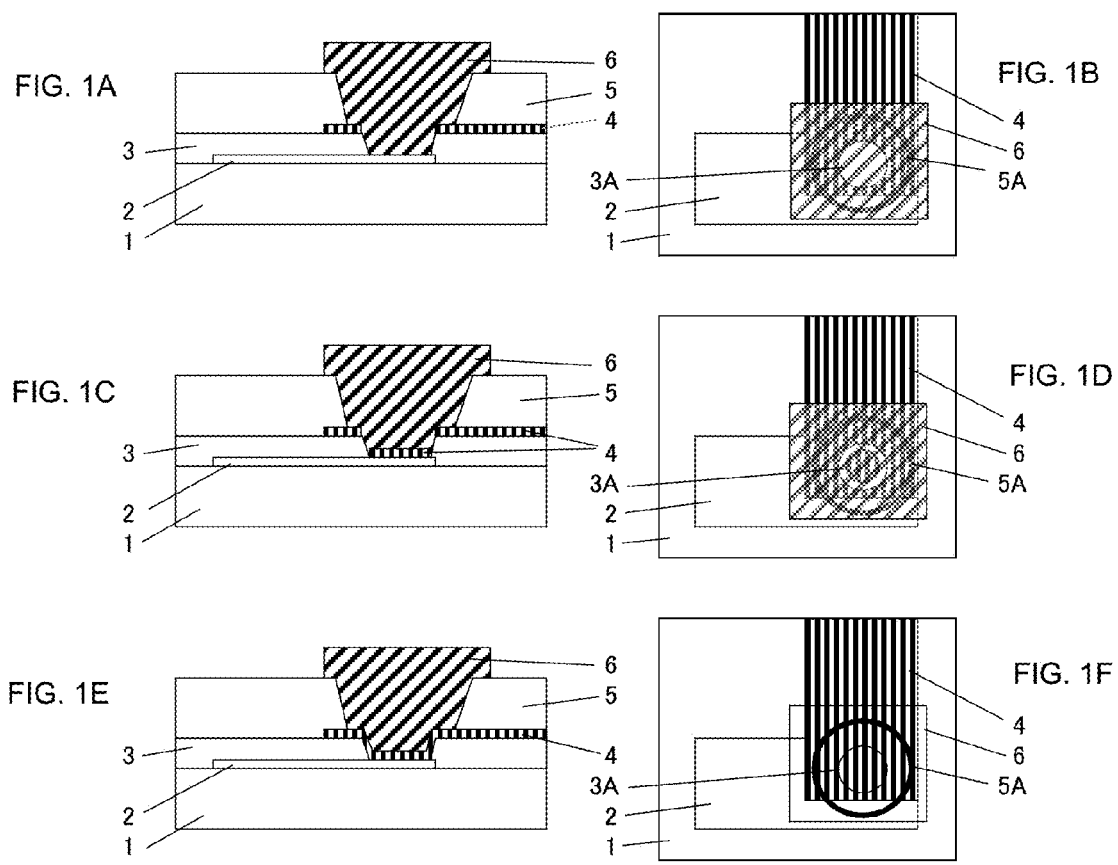
FIGS. 1A to 1F are plan views (FIGS. 1B, 1D, and 1F) and cross sectional views (FIGS. 1A, 1C, and 1E) illustrating an example of a connection structure according to the present invention.

Representative embodiments of the present invention will be described in detail hereinafter with reference to the accompanying drawings. In the drawings, exact scaling is omitted for simplicity of descriptions.

First Representative Embodiment

Figure 2:
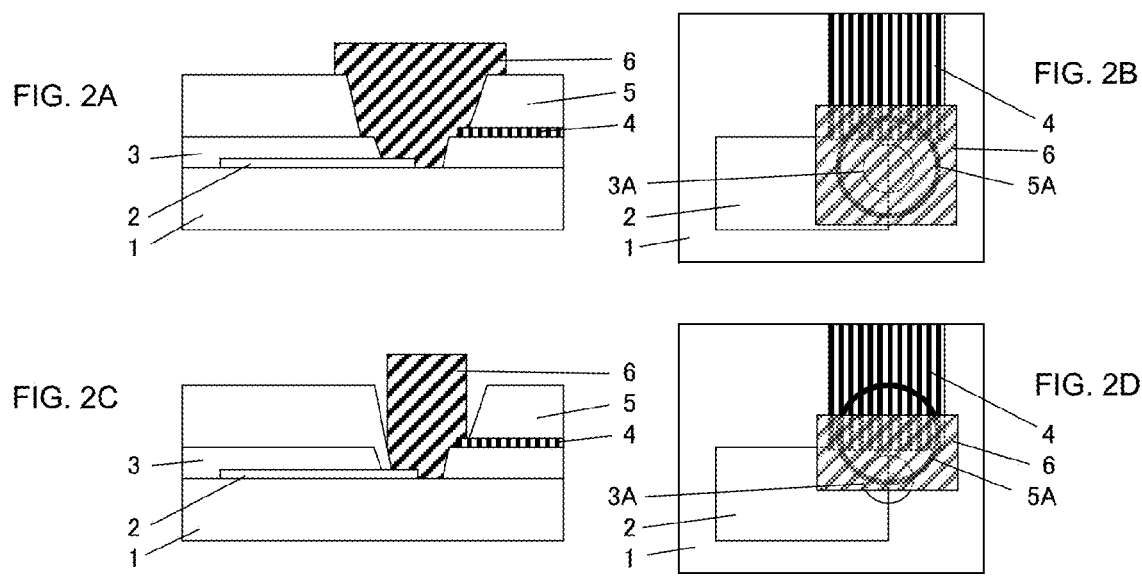
FIGS. 2A to 2D are a plan views (FIGS. 2B and 2D) and cross sectional views (FIGS. 2A and 2C) illustrating another example of the connection structure according to the present invention.

An example of the layered structure, referred to simply as a structure, according to the first embodiment of the present invention is illustrated in FIGS. 1 and 2.

A first electrode 2 is formed on a substrate 1, and a first insulating film 3 having an opening is deposited on the first electrode 2. On the first insulating film 3, a second electrode 4 is mounted resulting in the structure. On the structure, a second insulating film 5 having an opening is deposited, and a third electrode 6 is mounted on the second insulating film 5; the third electrode 6 serves to relay or reinforce the connection between the first electrode 2 and the second electrode 4.

Figure 45A:
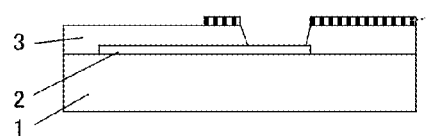
FIGS. 45A to 45F are plan views (FIGS. 45B, 45D, and 45F) and cross sectional views (FIGS. 45A, 45C, and 45E) illustrating an example of conventional connection structures.
Figure 45B:
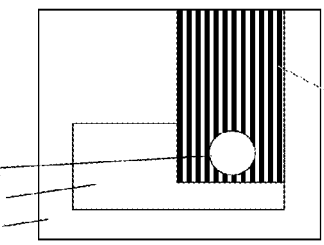

FIGS. 1A and 1B illustrate a configuration that relays the connection structure illustrated in FIGS. 45A and 45B. The third electrode 6 is in contact with the first electrode 2 located in the opening of the first insulating film 3, and is also in contact with the second electrode 4 on the first insulating film 3, resulting in joint between the first electrode 2 and the second electrode 4.

Figure 45C:
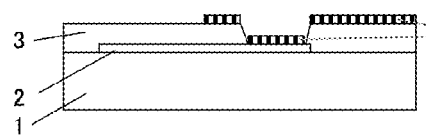
Figure 45D:
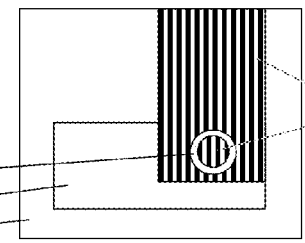

FIGS. 1C and 1D illustrate a configuration that relays the connection structure illustrated in FIGS. 45C and 45D. The third electrode 6 is in contact with the second electrode 4 located in the opening of the first insulating film 3 and located on the first electrode 2, and is in contact with the second electrode 4 on the first insulating film 3, resulting in joint between the first electrode 2 and the second electrode 4.

Figure 45E:
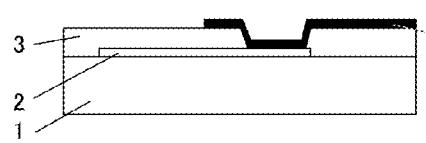
Figure 45F:
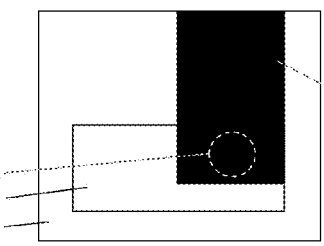

FIGS. 1E and 1F illustrate a configuration that reinforces the connection structure illustrated in FIGS. 45E and 45F. The third electrode 6 is in contact with the second electrode 4 from the inside of the opening of the first insulating film 3 up to the top of the first insulating film 3, resulting in reinforcement of the connection between the first electrode 2 and the second electrode 4.

Note that the opening of the first insulating layer need not be completely located on the first electrode 2, and therefore, the first electrode 2 can be disposed in at least a part of the opening (see FIGS. 2A to 2D). The second electrode 4 need not completely surround the opening of the first insulating film 3, and therefore, can be at least adjacent to the opening of the first insulating film 3 (see FIGS. 2A to 2D). The opening of the second insulating film 5 need not completely cover the opening of the first insulating film 3.

Therefore, the opening of the second insulating film 5 can cover at least the first electrode 2 located in the opening of the first insulating film 3, and the second electrode 4 located on the first insulating film 3 and located adjacent to the opening of the first insulating film 3 (see FIGS. 2C and 2D). The third electrode 6 need not be completely fit in the opening of the second insulating film 5. Therefore, the third electrode 6 can cover at least.

A part of the first electrode 2 located in the opening of the first insulating film 3.

And a part of the second electrode 4 located on the first insulating film 3 and located adjacent to the opening of the first insulating film 3 (see FIG. 2B).

Particularly, printing the second electrode 4 offers an advantage that the second electrode 4 need not completely envelop the opening of the first insulating film 3. Printing is known as an additive process, so that printing has low impact on the lower layer, that is, has little impact on the first electrode 2. Using the process of photolithography and etching, which is commonly used for silicon semiconductors, may eliminate a part of the first electrode 2 during the process of etching; the part elimination of the first electrode 2 results from the second electrode 4 not completely covering the opening of the first insulating layer 3.

Printing the third electrode 6 offers an advantage that the third electrode 6 need not be completely fit in the opening of the second insulating film 5. Printing is known as an additive process, so that printing has low impact on the lower layer, that is, has little impact on the second electrode 4. Using the process of photolithography and etching, which is commonly used for silicon semiconductors, may eliminate a part of the second electrode 4 during the process of etching; the part of the second electrode 4 is exposed to the etchant resulted from when the third electrode 6 does not completely cover the opening of the second insulating layer 5.

Figure 3:
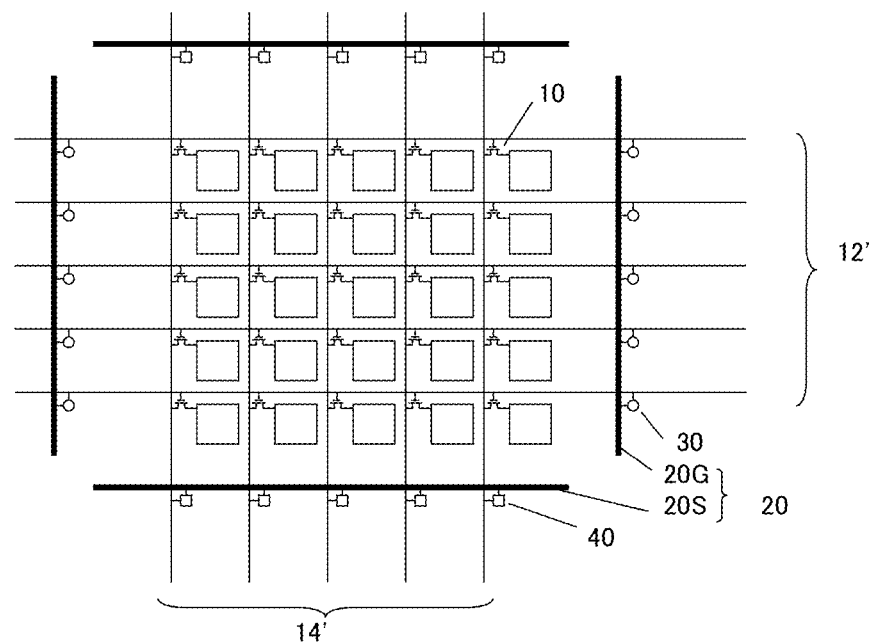
FIG. 3 is a plan view illustrating a thin film transistor array including protective elements according to the present invention.
Figure 5:
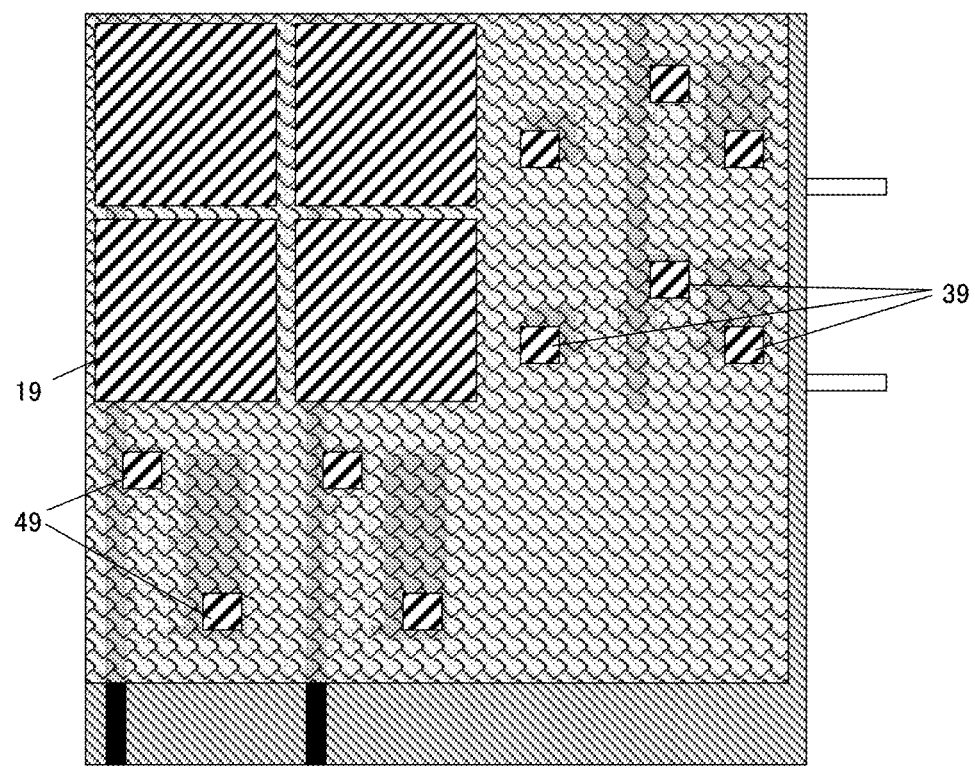
FIG. 5 is a plan view illustrating an example of thin film transistor arrays according to the present invention.
Figure 9:
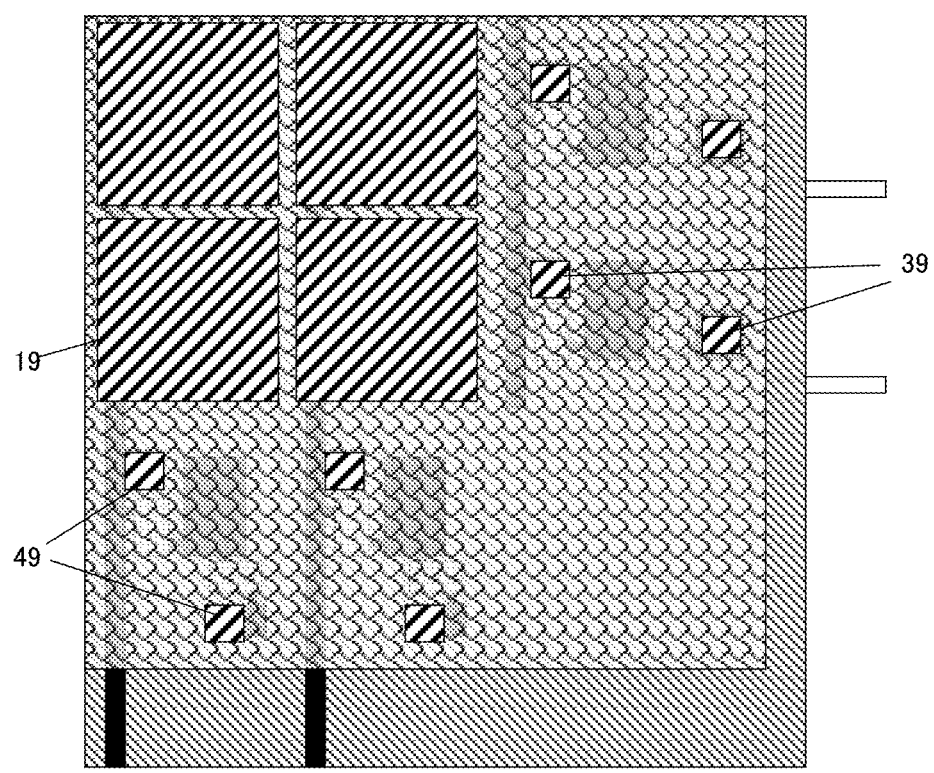
FIG. 9 is a plan view illustrating another example of the thin film transistor arrays according to the present invention.
Figure 13:
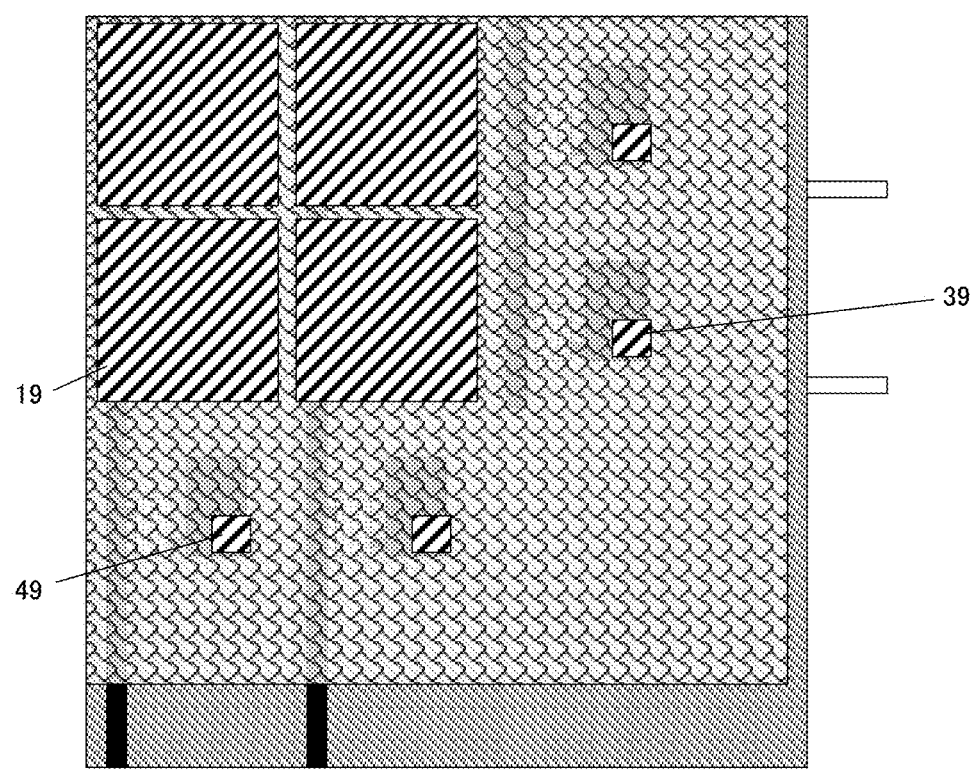
FIG. 13 is a plan view illustrating another example of the thin film transistor arrays according to the present invention.

As described above, a layered structure includes (i) A first layer comprised of a first electrode layer mounted on an insulating substrate (ii) A second layer comprised of a first insulating layer mounted on the first laminate (iii) A third layer comprised of a second electrode layer mounted on the second laminate (iv) A fourth layer comprised of a second insulating film mounted on the third laminate (v) A fifth layer comprised of a third electrode mounted on the fourth laminate The insulating substrate, The first electrode layer, an opening of the first insulating film, the second electrode layer, an opening of the second insulating film, and the third electrode layer has a stack structure of six layers to form a portion connecting the first electrode layer and the second electrode layer. Specifically, the first electrode layer, the second electrode layer, and the third electrode layer, which are laminated via the opening of the first insulating film and opening of the second insulating film, provide a three-layer structure. The third electrode layer relays or reinforces the connection between the first electrode layer and the second electrode layer on the first insulating film in the opening of the second insulating film Second Embodiment Examples of thin film transistor arrays according to the second embodiment of the present invention are illustrated in FIGS. 5, 9, and 13. Each of the thin film transistor arrays includes bottom-gate thin film transistors. Each of the bottom-gate thin film transistors is designed as a layered structure whose portion connecting a first electrode 2 and a second electrode 4 is used as a protective element. Note that the protective elements serve to protect the thin film transistors from electrostatic discharge failure. Referring to FIG. 3, the protective elements are provided between wires and common electrodes 20. Specifically, the protective elements are disposed between respective gate wires 12' and a gate common electrode 20G, and are disposed between respective source wires 14' and a source common electrode 20S. Although illustration is omitted in FIG. 3, the common electrodes 20 are connected to a ground potential or a capacitor wire 17' directly, or connected to the ground potential or the capacitor wire 17' via resistors.

The gate common electrode 20G and the source common electrode 20S can be connected to each other and to the ground potential or the capacitor wire 17', or can be respectively connected to the ground potential or the capacitor wire 17' via resistors.

As each protective element, elements illustrated in FIGS. 4A to 4D can be used.

Figure 4:
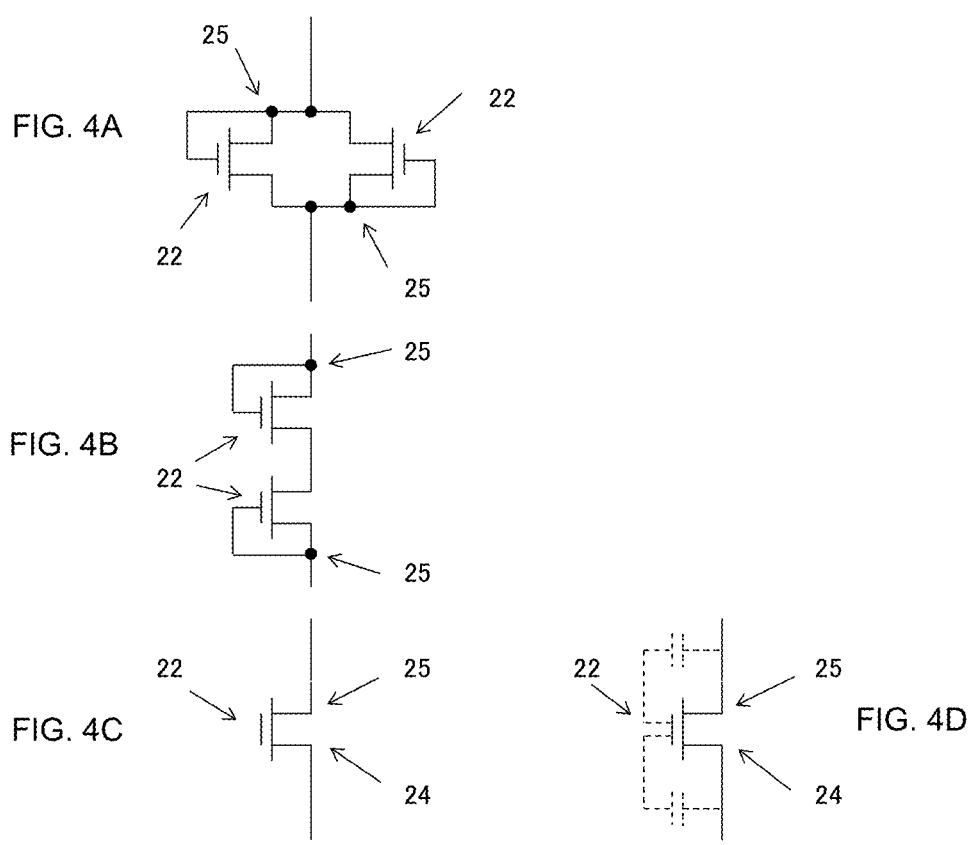
FIGS. 4A to 4D are circuit diagrams illustrating an example of the protective element.

The element illustrated in FIG. 4A is comprised of a pair of thin film transistors, each of which is configured such that the drain 25 and gate 22 are short-circuited; the element is designed as a diode-connected transistor. The thin film transistors are connected in parallel to each other such that one of the thin film transistors is opposite in direction to the other.

The element illustrated in FIG. 4B is comprised of a pair of diode-connected thin film transistors; the diode-connected thin film transistors are connected in series to each other such that one of the thin film transistors is opposite in direction to the other.

The element illustrated in FIGS. 4C and 4D is comprised of a floating-gate thin film transistor while the gate 22 has no connections thereto. The floating-gate thin film transistor is configured such that the overlap between the gate 22 and source 24 and the overlap between the gate 22 and drain 25 are substantially equal to each other; this configuration causes the potential at the gate 22 to become a value intermediate between the potential at the source 24 and that at the drain 25.

Figure 7A:
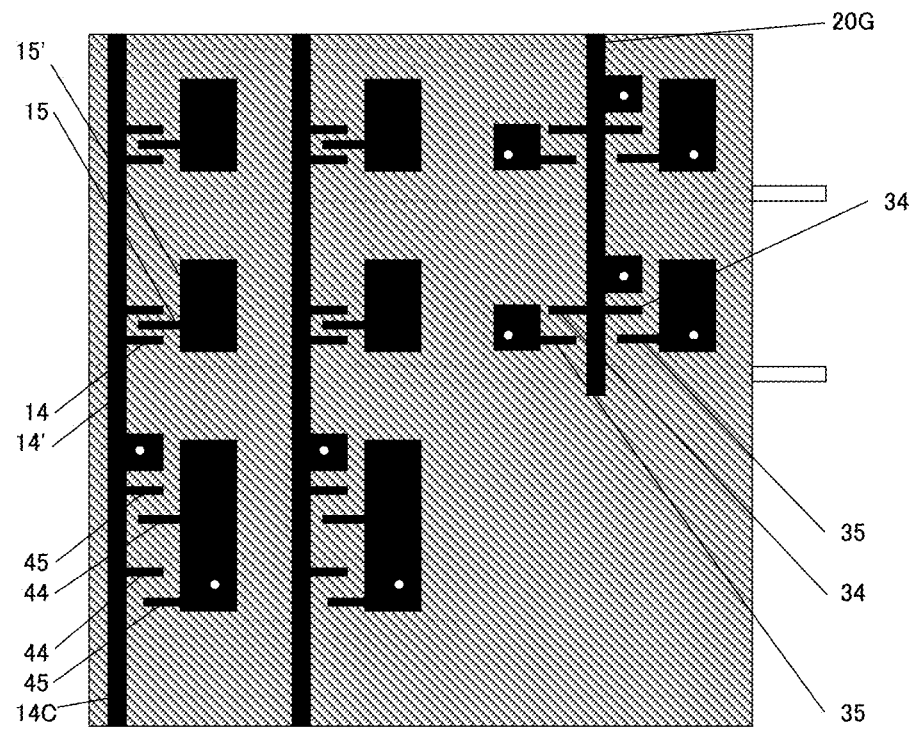
FIGS. 7A and 7B are plan views illustrating the manufacturing process of the thin film transistor array illustrated in FIG. 5.

FIG. 5 illustrates the example in which protective elements are designed as diode-connected transistors parallelly connected to each other. FIG. 5 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 5 is illustrated in FIGS. 6 to 8.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed (see FIG. 6A). The first electrode layer 2 is comprised of gates, i.e. gate electrodes, 12, gate wires 12', gate connection electrodes 12C, capacitor electrodes 17, capacitor wires 17', gates 32 of gate protective elements, gates 42 of source protective elements, and a source common electrode 20S.

The first electrode layer 2 can be made of metals, such as Al, Cr, Au, Ag, Ni, Cu, or Mo, or made of a transparent conductive film, such as ITO. The first electrode layer 2 can be formed using a step of vacuum evaporation or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing. Particularly, because flexography and reverse offset printing are capable of forming thin films, and provide superior surface flatness, they are suitable for forming the first electrode layer 2.

A first insulating film 3 serving as a gate insulating film 13 is deposited on the substrate on which the first electrode layer 2 has been mounted. The gate insulating film 13 has openings 13A (see FIG. 6B). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, forming a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of sources, i.e. source electrodes, 14, source wires 14', source connection electrodes 14C, drains, i.e. drain electrodes, 15, pixel electrodes 15', a gate common electrode 20G, sources 34 of the gate protective elements, drains 35 of the gate protective elements, sources 44 of the source protective elements, and drains 45 of the source protective elements (see FIG. 7A).

The second electrode layer 4 can be made of metal(s), such as Au, Ag, Ni, or Cu, or made of a transparent conductive film, such as ITO. The second electrode layer 4 can be formed using printing, such as gravure printing, offset printing, or reverse offset printing. Particularly, because reverse offset printing offers superior resolution, it is suited for forming the second electrode layer 4.

Figure 7B:
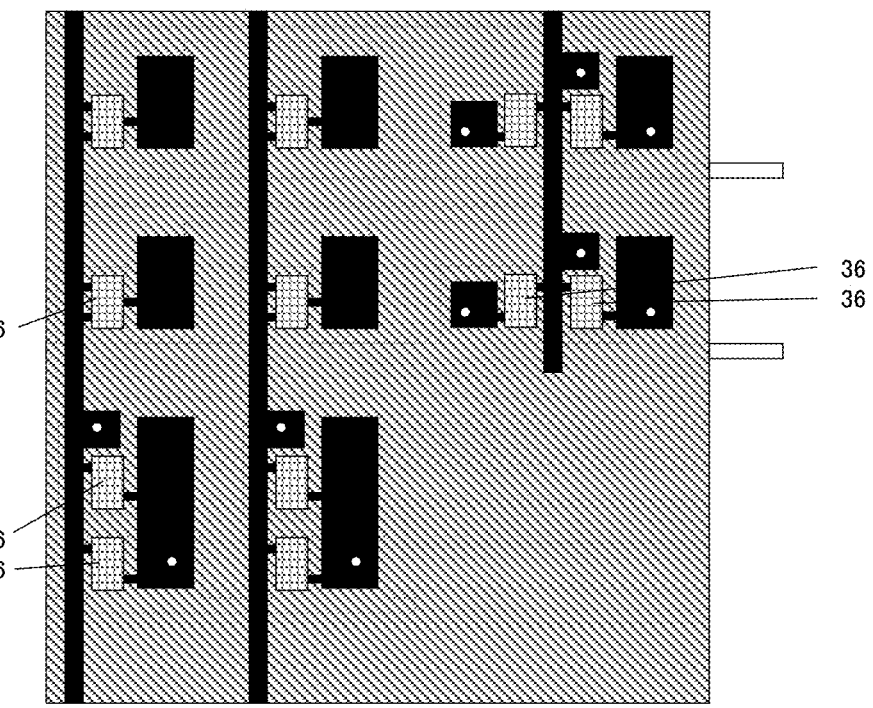

Next, semiconductors 16 for the thin film transistors for pixels, semiconductors 36 for the gate protective elements, and semiconductors 46 for the source protective elements are formed (see FIG. 7B). Each semiconductor 16 is formed to connect between the source 14 and drain 15 of a corresponding thin film transistor for a pixel, and to overlap a corresponding gate 12 via the gate insulating film 13. Each semiconductor 36 for a corresponding gate protective element is formed to connect between the source 34 and drain 35 of the corresponding gate protective element, and to overlap the gate 32 of the corresponding gate protective element via the gate insulating film 13. Each semiconductor 46 for a corresponding source protective element is formed to connect between the source 44 and drain 45 of the corresponding source protective element, and to overlap the gate 42 of the corresponding source protective element via the gate insulating film 13.

The structure set forth above is designed as a bottom contact structure where semiconductors are formed on the second electrode layer 4, but, in the present invention, the structure can be designed as a top contact structure where the second electrode layer 4 is mounted on semiconductors previously formed. Seal layers (not shown) can be provided respectively to cover at least the semiconductors 16, 36, and 46. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor. The sealing layers can be made suitably of fluorinated resins. Screen printing, gravure-offset printing, ink-jet printing, or the like can be suitably used for forming the sealing layers.

A second insulating film 5 serving as an interlayer insulating layer 18 is deposited on the substrate on which the second electrode 4 and the semiconductors 16, 36, and 46 have been mounted. The interlayer insulating film 18 has openings 18A (see FIG. 8A). The second insulating film 5 can be preferably made of polyvinyl phenol, acrylic, epoxy, polyimide, or another material. Printing, such as screen printing, gravure-offset printing, or the like can be suitably used for depositing the second insulating film 5. After a light-sensitive film is deposited, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 8B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, (i) The connection between a corresponding gate wire 12' and the drain 35 of the corresponding gate protective element (ii) The connection between the gate 32 of the corresponding gate protective element and the drain 35 of the corresponding gate protective element Each connection reinforcement electrode 49 for a corresponding source protective element serves to relay or reinforce, in a corresponding opening 18A of the interlayer insulating film 18, the connection between the gate 42 of the corresponding source protective element and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Figure 11A:
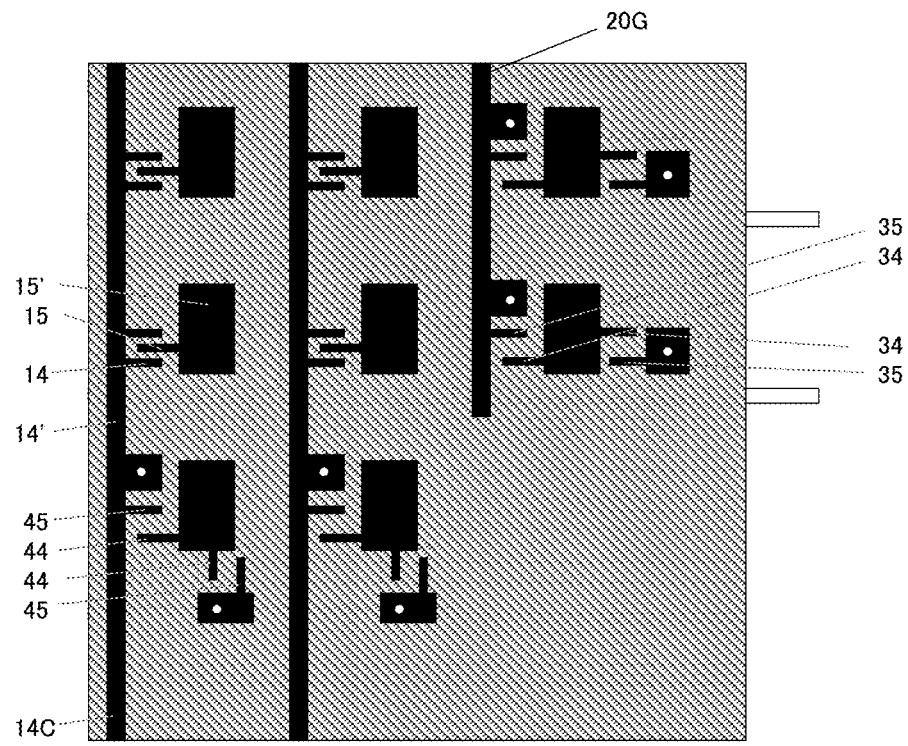
FIGS. 11A and 11B are plan views illustrating the manufacturing process of the thin film transistor array illustrated in FIG. 9.

FIG. 9 illustrates the example in which protective elements are designed as diode-connected transistors connected in series to each other. FIG. 9 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 9 is illustrated in FIGS. 10 to 12.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed (see FIG. 10A). The first electrode layer 2 is comprised of gates 12, gate wires 12', gate connection electrodes 12C, capacitor electrodes 17, capacitor wires 17', gates 32 of gate protective elements, gates 42 of source protective elements, and a source common electrode 20S.

The first electrode layer 2 can be made of metal(s), such as Al, Cr, Au, Ag, Ni, Cu, or Mo, or made of a transparent conductive film, such as ITO. The first electrode layer 2 can be formed using a step of vacuum evaporation or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing. Particularly, because flexography and reverse offset printing are capable of forming thin films, and provide superior surface flatness, they are suitable for forming the first electrode layer 2.

A first insulating film 3 serving as a gate insulating film 13 is deposited on the substrate on which the first electrode layer 2 has been mounted. The gate insulating film 13 has openings 13A (see FIG. 10b). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than a solvent-soluble organic material is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of sources 14, source wires 14', source connection electrodes 14C, drains 15, pixel electrodes 15', a gate common electrode 20G, sources 34 of the gate protective elements, drains 35 of the gate protective elements, sources 44 of the source protective elements, and drains 45 of the source protective elements (see FIG. 11A).

The second electrode layer 4 can be made of metal(s), such as Au, Ag, Ni, or Cu, or made of a transparent conductive film, such as ITO. The second electrode layer 4 can be formed using printing, such as gravure printing, offset printing, or reverse offset printing. Particularly, because reverse offset printing offers superior resolution, it is suited for forming the second electrode layer 4.

Figure 11B:
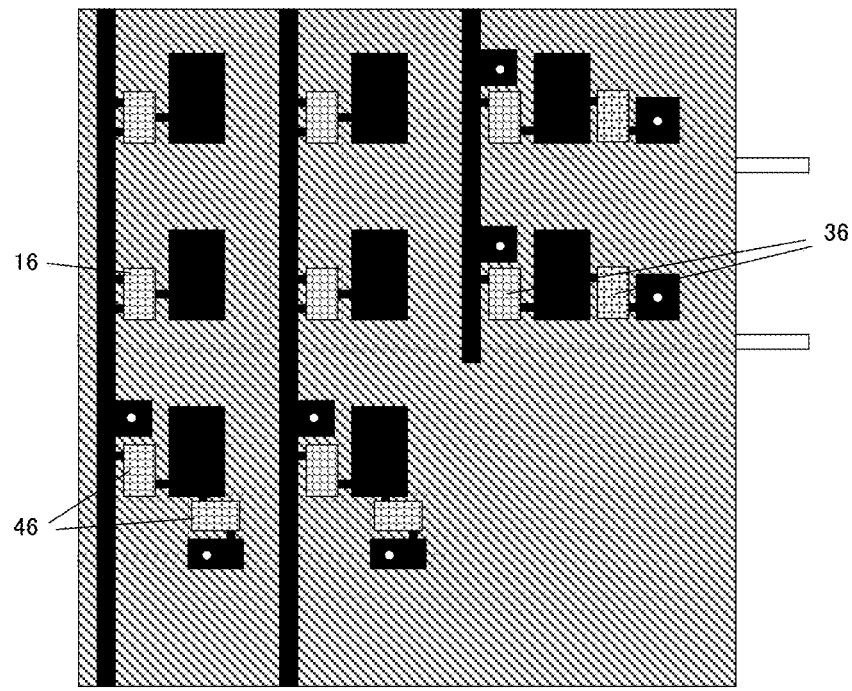

Next, semiconductors 16 for the thin film transistors for pixels, semiconductors 36 for the gate protective elements, and semiconductors 46 for the source protective elements are formed (see FIG. 11B). Each semiconductor 16 is formed to connect between the source 14 and drain 15 of a corresponding thin film transistor for a pixel, and to overlap a corresponding gate 12 via the gate insulating film 13. Each semiconductor 36 for a corresponding gate protective element is formed to connect between the source 34 and drain 35 of the corresponding gate protective element, and to overlap the gate 32 of the corresponding gate protective element via the gate insulating film 13. Each semiconductor 46 for a corresponding source protective element is formed to connect between the source 44 and drain 45 of the corresponding source protective element, and to overlap the gate 42 of the corresponding source protective element via the gate insulating film 13.

The structure set forth above is designed as a bottom contact structure where semiconductors are formed on the second electrode layer 4, but, in the present invention, the structure can be designed as a top contact structure where the second electrode layer 4 is mounted on semiconductors previously formed. Seal layers (not shown) can be provided to respectively cover at least the semiconductors 16, 36, and 46. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor. The sealing layers can be made suitably of fluorinated resins. Screen printing, gravure-offset printing, ink-jet printing, or the like can be suitably used for forming the sealing layers.

A second insulating film 5 serving as an interlayer insulating layer 18 is deposited on the substrate on which the second electrode 4 and the semiconductors 16, 36, and 46 have been mounted. The interlayer insulating film 18 has openings 18A (see FIG. 12A). The second insulating film 5 can be preferably made of polyvinyl phenol, acrylic, epoxy, polyimide, or another material. Printing, such as screen printing, gravure-offset printing, or the like can be suitably used for depositing the second insulating film 5. After a light-sensitive film is deposited, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 12B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, the connection between the gate 32 of the corresponding gate protective element and the drain 35 of the corresponding gate protective element.

Each connection reinforcement electrode 49 for a corresponding source protective element serves to relay or reinforce, in a corresponding opening 18A of the interlayer insulating film 18, the connection between the gate 42 of the corresponding source protective element and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Figure 15A:
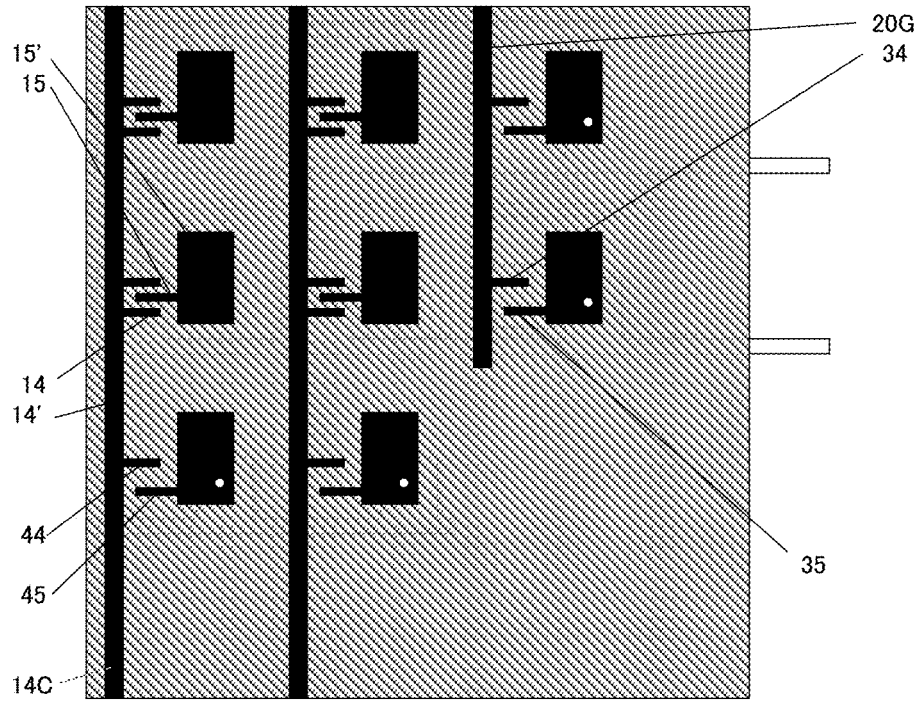
FIGS. 15A and 15B are plan views illustrating the manufacturing process of the thin film transistor array illustrated in FIG. 13.

FIG. 13 illustrates the example in which protective elements are designed as floating-gate transistors. FIG. 13 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 13 is illustrated in FIGS. 14 to 16.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed (see FIG. 14A). The first electrode layer 2 is comprised of gates 12, gate wires 12', gate connection electrodes 12C, capacitor electrodes 17, capacitor wires 17', gates 32 of gate protective elements, gates 42 of source protective elements, and a source common electrode 20S.

The first electrode layer 2 can be made of metal(s), such as Al, Cr, Au, Ag, Ni, Cu, or Mo, or made of a transparent conductive film, such as ITO. The first electrode layer 2 can be formed using a step of vacuum evaporation or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing. Particularly, because flexography and reverse offset printing are capable of forming thin films, and provide superior surface flatness, they are suitable for forming the first electrode layer 2.

A first insulating film 3 serving as a gate insulating film 13 is deposited on the substrate on which the first electrode layer 2 has been mounted. The gate insulating film 13 has openings 13A (see FIG. 14*b*). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, forming a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of sources 14, source wires 14', source connection electrodes 14C, drains 15, pixel electrodes 15', a gate common electrode 20G, sources 34 of the gate protective elements, drains 35 of the gate protective elements, sources 44 of the source protective elements, and drains 45 of the source protective elements (see FIG. 15*c*).

The second electrode layer 4 can be made of metal(s), such as Au, Ag, Ni, or Cu, or made of a transparent conductive film, such as ITO. The second electrode layer 4 can be formed using printing, such as gravure printing, offset printing, or reverse offset printing. Particularly, because reverse offset printing offers superior resolution, it is suited for forming the second electrode layer 4.

Figure 15B:
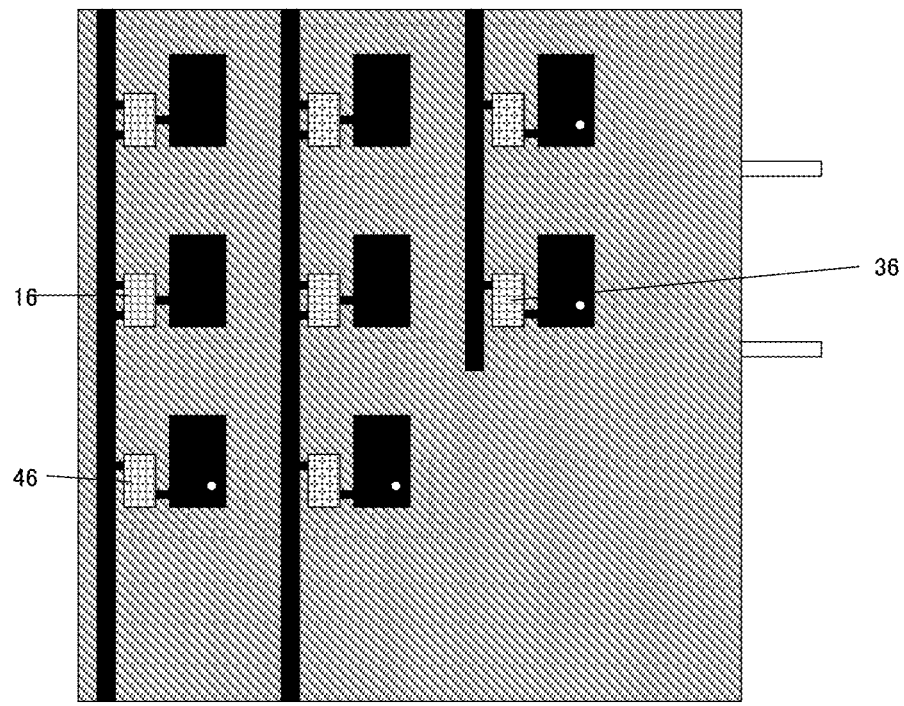

Next, semiconductors 16 for the thin film transistors for pixels, semiconductors 36 for the gate protective elements, and semiconductors 46 for the source protective elements are formed (see FIG. 15B). Each semiconductor 16 is formed to connect between the source 14 and drain 15 of a corresponding thin film transistor for a pixel, and to overlap a corresponding gate 12 via the gate insulating film 13. Each semiconductor 36 for a corresponding gate protective element is formed to connect between the source 34 and drain 35 of the corresponding gate protective element, and to overlap the gate 32 of the corresponding gate protective element via the gate insulating film 13. Each semiconductor 46 for a corresponding source protective element is formed to connect between the source 44 and drain 45 of the corresponding source protective element, and to overlap the gate 42 of the corresponding source protective element via the gate insulating film 13.

The structure set forth above is designed as a bottom contact structure where semiconductors are formed on the second electrode layer 4, but, in the present invention, the structure can be designed as a top contact structure where the second electrode layer 4 is mounted on semiconductors previously formed. Seal layers (not shown) can be provided to respectively cover at least the semiconductors 16, 36, and 46. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor. The sealing layers can be made suitably of fluorinated resins. Screen printing, gravure-offset printing, ink-jet printing, or the like can be suitably used for forming the sealing layers.

A second insulating film 5 serving as an interlayer insulating layer 18 is deposited on the substrate on which the second electrode 4 and the semiconductors 16, 36, and 46 have been mounted. The interlayer insulating film 18 has openings 18A (see FIG. 16A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is deposited, it can be exposed and developed to thereby also form the second insulating film 5. On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 16B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, the connection between a corresponding gate wire 12' and the drain 35 of the corresponding gate protective element.

Each connection reinforcement electrode 49 for a corresponding source protective element serves to relay or reinforce, in a corresponding opening 18A of the interlayer insulating film 18, the connection between the source common electrode 20S and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Third Embodiment

Figure 17:
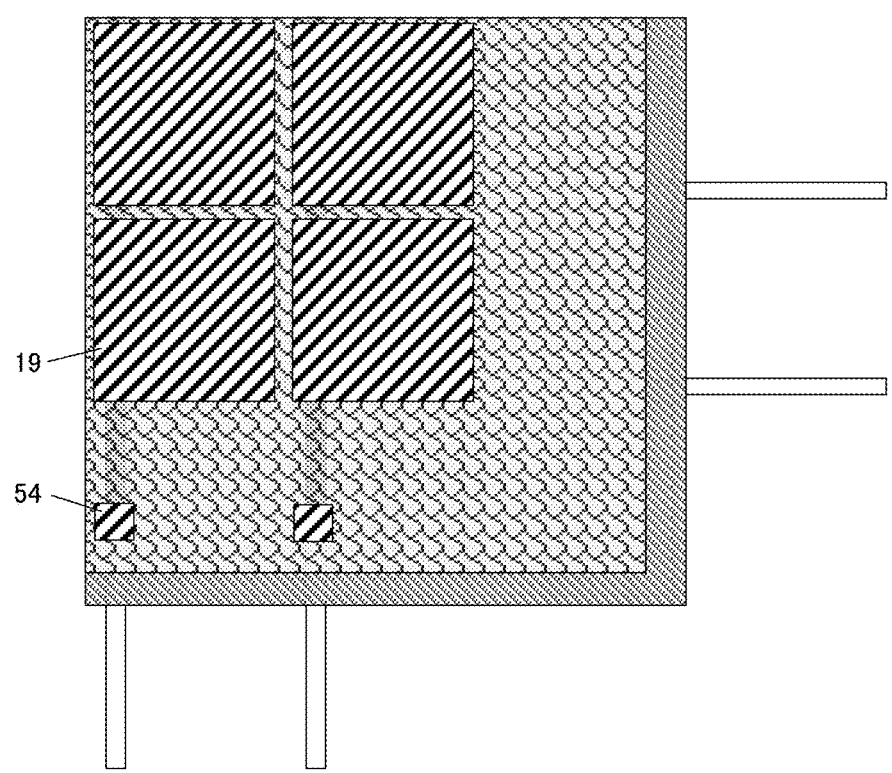
FIG. 17 is a plan view illustrating an example of the thin film transistor arrays according to the present invention.
Figure 21:
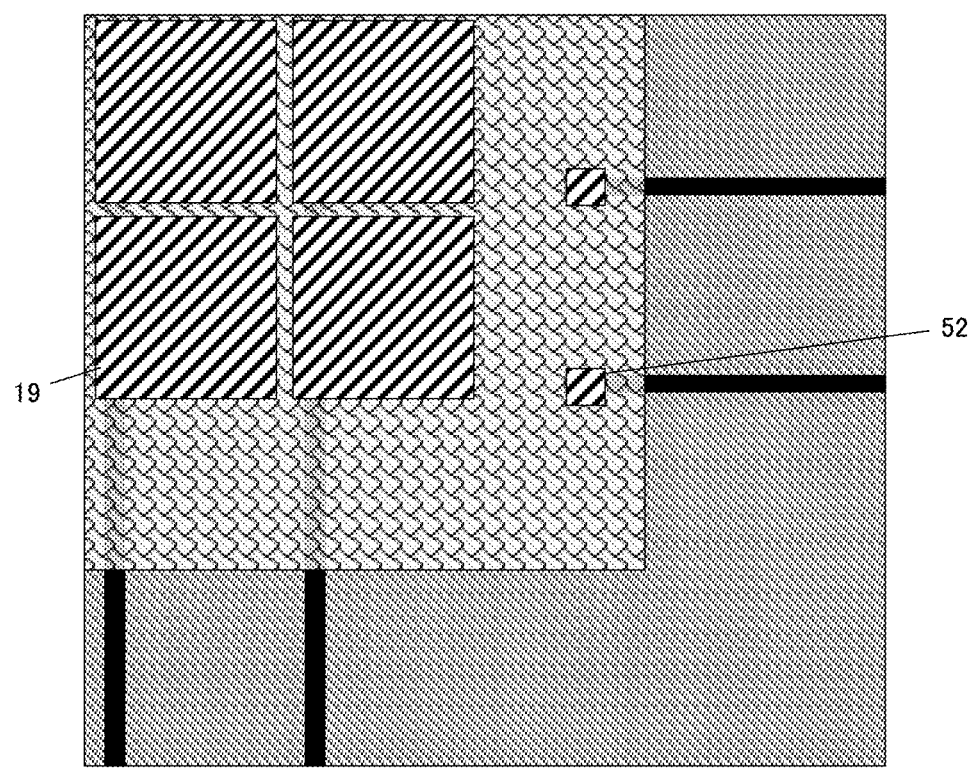
FIG. 21 is a plan view illustrating an example of the thin film transistor arrays according to the present invention.

Examples of thin film transistor arrays according to the third embodiment of the present invention are illustrated in FIGS. 17 and 21. Each of the thin film transistor arrays includes bottom-gate thin film transistors. Each of the bottom-gate thin film transistors is designed as a layered structure whose portion connecting a first electrode 2 and a second electrode 4 is used to switch wiring from the second electrode 4 to the first electrode 2 or from the first electrode 2 to the second electrode 4.

Figure 19A:
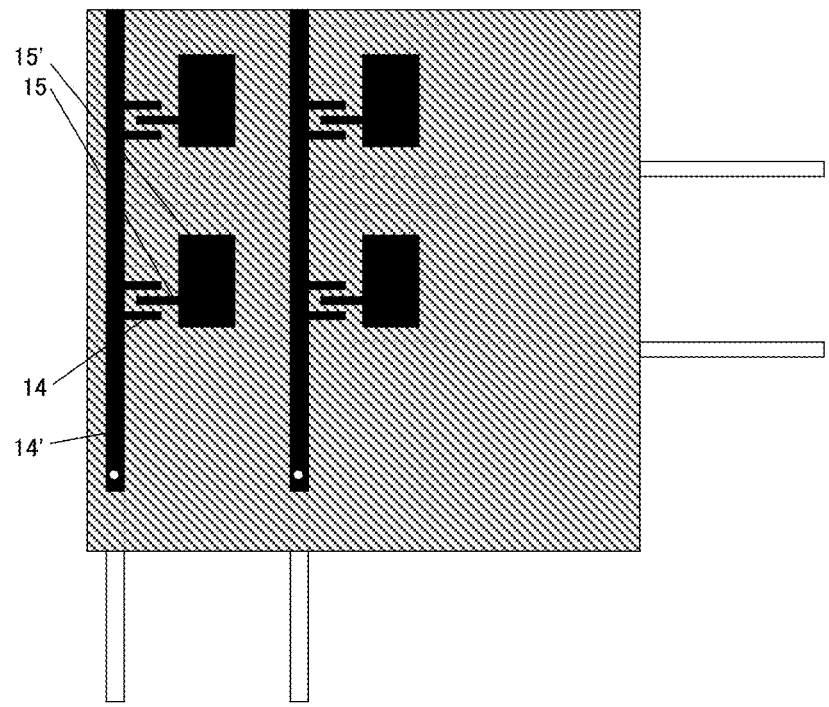
FIGS. 19A and 19B are plan views illustrating the manufacturing process of the thin film transistor array illustrated in FIG. 17.

FIG. 17 illustrates the example in which connection reinforcement electrodes 54 relay or reinforce portions that connect source wires 14' included in the second electrode layer 4 to corresponding source connection electrodes 14C included in the first electrode layer 2. FIG. 17 illustrates four thin film transistors 10 for pixels, two gate wires 12' and two gate connection electrodes 12C respectively connected to the two gate wires 12', and two source wires 14' and two source connection electrodes 14C respectively connected to the two source wires 14'. The four thin film transistors 10 for pixels include upper pixel electrodes 19, and the source connection electrodes 14C respectively include the connection reinforcement electrodes 54. A manufacturing process of the thin film transistor array illustrated in FIG. 17 is illustrated in FIGS. 18 to 20.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, the first electrode layer 2 is formed (see FIG. 18A). The first electrode layer 2 is comprised of gates 12, the gate wires 12', capacitor electrodes 17, capacitor wires 17', and the source connection electrodes 14C.

The first electrode layer 2 can be made of metal(s), such as Al, Cr, Au, Ag, Ni, Cu, or Mo, or made of a transparent conductive film, such as ITO. The first electrode layer 2 can be formed using a step of vacuum evaporation or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing. Particularly, because flexography and reverse offset printing are capable of forming thin films, and provide superior surface flatness, they are suitable for forming the first electrode layer 2.

A first insulating film 3 serving as a gate insulating film 13 is deposited on the substrate on which the first electrode layer 2 has been mounted. The gate insulating film 13 has openings 13A (see FIG. 18B). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of sources 14, the source wires 14', drains 15, and pixel electrodes 15' (see FIG. 19A).

The second electrode layer 4 can be made of metal(s), such as Au, Ag, Ni, or Cu, or made of a transparent conductive film, such as ITO. The second electrode layer 4 can be formed using printing, such as gravure printing, offset printing, or reverse offset printing. Particularly, because reverse offset printing offers superior resolution, it is suited for forming the second electrode layer 4.

Figure 19B:
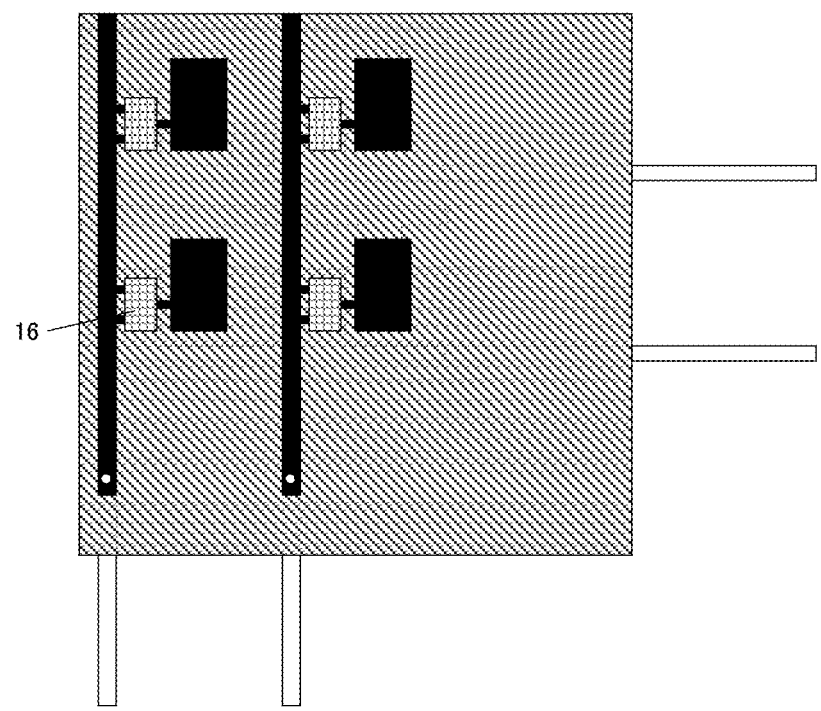

Next, semiconductors 16 for the thin film transistors for pixels are formed (see FIG. 19B). Each semiconductor 16 is formed to connect between the source 14 and drain 15 of a corresponding thin film transistor for a pixel, and to overlap a corresponding gate 12 via the gate insulating film 13.

The structure set forth above is designed as a bottom contact structure where semiconductors are formed on the second electrode layer 4, but, in the present invention, the structure can be designed as a top contact structure where the second electrode layer 4 is mounted on semiconductors previously formed. Seal layers (not shown) can be provided to respectively cover at least the semiconductors 16. As the semiconductors 16, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor. The sealing layers can be made suitably of fluorinated resins. Screen printing, gravure-offset printing, ink-jet printing, or the like can be suitably used for forming the sealing layers.

A second insulating film 5 serving as an interlayer insulating layer 18 is deposited on the substrate on which the second electrode 4 and the semiconductors 16 have been mounted. The interlayer insulating film 18 has openings 18A (see FIG. 20A). The second insulating film 5 can be preferably made of polyvinyl phenol, acrylic, epoxy, polyimide, or another material. Printing, such as screen printing, gravure-offset printing, or the like can be suitably used for depositing the second insulating film 5. After a light-sensitive film is deposited, it can be exposed and developed to thereby also form the second insulating film 5.

On the substrate on which the second insulating film 5 has been deposited, a third electrode layer 6 is formed. The third electrode layer 6 is comprised of the upper pixel electrodes 19 and the connection reinforcement electrodes 54 for the source wires (see FIG. 20B). Each upper pixel electrode 19 is connected to a corresponding pixel electrode 15' via a corresponding opening 18A of the interlayer insulating film 18. Each connection reinforcement electrode 54 for a corresponding source wire serves to relay or reinforce, in a corresponding opening 18A of the interlayer insulating film 18, the connection between a corresponding source connecting electrode 14C and a corresponding source wire 14'.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

FIG. 21 illustrates the example in which connection reinforcement electrodes 52 relay or reinforce portions that connect gate wires 12' included in the first electrode layer 2 to corresponding gate connection electrodes 12C included in the second electrode layer 4. FIG. 21 illustrates four thin film transistors 10 for pixels, two gate wires 12' and two gate connection electrodes 12C respectively connected to the two gate wires 12', and two source wires 14' and two source connection electrodes 14C respectively connected to the two source wires 14'. The four thin film transistors 10 for pixels include upper pixel electrodes 19, and the gate connection electrodes 12C respectively include the connection reinforcement electrodes 52. A manufacturing process of the thin film transistor array illustrated in FIG. 21 is illustrated in FIGS. 22 to 24.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

Figure 22A:
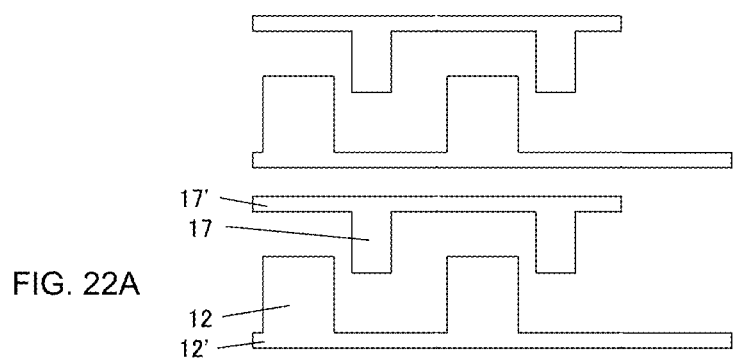
FIGS. 22A and 22B are plan views illustrating a manufacturing process of the thin film transistor array illustrated in FIG. 21.
Figure 23A:
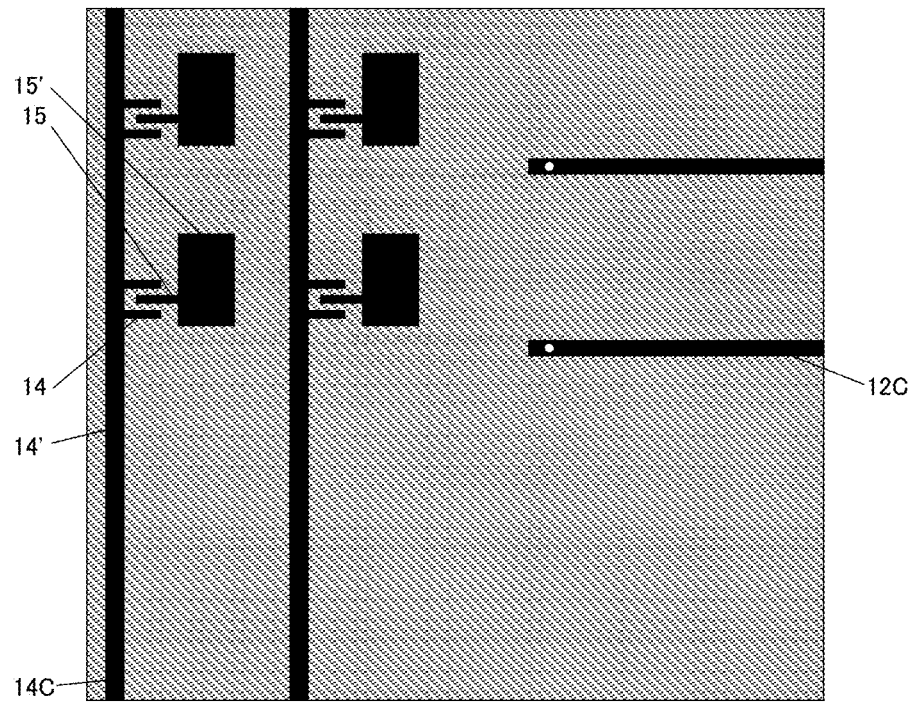
FIGS. 23A and 23B are plan views illustrating the manufacturing process of the thin film transistor array illustrated in FIG. 21.

On the substrate 1, the first electrode layer 2 is formed (see FIG. 22A). The first electrode layer 2 is comprised of gates 12, the gate wires 12', capacitor electrodes 17, and capacitor wires 17'.

The first electrode layer 2 can be made of metal(s), such as Al, Cr, Au, Ag, Ni, Cu, or Mo, or made of a transparent conductive film, such as ITO. The first electrode layer 2 can be formed using a step of vacuum evaporation or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing. Particularly, because flexography and reverse offset printing are capable of forming thin films, and provide superior surface flatness, they are suitable for forming the first electrode layer 2.

A first insulating film 3 serving as a gate insulating film 13 is deposited on the substrate on which the first electrode layer 2 has been mounted. The gate insulating film 13 has openings 13A (see FIG. 22B). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been formed, a second electrode layer 4 is formed. The second electrode layer 4 is comprised of sources 14, the source wires 14', drains 15, pixel electrodes 15', and the gate connection electrodes 12C (see FIG. 23A).

The second electrode layer 4 can be made of metal(s), such as Au, Ag, Ni, or Cu, or made of a transparent conductive film, such as ITO. The second electrode layer 4 can be formed using printing, such as gravure printing, offset printing, or reverse offset printing. Particularly, because reverse offset printing offers superior resolution, it is suited for forming the second electrode layer 4.

Figure 23B:
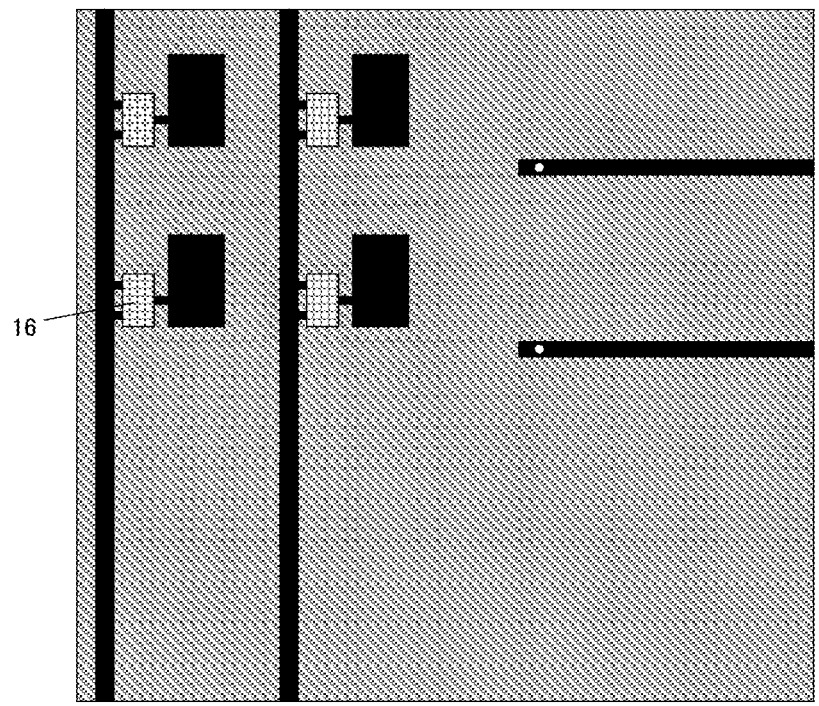

Next, semiconductors 16 for the thin film transistors for pixels are formed (see FIG. 23B). Each semiconductor 16 is formed to connect between the source 14 and drain 15 of a corresponding thin film transistor for a pixel, and to overlap a corresponding gate 12 via the gate insulating film 13.

The structure set forth above is designed as a bottom contact structure where semiconductors are formed on the second electrode layer 4, but, in the present invention, the structure can be designed as a top contact structure where the second electrode layer 4 is mounted on semiconductors previously formed. Seal layers (not shown) can be provided to respectively cover at least the semiconductors 16. As the semiconductors 16, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor. The sealing layers can be made suitably of fluorinated resins. Screen printing, gravure-offset printing, ink-jet printing, or the like can be suitably used for forming the sealing layers. A second insulating film 5 serving as an interlayer insulating layer 18 is deposited on the substrate on which the second electrode 4 and the semiconductors 16 have been mounted. The interlayer insulating film 18 has openings 18A (see FIG. 24A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is deposited, it can be exposed and developed to thereby also form the second insulating film 5.

On the substrate on which the second insulating film 5 has been deposited, a third electrode layer 6 is formed. The third electrode layer 6 is comprised of the upper pixel electrodes 19 and the connection reinforcement electrodes 52 for the gate wires (see FIG. 24B). Each upper pixel electrode 19 is connected to a corresponding pixel electrode 15' via a corresponding opening 18A of the interlayer insulating film 18. Each connection reinforcement electrode 52 for a corresponding gate wire serves to relay or reinforce, in a corresponding opening 18A of the interlayer insulating film 18, the connection between a corresponding gate wire 12' and a corresponding gate connection electrode 12C.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Fourth Embodiment

Figure 25:
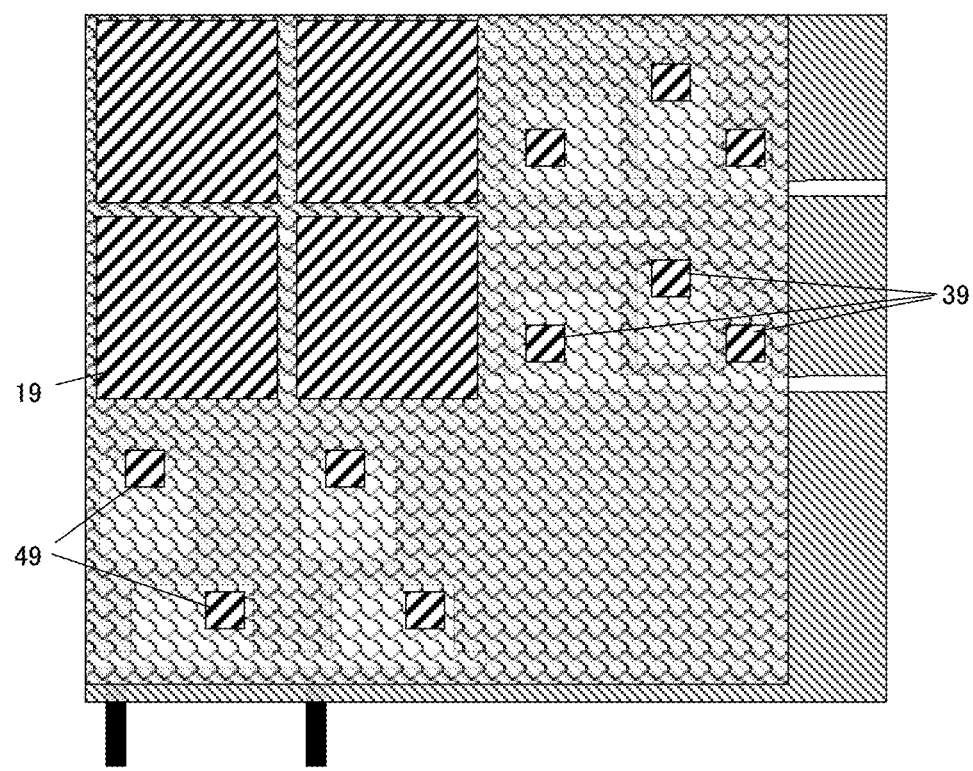
FIG. 25 is a plan view illustrating an example of the thin film transistor arrays according to the present invention.
Figure 29:
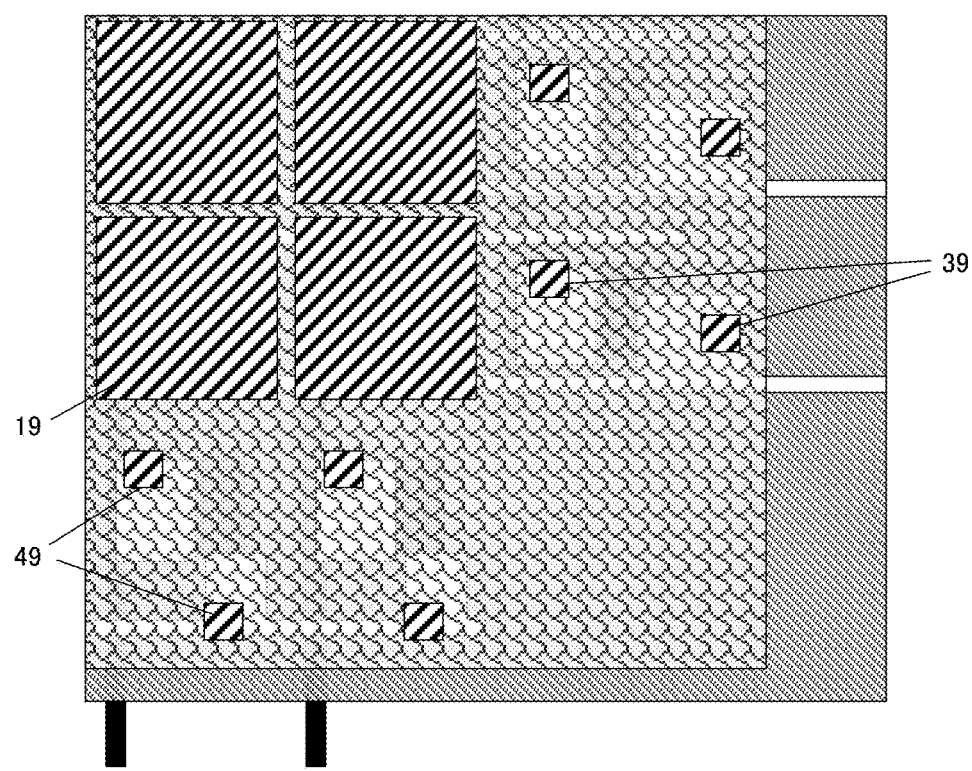
FIG. 29 is a plan view illustrating an example of the thin film transistor arrays according to the present invention.
Figure 33:
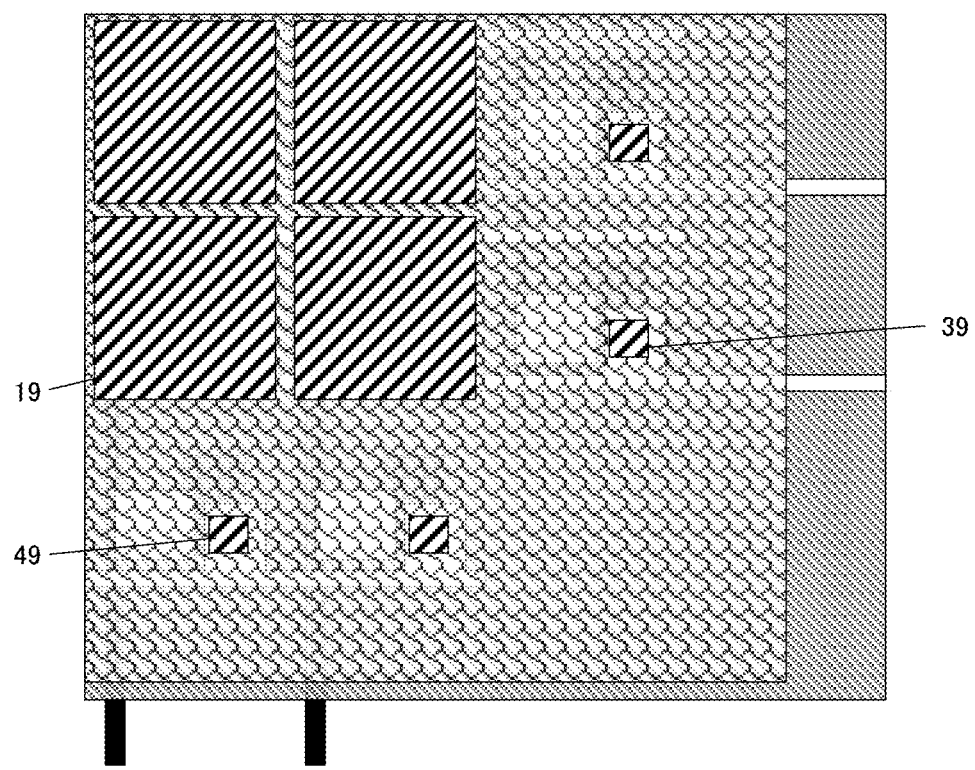
FIG. 33 is a plan view illustrating an example of the thin film transistor arrays according to the present invention.

Examples of thin film transistor arrays according to the fourth embodiment of the present invention are illustrated in FIGS. 25, 29, and 33. Each of the thin film transistor arrays includes top-gate thin film transistors. Each of the top-gate thin film transistors is designed as a layered structure whose portion connecting a first electrode 2 and a second electrode 4 is used as a protective element. Note that the protective elements serve to protect the thin film transistors from electrostatic discharge failure. Referring to FIG. 3, the protective elements are respectively provided between wires and common electrodes 20. Specifically, the protective elements are disposed between respective gate wires 12' and a gate common electrode 20G, and are disposed between respective source wires 14' and a source common electrode 20S. Although illustration is omitted in FIG. 3, the common electrodes 20 are connected to a ground potential or a capacitor wire 17' or connected to the ground potential or the capacitor wire 17' via resistors.

The gate common electrode 20G and the source common electrode 20S can be connected to each other and to the ground potential or the capacitor wire 17' directly, or can be respectively connected to the ground potential or the capacitor wire 17' via resistors.

As each protective element, elements illustrated in FIGS. 4a to 4c can be used.

The element illustrated in FIG. 4a is comprised of a pair of thin film transistors, each of which is configured such that the drain 25 and gate 22 are short-circuited, which is designed as a diode-connected transistor. The thin film transistors are connected in parallel to each other such that one of the thin film transistor is opposite in direction to the other thereof The element illustrated in FIG. 4b is comprised of a pair of diode-connected thin film transistors; the diode-connected thin film transistors are connected in series to each other such that one of the thin film transistor is opposite in direction to the other thereof The element illustrated in FIG. 4c is comprised of a floating-gate thin film transistor while the gate 22 has no connections thereto. The floating-gate thin film transistor is configured such that the overlap between the gate 22 and source 24 and the overlap between the gate 22 and drain 25 are substantially equal to each other; this configuration causes the potential at the gate 22 to become a value intermediate between the potential at the source 24 and that at the drain 25.

Figure 26A:
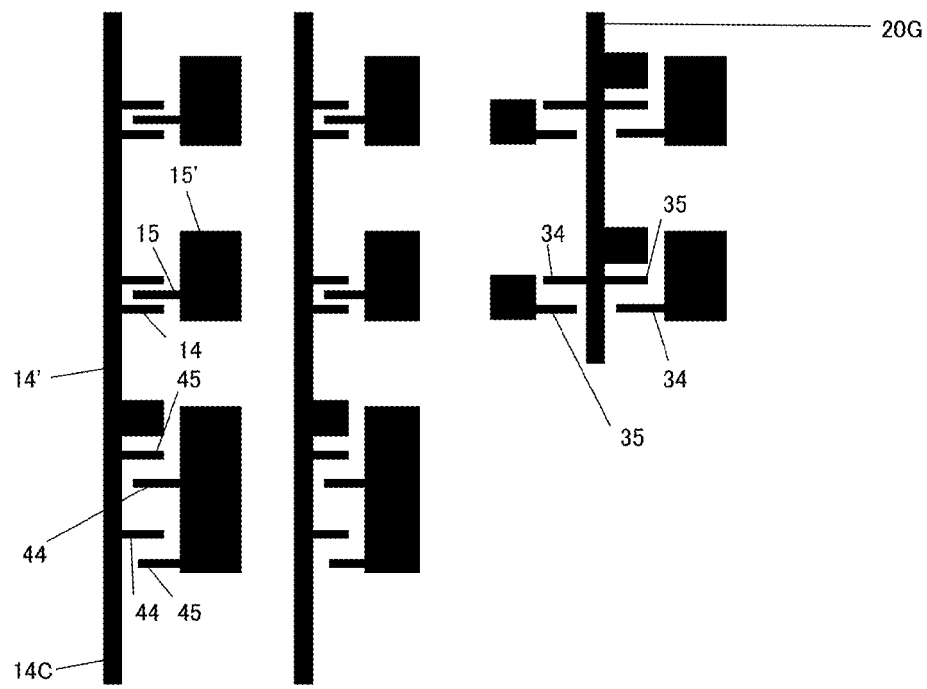
FIGS. 26A and 26B are plan views illustrating a manufacturing process of the thin film transistor array illustrated in FIG. 25.

FIG. 25 illustrates the example in which protective elements are designed as diode-connected transistors parallelly connected to each other. FIG. 25 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 25 is illustrated in FIGS. 26 to 28.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystylene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed. The first electrode layer 2 is comprised of sources 14, source wires 14', source connection electrodes 14C, drains 15, pixel electrodes 15', a gate common electrode 20G, sources 34 of gate protective elements, drains 35 of the gate protective elements, sources 44 of source protective elements, and drains 45 of the source protective elements (see FIG. 26a).

The first electrode layer 2 can be made of metal(s), such as Au, Ag, Ni, or Cu, or made of a transparent conductive film, such as ITO. Printing, such as gravure printing, offset printing, or reverse offset printing, can be used for forming the first electrode layer 2. Particularly, because reverse offset printing offers superior resolution, it is suited for forming the first electrode layer 2.

Figure 26B:
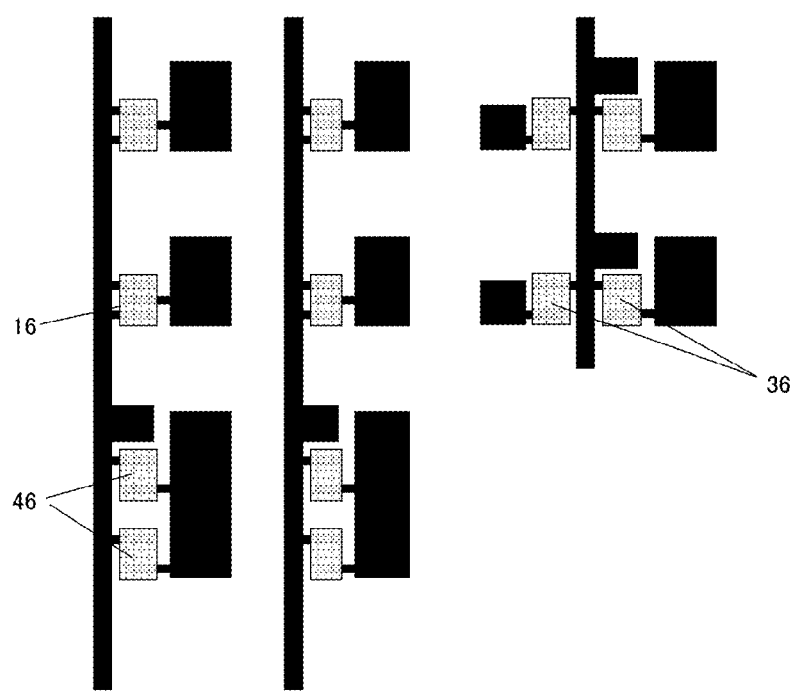

Next, semiconductors 16 for the thin film transistors for pixels, semiconductors 36 for the gate protective elements, and semiconductors 46 for the source protective elements are formed (see FIG. 26B). Each semiconductor 16 is formed to connect between the source 14 and drain 15 of a corresponding thin film transistor for a pixel. Each semiconductor 36 for a corresponding gate protective element is formed to connect between the source 34 and drain 35 of the corresponding gate protective element. Each semiconductor 46 for a corresponding source protective element is formed to connect between the source 44 and drain 45 of the corresponding source protective element.

The structure set forth above is designed as a bottom contact structure where semiconductors are formed on the first electrode layer 2, but, in the present invention, the structure can be designed as a top contact structure where the first electrode layer 2 is mounted on semiconductors previously formed. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor.

A first insulating film 3 serving as a gate insulating film 13 is deposited on the substrate on which the first electrode layer 2 and the semiconductors 16, 36, and 46 have been mounted. The gate insulating film 13 has openings 13A (see FIG. 27A). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of gates 12, gate wires 12', gate connection electrodes 12C, capacitor electrodes 17, capacitor wires 17', gates 32 of the gate protective elements, gates 42 of the source protective elements, and a source common electrode 20S (see FIG. 27B).

The gates 12 are formed to overlap corresponding semiconductors 16 for thin film transistors for pixels via the gate insulating film 13. The gates 32 of the gate protective elements are formed to overlap corresponding semiconductors 36 for the gate protective elements via the gate insulating film 13. The gates 42 of the source protective elements are formed to overlap corresponding semiconductors 42 for the source protective elements.

The second electrode layer 4 can be made of metal(s), such as Al, Cr, Au, Ag, Ni, Cu, or Mo, or made of a transparent conductive film, such as ITO. The second electrode layer 4 can be formed using a step of vacuum or sputter coating, and thereafter a step of photolithography and etching. Printing, such as screen printing, flexography, gravure printing, offset printing, or reverse offset printing, can be used for forming the second electrode layer 4. Ag ink, Ni ink, Cu ink, or the like can be used for printing.

A second insulating film 5 serving as an interlayer insulating layer 18 is deposited on the substrate on which the second electrode 4 has been mounted. The interlayer insulating film 18 has openings 18A (see FIG. 28A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is formed, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 28B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, (i) The connection between a corresponding gate wire 12' and the drain 35 of the corresponding gate protective element (ii) The connection between the gate 32 of the corresponding gate protective element and the drain 35 of the corresponding gate protective element Each connection reinforcement electrode 49 for a corresponding source protective element serves to relay or reinforce, in a corresponding opening 18A of the interlayer insulating film 18, the connection between the gate 42 of the corresponding source protective element and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Figure 30A:
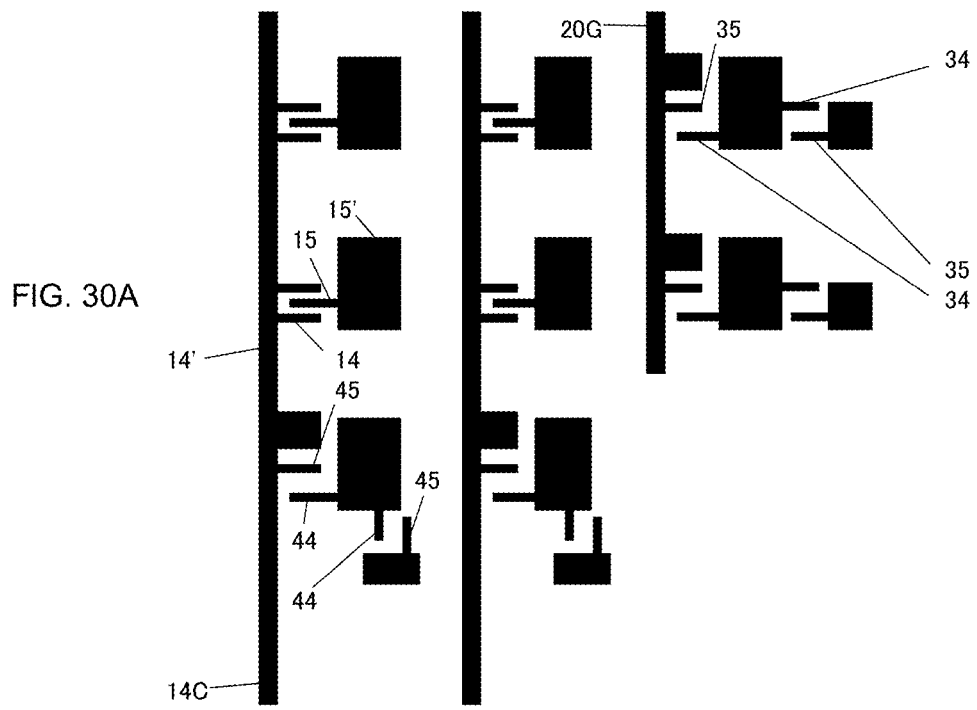
FIGS. 30A and 30B are plan views illustrating a manufacturing process of the thin film transistor array illustrated in FIG. 25.

FIG. 29 illustrates the example in which protective elements are designed as diode-connected transistors connected in series to each other. FIG. 29 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 29 is illustrated in FIGS. 30 to 32.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed. The first electrode layer 2 is comprised of sources 14, source wires 14', source connection electrodes 14C, drains 15, pixel electrodes 15', a gate common electrode 20G, sources 34 of gate protective elements, drains 35 of the gate protective elements, sources 44 of source protective elements, and drains 45 of the source protective elements (see FIG. 30A).

The first electrode layer 2 can be made of metal(s), such as Au, Ag, Ni, or Cu, or made of a transparent conductive film, such as ITO. Printing, such as gravure printing, offset printing, or reverse offset printing, can be used for forming the first electrode layer 2. Particularly, because reverse offset printing offers superior resolution, it is suited for forming the first electrode layer 2.

Figure 30B:
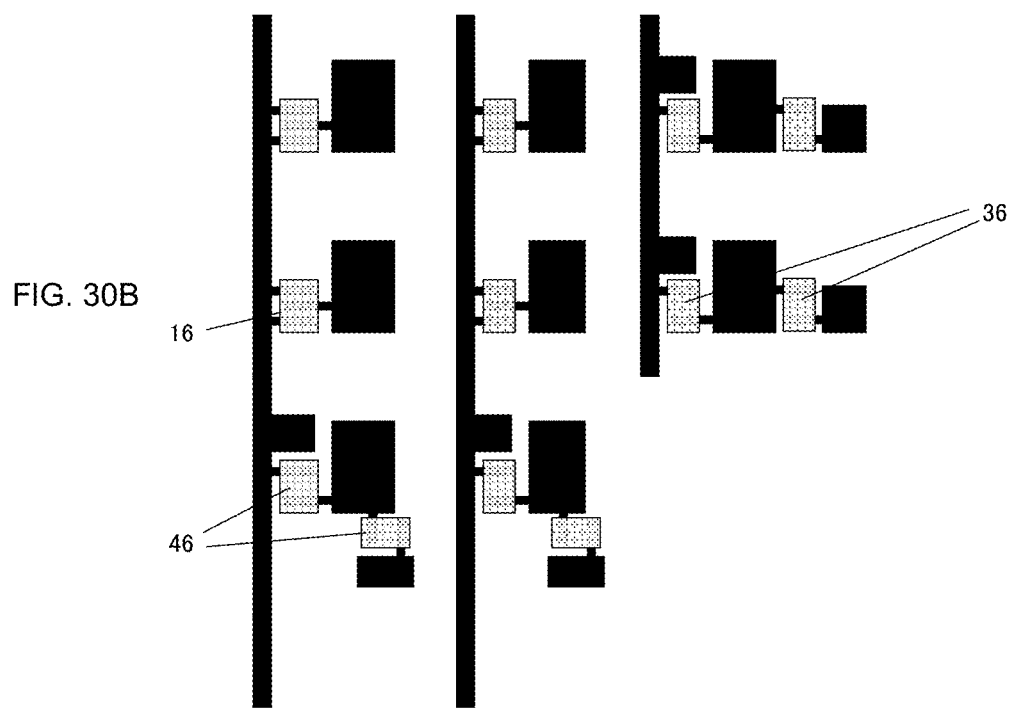

Next, semiconductors 16 for the thin film transistors for pixels, semiconductors 36 for the gate protective elements, and semiconductors 46 for the source protective elements are formed (see FIG. 30B). Each semiconductor 16 is formed to connect between the source 14 and drain 15 of a corresponding thin film transistor for a pixel. Each semiconductor 36 for a corresponding gate protective element is formed to connect between the source 34 and drain 35 of the corresponding gate protective element. Each semiconductor 46 for a corresponding source protective element is formed to connect between the source 44 and drain 45 of the corresponding source protective element.

The structure set forth above is designed as a bottom contact structure where semiconductors are formed on the first electrode layer 2, but, in the present invention, the structure can be designed as a top contact structure where the first electrode layer 2 is mounted on semiconductors previously formed. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor.

A first insulating film 3 serving as a gate insulating film 13 is deposited on the substrate on which the first electrode layer 2 and the semiconductors 16, 36, and 46 have been mounted. The gate insulating film 13 has openings 13A (see FIG. 31A). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of gates 12, gate wires 12', gate connection electrodes 12C, capacitor electrodes 17, capacitor wires 17', gates 32 of the gate protective elements, gates 42 of the source protective elements, and a source common electrode 20S (see FIG. 31B).

The gates 12 are formed to overlap corresponding semiconductors 16 for thin film transistors for pixels via the gate insulating film 13. The gates 32 of the gate protective elements are formed to overlap corresponding semiconductors 36 for the gate protective elements via the gate insulating film 13. The gates 42 of the source protective elements are formed to overlap corresponding semiconductors 42 for the source protective elements.

The second electrode layer 4 can be made of metal(s), such as Al, Cr, Au, Ag, Ni, Cu, or Mo, or made of a transparent conductive film, such as ITO. The second electrode layer 4 can be formed using a step of vacuum or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing.

A second insulating film 5 serving as an interlayer insulating layer 18 is deposited on the substrate on which the second electrode 4 has been mounted. The interlayer insulating film 18 has openings 18A (see FIG. 32A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is formed, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 32B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, the connection between the gate 32 of the corresponding gate protective element and the drain 35 of the corresponding gate protective element Each connection reinforcement electrode 49 for a corresponding source protective element serves to relay or reinforce, in a corresponding opening 18A of the interlayer insulating film 18, the connection between the gate 42 of the corresponding source protective element and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Figure 34A:
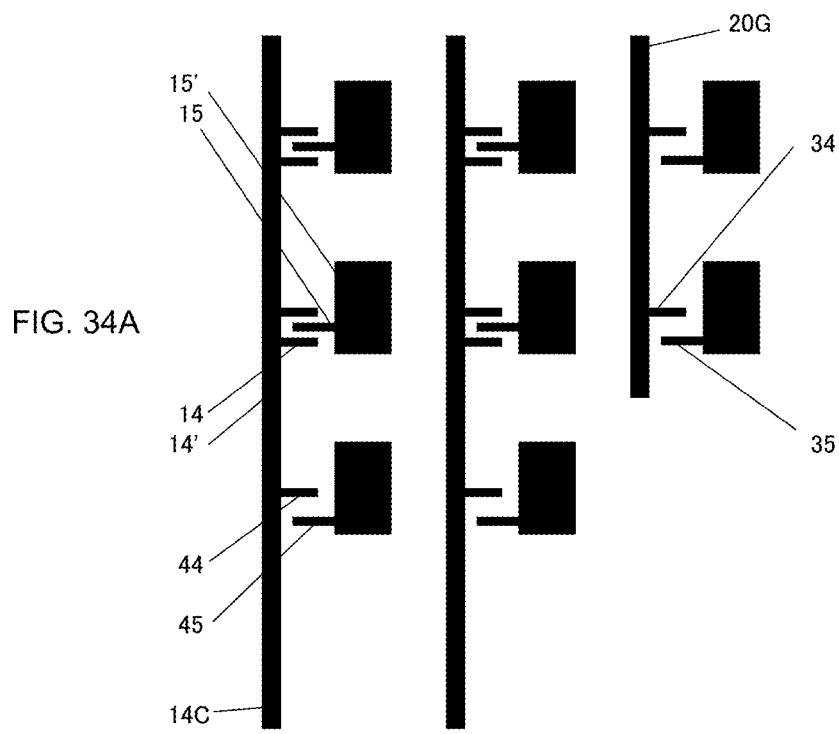
FIGS. 34A and 34B are plan views illustrating a manufacturing process of the thin film transistor array illustrated in FIG. 33.

FIG. 33 illustrates the example in which protective elements are designed as floating-gate transistors. FIG. 33 illustrates four thin film transistors 10 for pixels, two gate protection elements 30, and two source protection elements 40. The four thin film transistors 10 include upper pixel electrodes 19, the two gate protection elements 30 include connection reinforcement electrodes 39, and the two source protection elements 40 include connection reinforcement electrodes 49. A manufacturing process of the thin film transistor array illustrated in FIG. 33 is illustrated in FIGS. 34 to 36.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystyrene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed. The first electrode layer 2 is comprised of sources 14, source wires 14', source connection electrodes 14C, drains 15, pixel electrodes 15', a gate common electrode 20G, sources 34 of gate protective elements, drains 35 of the gate protective elements, sources 44 of source protective elements, and drains 45 of the source protective elements (see FIG. 34A).

The first electrode layer 2 can be made of metal(s), such as Au, Ag, Ni, or Cu, or made of a transparent conductive film, such as ITO. Printing, such as gravure printing, offset printing, or reverse offset printing, can be used for forming the first electrode layer 2. Particularly, because reverse offset printing offers superior resolution, it is suited for forming the first electrode layer 2.

Figure 34B:
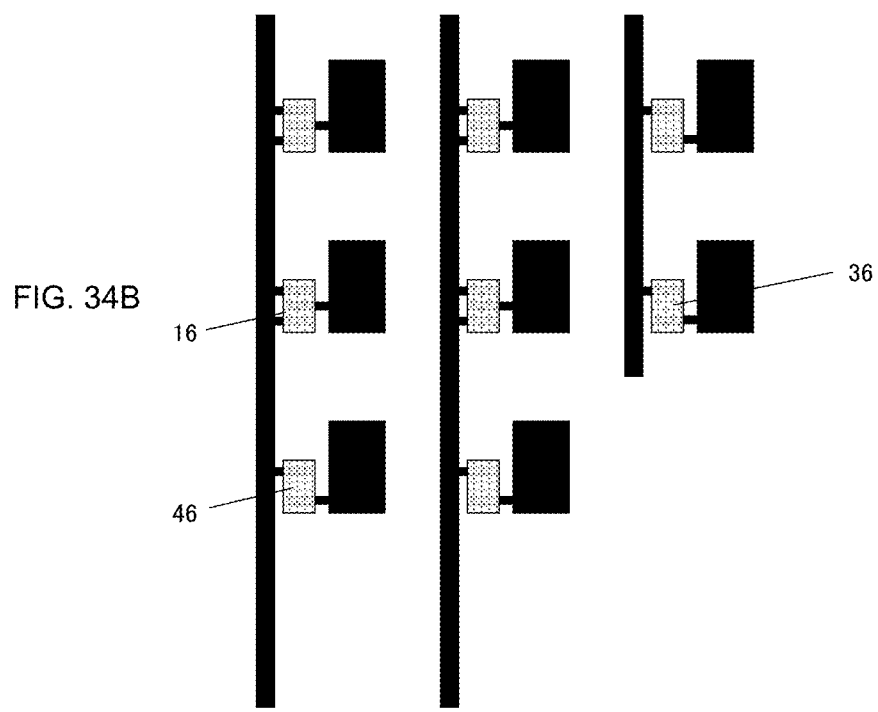

Next, semiconductors 16 for the thin film transistors for pixels, semiconductors 36 for the gate protective elements, and semiconductors 46 for the source protective elements are formed (see FIG. 34B). Each semiconductor 16 is formed to connect between the source 14 and drain 15 of a corresponding thin film transistor for a pixel. Each semiconductor 36 for a corresponding gate protective element is formed to connect between the source 34 and drain 35 of the corresponding gate protective element. Each semiconductor 46 for a corresponding source protective element is formed to connect between the source 44 and drain 45 of the corresponding source protective element.

The structure set forth above is designed as a bottom contact structure where semiconductors are formed on the first electrode layer 2, but, in the present invention, the structure can be designed as a top contact structure where the first electrode layer 2 is mounted on semiconductors previously formed. As the semiconductors 16, 36, and 46, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor.

A first insulating film 3 serving as a gate insulating film 13 is deposited on the substrate on which the first electrode layer 2 and the semiconductors 16, 36, and 46 have been mounted. The gate insulating film 13 has openings 13A (see FIG. 35A). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of gates 12, gate wires 12', gate connection electrodes 12C, capacitor electrodes 17, capacitor wires 17', gates 32 of the gate protective elements, gates 42 of the source protective elements, and a source common electrode 20S (see FIG. 35B).

The gates 12 are formed to overlap corresponding semiconductors 16 for thin film transistors for pixels via the gate insulating film 13. The gates 32 of the gate protective elements are formed to overlap corresponding semiconductors 36 for the gate protective elements via the gate insulating film 13. The gates 42 of the source protective elements are formed to overlap corresponding semiconductors 42 for the source protective elements.

The second electrode layer 4 can be made of metal(s), such as Al, Cr, Au, Ag, Ni, Cu, or Mo, or made of a transparent conductive film, such as ITO. The second electrode layer 4 can be formed using a step of vacuum or sputter coating, and thereafter a step of photolithography and etching. Printing, such as screen printing, flexography, gravure printing, offset printing, or reverse offset printing, can be used for forming the first electrode layer 2. Ag ink, Ni ink, Cu ink, or the like can be used for printing.

A second insulating film 5 serving as an interlayer insulating layer 18 is deposited on the substrate on which the second electrode 4 has been mounted. The interlayer insulating film 18 has openings 18A (see FIG. 36A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is formed, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, the connection reinforcement electrodes 39 for the gate protective elements, and the connection reinforcement electrodes 49 for the source protective elements (see FIG. 36B). Each upper pixel electrode 19 is connected to a corresponding pixel electrode 15' via a corresponding opening 18A of the interlayer insulating film 18. Each connection reinforcement electrode 39 for a corresponding gate protective element serves to relay or reinforce, in a corresponding opening 18A of the interlayer insulating film 18, the connection between a corresponding gate wire 12' and the drain 35 of the corresponding gate protective element Each connection reinforcement electrode 49 for a corresponding source protective element serves to relay or reinforce, in a corresponding opening 18A of the interlayer insulating film 18, a corresponding source wire 14' and the drain 45 of the corresponding source protective element.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Fifth Embodiment

Figure 37:
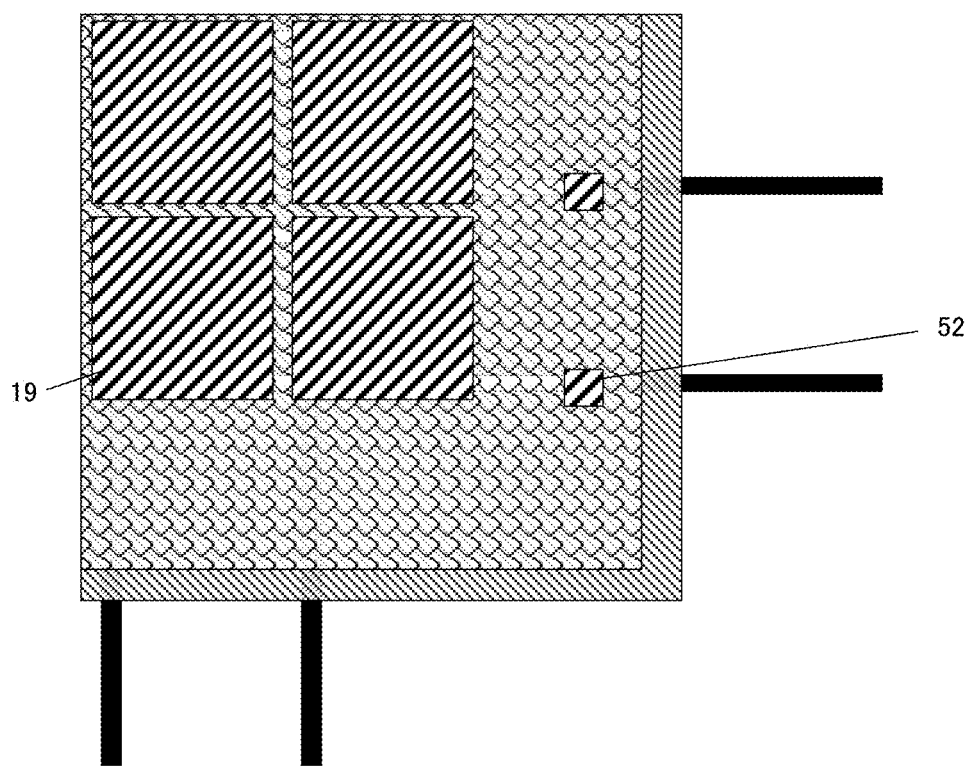
FIG. 37 is a plan view illustrating an example of the thin film transistor arrays according to the present invention.
Figure 41:
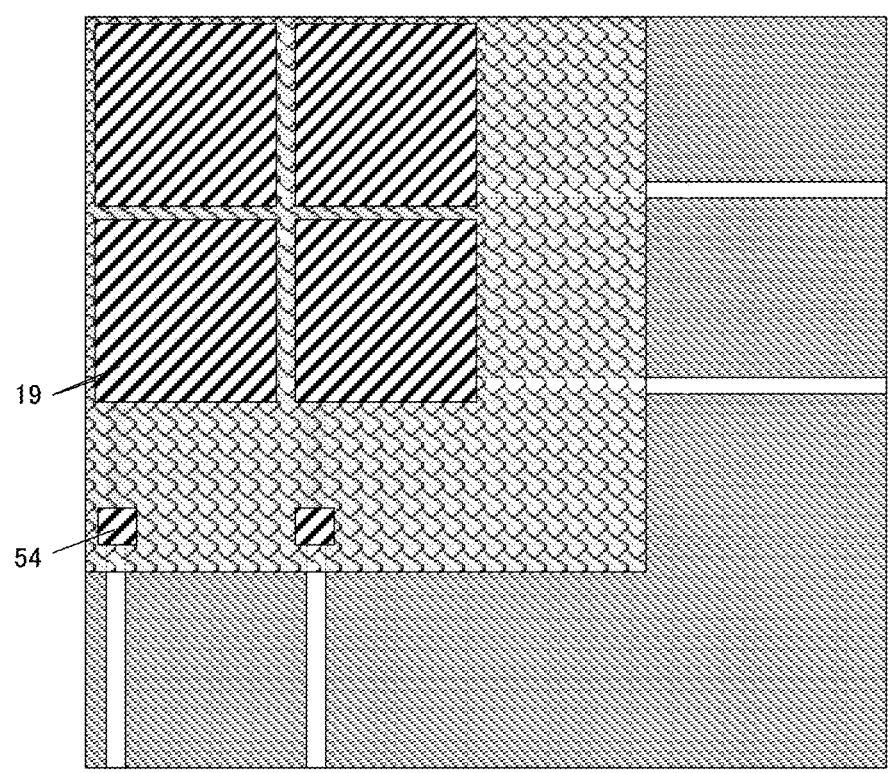
FIG. 41 is a plan view illustrating an example of the thin film transistor arrays according to the present invention.

Examples of thin film transistor arrays according to the fifth embodiment of the present invention are illustrated in FIGS. 37 and 41. Each of the thin film transistor arrays includes top-gate thin film transistors. Each of the top-gate thin film transistors is designed as a layered structure whose portion connecting a first electrode 2 and a second electrode 4 is used to switch wiring from the second electrode 4 to the first electrode 2 or from the first electrode 2 to the second electrode 4.

FIG. 37 illustrates the example in which connection reinforcement electrodes 52 relay or reinforce portions that connect gate wires 12' included in the first electrode layer 2 to corresponding gate connection electrodes 12C included in the second electrode layer 4. FIG. 37 illustrates four thin film transistors 10 for pixels, two gate wires 12' and two gate connection electrodes 12C respectively connected to the two gate wires 12', and two source wires 14' and two source connection electrodes 14C respectively connected to the two source wires 14'. The four thin film transistors 10 for pixels include upper pixel electrodes 19, and the gate connection electrodes 12C respectively include the connection reinforcement electrodes 52. A manufacturing process of the thin film transistor array illustrated in FIG. 37 is illustrated in FIGS. 38 to 40.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polystylene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed. The first electrode layer 2 is comprised of sources 14, source wires 14', gate connection electrodes 12C, and source connection electrodes 14C (see FIG. 38A).

The first electrode layer 2 can be made of metal(s), such as Al, Cr, Au, Ag, Ni, Cu, or Mo, or made of a transparent conductive film, such as ITO. Printing, such as gravure printing, offset printing, or reverse offset printing, can be used for forming the first electrode layer 2. Particularly, because reverse offset printing offers superior resolution, it is suited for forming the first electrode layer 2.

Next, semiconductors 16 for the thin film transistors for pixels are formed (see FIG. 38B). Each semiconductor 16 is formed to connect between the source 14 and drain 15 of a corresponding thin film transistor for a pixel.

The structure set forth above is designed as a bottom contact structure where semiconductors are formed on the first electrode layer 2, but, in the present invention, the structure can be designed as a top contact structure where the first electrode layer 2 is mounted on semiconductors previously formed. As the semiconductors 16, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor.

A first insulating film 3 serving as a gate insulating film 13 is deposited on the substrate on which the first electrode layer 2 and the semiconductors 16 have been mounted. The gate insulating film 13 has openings 13A (see FIG. 39A). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet printing, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of gates 12, gate wires 12', gate connection electrodes 12C, capacitor electrodes 17, and capacitor wires 17' (see FIG. 39B).

The gates 12 are formed to overlap corresponding semiconductors 16 for thin film transistors for pixels via the gate insulating film 13. The second electrode layer 4 can be made of metal(s), such as Au, Ag, Ni, or Cu, or made of a transparent conductive film, such as ITO. The second electrode layer 4 can be formed using a step of vacuum or sputter coating, and thereafter a step of photolithography and etching. Printing, such as screen printing, flexography, gravure printing, offset printing, or reverse offset printing, can be used for forming the second electrode layer 4. Ag ink, Ni ink, Cu ink, or the like can be used for printing.

A second insulating film 5 serving as an interlayer insulating layer 18 is deposited on the substrate on which the second electrode 4 has been mounted. The interlayer insulating film 18 has openings 18A (see FIG. 40A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is formed, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, and the connection reinforcement electrodes 52 for the gate wires (see FIG. 40B). Each upper pixel electrode 19 is connected to a corresponding pixel electrode 15' via a corresponding opening 18A of the interlayer insulating film 18. Each connection reinforcement electrode 52 for a corresponding gate wire serves to relay or reinforce, in a corresponding opening 18A of the interlayer insulating film 18, the connection between a corresponding gate wire 12' and a corresponding gate connection electrode 12C.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

Figure 42A:
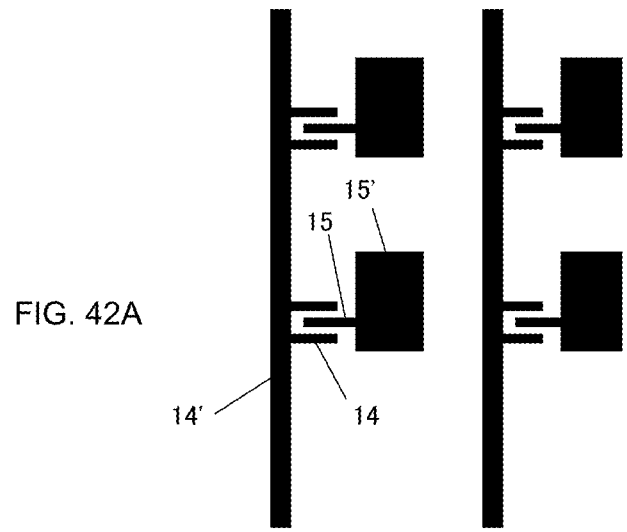
FIGS. 42A and 42B are plan views illustrating a manufacturing process of the thin film transistor array illustrated in FIG. 41.

FIG. 41 illustrates the example in which connection reinforcement electrodes 54 relay or reinforce portions that connect source wires 14' included in the first electrode layer 2 to corresponding source connection electrodes 14C included in the second electrode layer 4. FIG. 41 illustrates four thin film transistors 10 for pixels, two gate wires 12' and two gate connection electrodes 12C respectively connected to the two gate wires 12', and two source wires 14' and two source connection electrodes 14C respectively connected to the two source wires 14'. The four thin film transistors 10 for pixels include upper pixel electrodes 19, and the source connection electrodes 14C respectively include the connection reinforcement electrodes 54. A manufacturing process of the thin film transistor array illustrated in FIG. 41 is illustrated in FIGS. 42 to 44.

A substrate 1 can be made of an inorganic substance, such as glass, or an organic substance, such as a plastic. Specifically, the substrate can be made of polyethylene terephthalate (PET), polyethylene naphthalate (PEN), polyethersulfone (PES), polyimide (PI), polyetherimide (PEI), polyethylene (PS), polyvinyl chloride (PVC), polyethylene (PE), polypropylene (PP), nylon (Ny), or other similar materials. A laminate or a mixture of one or more of these materials can be used as the substrate 1.

On the substrate 1, a first electrode layer 2 is formed. The first electrode layer 2 is comprised of sources 14, source wires 14', drains 15, and pixel electrodes 15' (see FIG. 42A).

The first electrode layer 2 can be made of metal(s), such as Al, Cr, Au, Ag, Ni, Cu, or Mo, or made of a transparent conductive film, such as ITO. Printing, such as gravure printing, offset printing, or reverse offset printing, can be used for forming the first electrode layer 2. Particularly, because reverse offset printing offers superior resolution, it is suited for forming the first electrode layer 2.

Figure 42B:
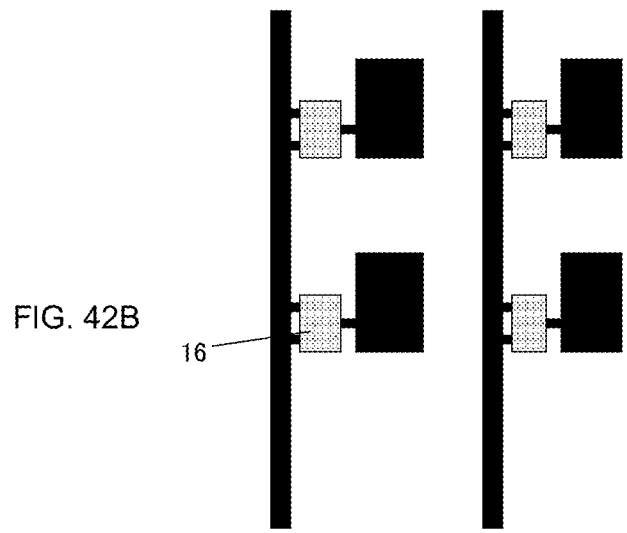

Next, semiconductors 16 for the thin film transistors for pixels are formed (see FIG. 42B). Each semiconductor 16 is formed to connect between the source 14 and drain 15 of a corresponding thin film transistor for a pixel.

The structure set forth above is designed as a bottom contact structure where semiconductors are formed on the first electrode layer 2, but, in the present invention, the structure can be designed as a top contact structure where the first electrode layer 2 is mounted on semiconductors previously formed. As the semiconductors 16, organic semiconductors or oxide semiconductors can be used. Specifically, each of the organic semiconductors can be made of a polythiophene derivative, a polyphenylenevinylene derivative, a polythienylenevinylene derivative, a polyallylamine derivative, a polyacetylene derivative, an acene derivative, an oligothiophene derivative, or the like. As oxide semiconductors, InGaZnO semiconductors, ZnGaO semiconductors, InZnO semiconductors, InO semiconductors, GaO semiconductors, SnO semiconductors, or semiconductors made of some of these oxides can be used. Printing a solution for an organic semiconductor or a solution for an oxide semiconductor using flexography or ink-jet printing and thereafter firing it make it possible to form the organic semiconductor or oxide semiconductor.

A first insulating film 3 serving as a gate insulating film 13 is deposited on the substrate on which the first electrode layer 2 and the semiconductors 16 have been mounted. The gate insulating film 13 has openings 13A (see FIG. 43A). As the first insulating film 3, an organic insulating film made of polyvinyl phenol, epoxy, polyimide, or another material can be used. As the first insulating film 3, an inorganic insulating film made of $SiO_2$, SiN, SiON, $Al_2O_3$, or another material can also be used.

When a solvent-soluble organic material is used, depositing a film using spin coating or die coating and thereafter patterning the film using photolithography, etching, and/or lift-off make it possible to manufacture the first insulating film 3. When a material other than the solvent-soluble organic materials is used, depositing a film using sputtering, vacuum deposition, laser ablation, or the like and thereafter patterning the film using photolithography, etching, and/or lift-off make it possible to manufacture the first insulating film 3. Direct patterning for forming the first insulating film 3 using printing, such as flexography, reverse offset printing, ink-jet, or the like can be used. Direct patterning for forming the first insulating film 3 using exposure and developing of a light-sensitive organic material can also be used.

On the substrate on which the first insulating film 3 has been deposited, a second electrode layer 4 is formed. The second electrode layer 4 is comprised of gates 12, gate wires 12', capacitor electrodes 17, capacitor wires 17', and source connection electrodes 14C (see FIG. 43B).

The gates 12 are formed to overlap corresponding semiconductors 16 for thin film transistors for pixels via the gate insulating film 13. The second electrode layer 4 can be made of metal(s), such as Au, Ag, Ni, or Cu, or made of a transparent conductive film, such as ITO. The second electrode layer 4 can be formed using a step of vacuum evaporation or sputter coating, and thereafter a step of photolithography and etching. Printing, such as screen printing, flexography, gravure printing, offset printing, or reverse offset printing, can be used for forming the second electrode layer 4. Ag ink, Ni ink, Cu ink, or the like can be used for printing.

A second insulating film 5 serving as an interlayer insulating layer 18 is deposited on the substrate on which the second electrode 4 has been mounted. The interlayer insulating film 18 has openings 18A (see FIG. 44A). The second insulating film 5 can be preferably made of polyvinyl phenol, acrylic, epoxy, polyimide, or another material. Printing, such as screen printing, gravure-offset printing, or the like can be suitably used for forming the second insulating film 5. After a light-sensitive film is formed, it can be exposed and developed to thereby also form the second insulating film 5.

On the substrate on which the second insulating film 5 has been deposited, a third electrode layer 6 is formed. The third electrode layer 6 is comprised of the upper pixel electrodes 19, and the connection reinforcement electrodes 54 for the source wires (see FIG. 44B). Each upper pixel electrode 19 is connected to a corresponding pixel electrode 15' via a corresponding opening 18A of the interlayer insulating film 18. Each connection reinforcement electrode 54 for a corresponding source wire serves to relay or reinforce, in a corresponding opening 18A of the interlayer insulating film 18, the connection between a corresponding source wire 14' and a corresponding source connection electrode 14C.

The third electrode layer 6 can be made of metal(s), such as Al, Cr, Au, Ag, Ni, or Cu, or made of a transparent conductive film, such as ITO. Screen printing or gravure-offset printing using Ag ink, Ni ink, Cu ink, or another ink can be suitably applied for forming the third electrode layer 6. This is because screen printing and gravure-offset printing is suitable for thick-film printing.

EXAMPLES

Example 1

An example 1 of the present invention will be described hereinafter with reference to FIGS. 1A to 1F. The combination of the structures illustrated in FIGS. 1A to 1F was manufactured.

First, Al was deposited on a glass insulating substrate 1 using sputtering to form a film having a thickness of 50 nm. A first electrode layer 2 was formed using photolithography and etching. Next, a light-sensitive organic material was applied by spin-coating, and an exposure and developing process was applied to the spin-coated organic material, so that a first insulating film 3 having openings 3A was deposited to form a film having a thickness of 1 μm. Next, Ag ink was reverse-printed and thereafter fired at 180° C., so that a second electrode layer 4 having a pattern with a thickness of 50 nm was formed.

Epoxy resin was screen printed and thereafter fired, so that a second insulating film 5 having the openings 5A was deposited. Ag paste was screen printed and thereafter fired, so that a third electrode layer 6 was formed.

The structure manufactured set forth above includes the combination of the structures illustrated in FIGS. 1A to 1F. Electrical connection between the first electrode layer 2 and the second electrode layer 4 of each of the structures illustrated in FIGS. 1A to 1F was confirmed.

Comparison Example 1

A comparison example 1 will be described hereinafter with reference to FIGS. 45A to 45F.

First, Al was deposited on glass as an insulating substrate 1 using sputtering to form a film having a thickness of 50 nm. A first electrode layer 2 was formed using photolithography and etching. Next, a light-sensitive organic material was applied by spin-coating, and an exposure and developing process was applied to the spin-coated organic material, so that a first insulating film 3 having openings 3A was deposited to form a film having a thickness of 1 μm. Next, Ag ink was reverse-printed and thereafter fired at 180° C., so that a second electrode layer 4 having a pattern with a thickness of 50 nm was formed.

The structure manufactured set forth above includes the combination of the structures illustrated in FIGS. 45A to 45F. Electrical connection between the first electrode layer 2 and the second electrode layer 4 of the structure illustrated in FIGS. 45E and 45F was confirmed. However, the first electrode layer 2 and the second electrode layer 4 of the structure illustrated in each of FIGS. 45A to 45D are not electrically connected to each other.

Example 2

An example 2 of the present invention will be described hereinafter with reference to FIGS. 5 to 8B. An element illustrated in FIG. 5 was manufactured in the process steps illustrated in FIGS. 6A to 8B.

First, Ag ink was reverse-offset printed on a PEN substrate as an insulating substrate 1 and thereafter was fired, so that a first electrode layer 2 was formed on the PEN substrate. The first electrode layer 2 includes gates 12, gate wires 12', capacitor electrodes 17, capacitor wires 17', gates 32 of gate protective elements, gates 42 of source protective elements, a source common electrode 20S, and gate connection electrodes 12C (see FIG. 6A).

Next, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 6B).

Ag ink was reverse-printed and thereafter fired at 180° C., so that a second electrode layer 4 having a pattern with a thickness of 50 μm was formed. The second electrode layer 4 includes sources 14, source wires 14', drains 15, pixel electrodes 15', sources 34 of the gate protective elements, drains 35 of the gate protective elements, sources 44 of the source protective elements, and drains 45 of the source protective elements, a gate common electrode 20G, and source connection electrodes 14C (see FIG. 7A).

Next, a polythiophene solution was ink-jet printed and thereafter fired at 100° C., so that semiconductor layers 16, semiconductors 36 for the gate protective elements, and semiconductors 46 for the source protective elements were formed (see FIG. 7B). Cytop® as a fluorinated resin was screen printed and thereafter fired, so that sealing layers covering the respective semiconductors 16, 36, and 46 were formed (not shown).

Figure 8A:
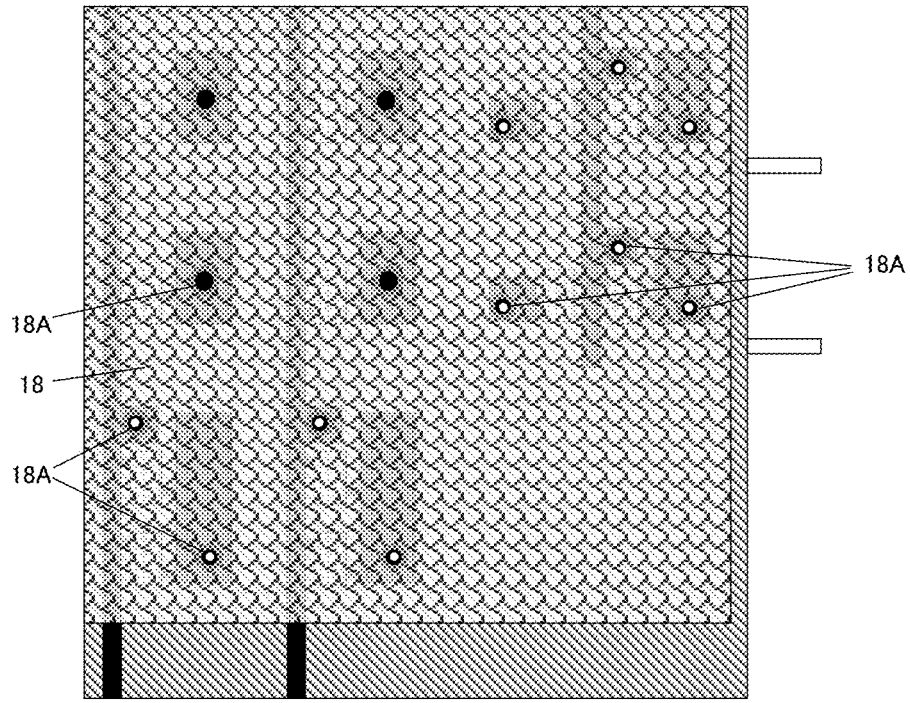
FIGS. 8A and 8B are plan views illustrating the manufacturing process of the thin film transistor array illustrated in FIG. 5.
Figure 8B:
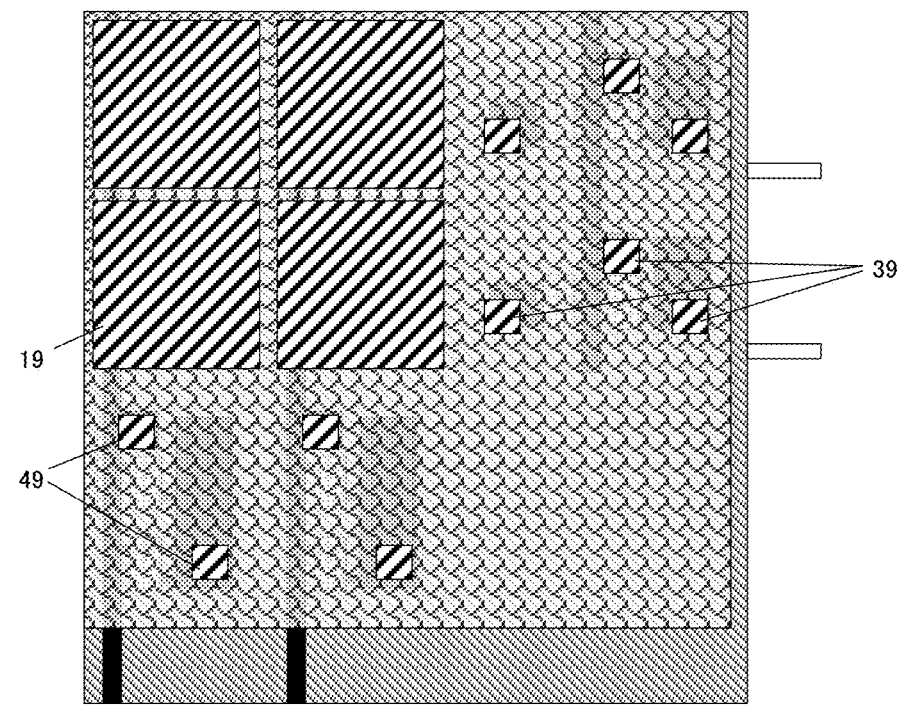

Next, epoxy resin was screen printed and thereafter fired, so that an interlayer insulating film 18 having openings 18A, i.e. a second insulating film 5 having openings 5A, was deposited (see FIG. 8A). Ag paste was screen printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 8B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 3

An example 3 of the present invention will be described hereinafter with reference to FIGS. 9 to 12B. An element illustrated in FIG. 9 was manufactured in the process steps illustrated in FIGS. 10A to 12B.

First, Ag ink was reverse-offset printed on a PEN substrate as an insulating substrate 1 and thereafter fired, so that a first electrode layer 2 was formed on the PEN substrate. The first electrode layer 2 includes gates 12, gate wires 12', capacitor electrodes 17, capacitor wires 17', gates 32 of gate protective elements, gates 42 of source protective elements, a source common electrode 20S, and gate connection electrodes 12C (see FIG. 10A).

Next, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 µm (see FIG. 10B).

Ag ink was reverse-printed and thereafter fired at 180° C., so that a second electrode layer 4 having a pattern with a thickness of 50 nm was formed. The second electrode layer 4 includes sources 14, source wires 14', drains 15, pixel electrodes 15', sources 34 of the gate protective elements, drains 35 of the gate protective elements, sources 44 of the source protective elements, and drains 45 of the source protective elements, a gate common electrode 20G, and source connection electrodes 14C (see FIG. 11A).

Next, a polythiophene solution was ink-jet printed and thereafter fired at 100° C., so that semiconductor layers 16, semiconductors 36 for the gate protective elements, and semiconductors 46 for the source protective elements were formed (see FIG. 11B). Cytop® as a fluorinated resin was screen printed and thereafter fired, so that sealing layers covering the respective semiconductors 16, 36, and 46 were formed (not shown).

Figure 12A:
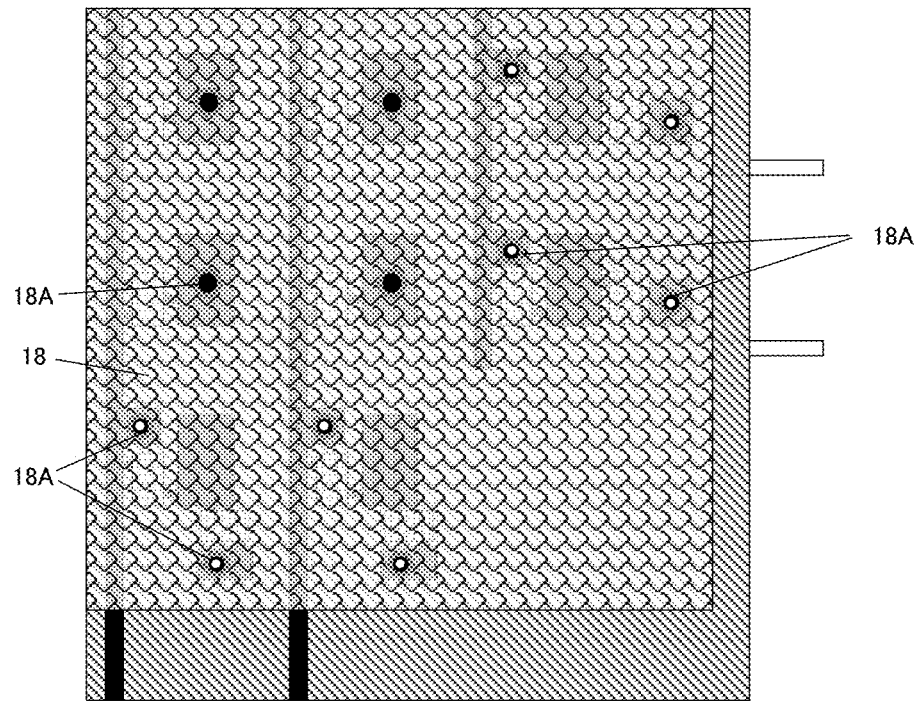
FIGS. 12A and 12B are plan views illustrating the manufacturing process of the thin film transistor array illustrated in FIG. 9.
Figure 12B:
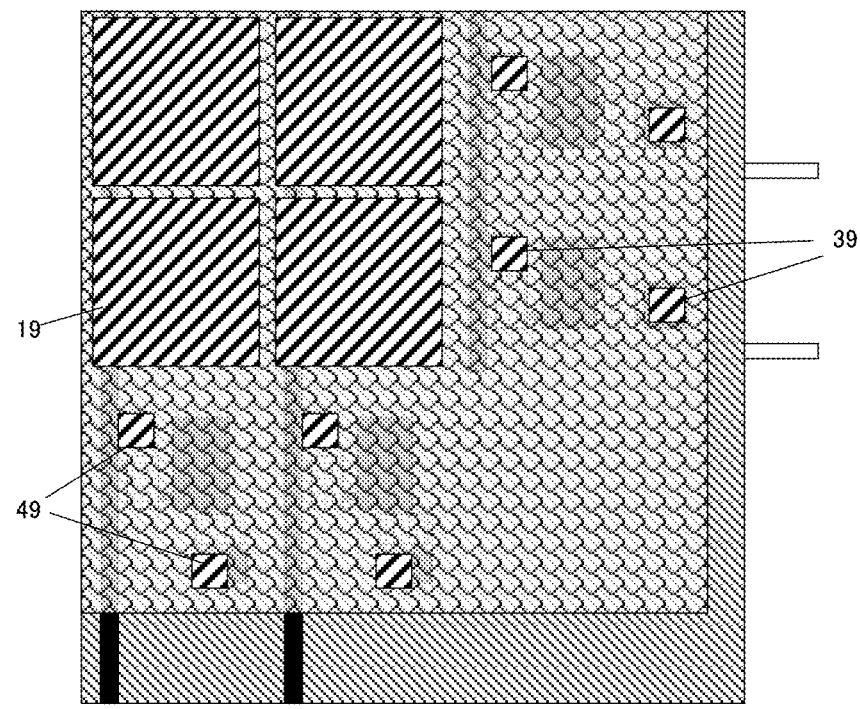

Next, epoxy resin was screen printed and thereafter fired, so that an interlayer insulating film 18 having openings 18A, i.e. a second insulating film 5 having openings 5A, was deposited (see FIG. 12A). Ag paste was screen printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 12B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 4

An example 4 of the present invention will be described hereinafter with reference to FIGS. 13 to 16B. An element illustrated in FIG. 13 was manufactured in the process steps illustrated in FIGS. 14A to 16B.

First, Ag ink was reverse-offset printed on a PEN substrate as an insulating substrate 1 and thereafter fired, so that a first electrode layer 2 was formed on the PEN substrate. The first electrode layer 2 includes gates 12, gate wires 12', capacitor electrodes 17, capacitor wires 17', gates 32 of gate protective elements, gates 42 of source protective elements, a source common electrode 20S, and gate connection electrodes 12C (see FIG. 14A).

Next, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 µm (see FIG. 14B).

Ag ink was reverse-printed and thereafter fired at 180° C., so that a second electrode layer 4 having a pattern with a thickness of 50 nm was formed. The second electrode layer 4 includes sources 14, source wires 14', drains 15, pixel electrodes 15', sources 34 of the gate protective elements, drains 35 of the gate protective elements, sources 44 of the source protective elements, and drains 45 of the source protective elements, a gate common electrode 20G, and source connection electrodes 14C (see FIG. 15A).

Next, a polythiophene solution was flexo printed and thereafter fired at 100° C., so that semiconductor layers 16, semiconductors 36 for the gate protective elements, and semiconductors 46 for the source protective elements were formed (see FIG. 15B). Cytop® as a fluorinated resin was screen printed and thereafter fired, so that sealing layers covering the respective semiconductors 16, 36, and 46 were formed (not shown).

Figure 16A:
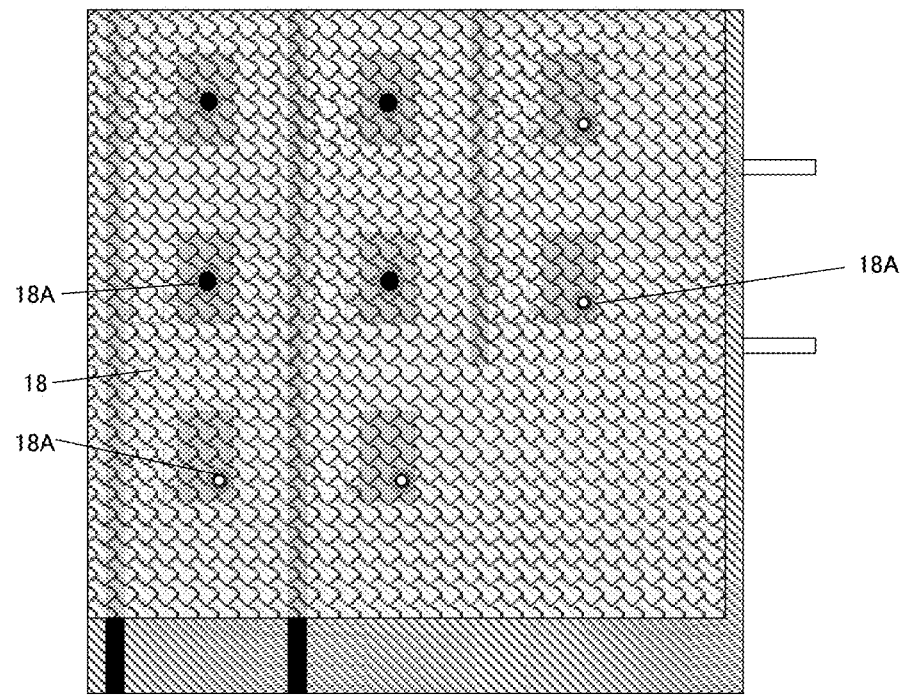
FIGS. 16A and 16B are plan views illustrating the manufacturing process of the thin film transistor array illustrated in FIG. 13.
Figure 16B:
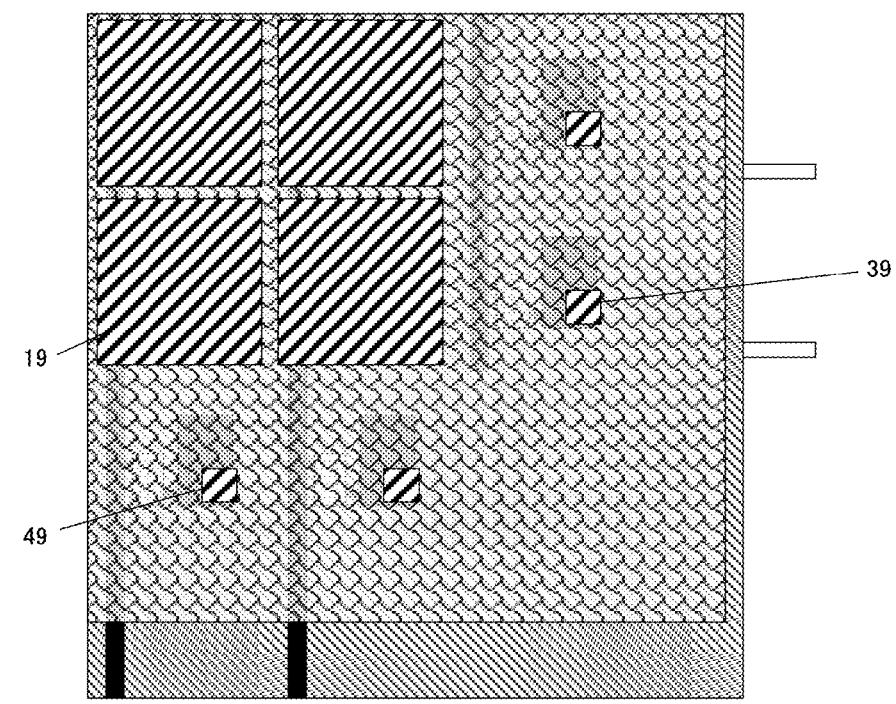

Next, epoxy resin was gravure-offset printed and thereafter fired, so that an interlayer insulating film 18 having openings 18A, i.e. a second insulating film 5 having openings 5A, was deposited (see FIG. 16A). Ag paste was gravure-offset printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 16B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 5

An example 5 of the present invention will be described hereinafter with reference to FIGS. 17 to 20B. An element illustrated in FIG. 17 was manufactured in the process steps illustrated in FIGS. 18a to 20B.

First, Ag ink was reverse-offset printed on a PEN substrate as an insulating substrate 1 and thereafter fired, so that a first electrode layer 2 was formed on the PEN substrate. The first electrode layer 2 includes gates 12, gate wires 12', capacitor electrodes 17, capacitor wires 17', gate connection electrodes 12C, and source connection electrodes 14C (see FIG. 18a).

Next, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 µm (see FIG. 18B).

Ag ink was reverse-printed and thereafter fired at 180° C., so that a second electrode layer 4 having a pattern with a thickness of 50 nm was formed. The second electrode layer 4 includes sources 14, source wires 14', drains 15, and pixel electrodes 15' (see FIG. 19A).

Next, a polythiophene solution was ink-jet printed and thereafter fired at 100° C., so that semiconductor layers 16, semiconductors 36 for the gate protective elements, and semiconductors 46 for the source protective elements were formed (see FIG. 19B). Cytop® as a fluorinated resin was screen printed and thereafter fired, so that sealing layers covering the respective semiconductors 16, 36, and 46 were formed (not shown).

Figure 20A:
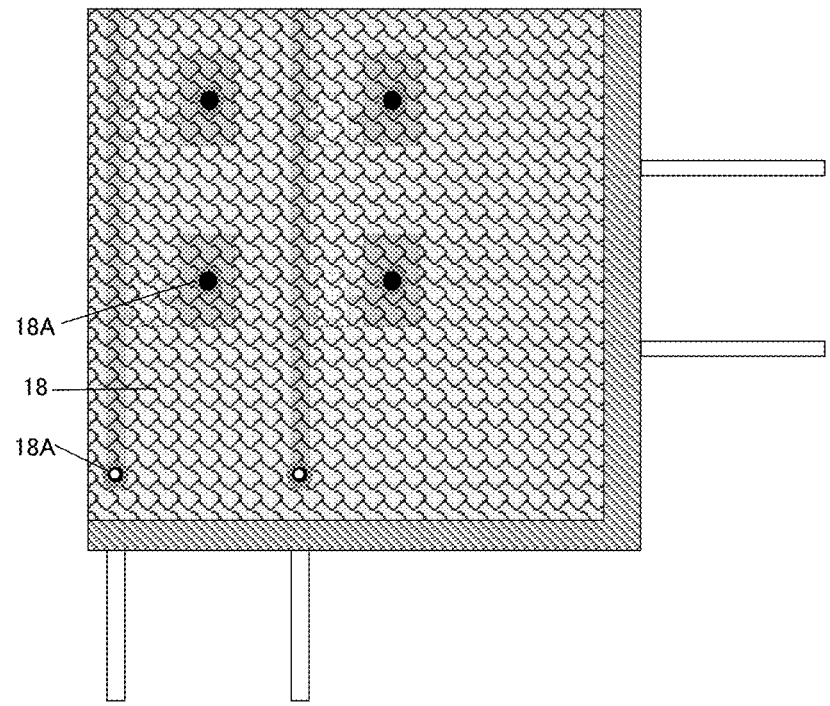
FIGS. 20A and 20B are plan views illustrating the manufacturing process of the thin film transistor array illustrated in FIG. 17.
Figure 20B:
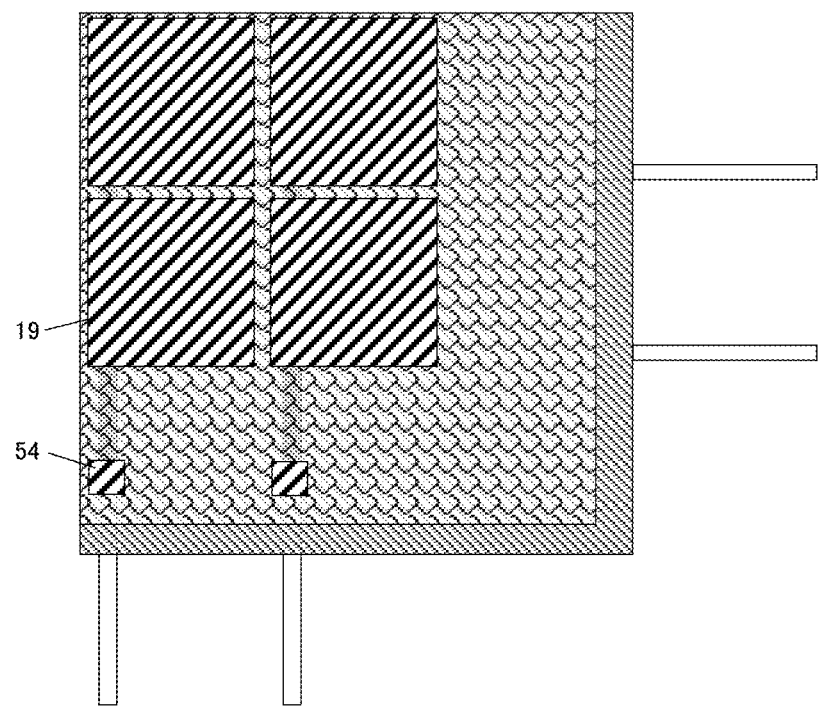

Next, epoxy resin was screen printed and thereafter fired, so that an interlayer insulating film 18 having openings 18A, i.e. a second insulating film 5 having openings 5A, was deposited (see FIG. 20A). Ag paste was screen printed and thereafter fired, so that a third electrode layer 6 was formed; the third electrode layer 6 includes upper pixel electrodes 19 and connection reinforcement electrodes 54 for the source wires (see FIG. 20B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 6

An example 6 of the present invention will be described hereinafter with reference to FIGS. 21 to 24B. An element illustrated in FIG. 21 was manufactured in the process steps illustrated in FIGS. 22A to 24B.

First, Ag ink was reverse-offset printed on a PEN substrate as an insulating substrate 1 and thereafter fired, so that a first electrode layer 2 was formed on the PEN substrate. The first electrode layer 2 includes gates 12, gate wires 12', capacitor electrodes 17, and capacitor wires 17' (see FIG. 22A).

Figure 22B:
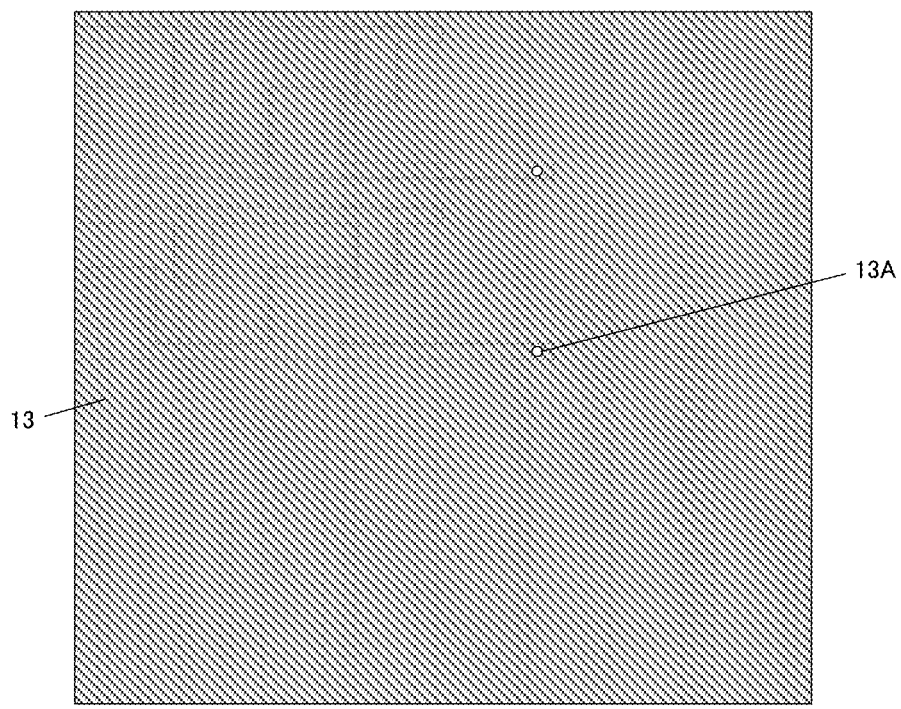

Next, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 22B).

Ag ink was reverse-printed and thereafter fired at 180° C., so that a second electrode layer 4 having a pattern with a thickness of 50 nm was formed. The second electrode layer 4 includes sources 14, source wires 14', drains 15, pixel electrodes 15', gate connection electrodes 12C, and source connection electrodes 14C (see FIG. 23A).

Next, a polythiophene solution was flexo printed and thereafter fired at 100° C., so that semiconductor layers 16, semiconductors 36 for the gate protective elements, and semiconductors 46 for the source protective elements were formed (see FIG. 23B). Cytop® as a fluorinated resin was screen printed and thereafter fired, so that sealing layers covering the respective semiconductors 16, 36, and 46 were formed (not shown).

Figure 24A:
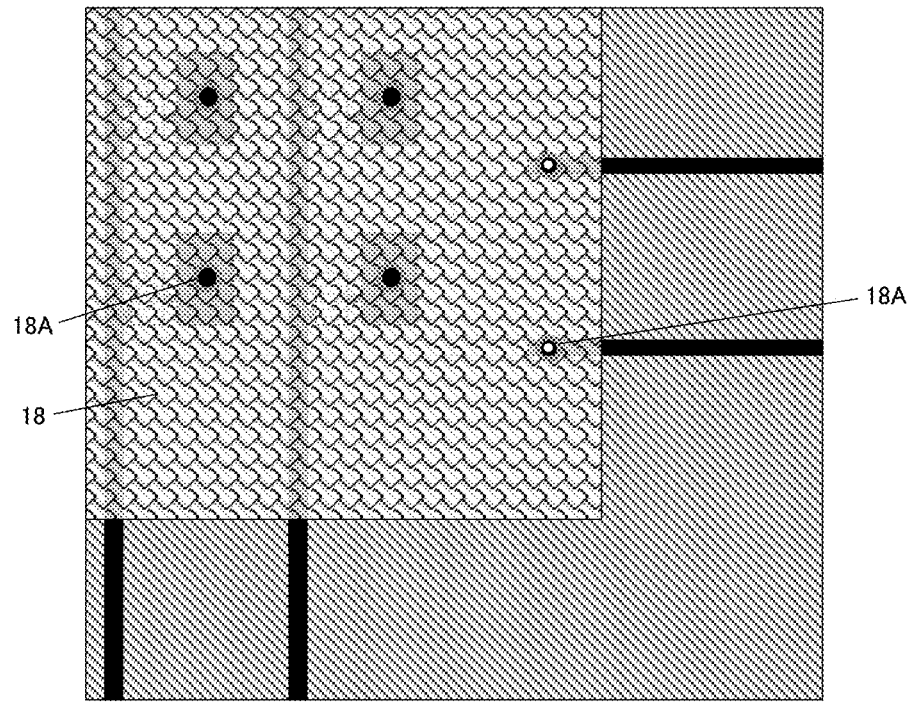
FIGS. 24A and 24B are plan views illustrating the manufacturing process of the thin film transistor array illustrated in FIG. 21.
Figure 24B:
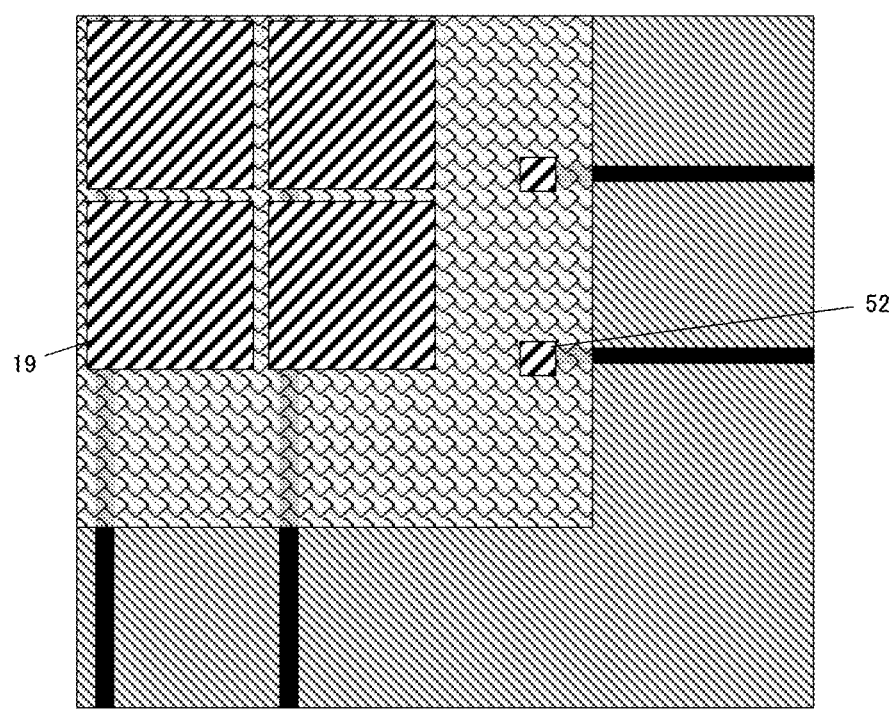

Next, epoxy resin was gravure-offset printed and thereafter fired, so that an interlayer insulating film 18 having openings 18A, i.e. a second insulating film 5 having openings 5A, was deposited (see FIG. 24A). Ag paste was gravure-offset printed and thereafter fired, so that a third electrode layer 6 was formed; the third electrode layer 6 includes upper pixel electrodes 19 and connection reinforcement electrodes 52 for the gate wires (see FIG. 24B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 7

An example 7 of the present invention will be described hereinafter with reference to FIGS. 25 to 28B. An element illustrated in FIG. 25 was manufactured in the process steps illustrated in FIGS. 26A to 28B.

First, Ag ink was reverse-offset printed on a PEN substrate as an insulating substrate 1 and thereafter fired, so that a first electrode layer 2 was formed on the PEN substrate. The first electrode layer 2 includes sources 14, source wires 14', drains 15, pixel electrodes 15', sources 34 of gate protective elements, drains 35 of the gate protective elements, sources 44 of source protective elements, drains 45 of the source protective elements, a gate common electrode 20G, and source connection electrodes 14C (see FIG. 26A).

Next, a polythiophene solution was ink-jet printed and thereafter fired at 100° C., so that semiconductor layers 16, semiconductors 36 for the gate protective elements, and semiconductors 46 for the source protective elements were formed (see FIG. 26B).

Figure 27A:
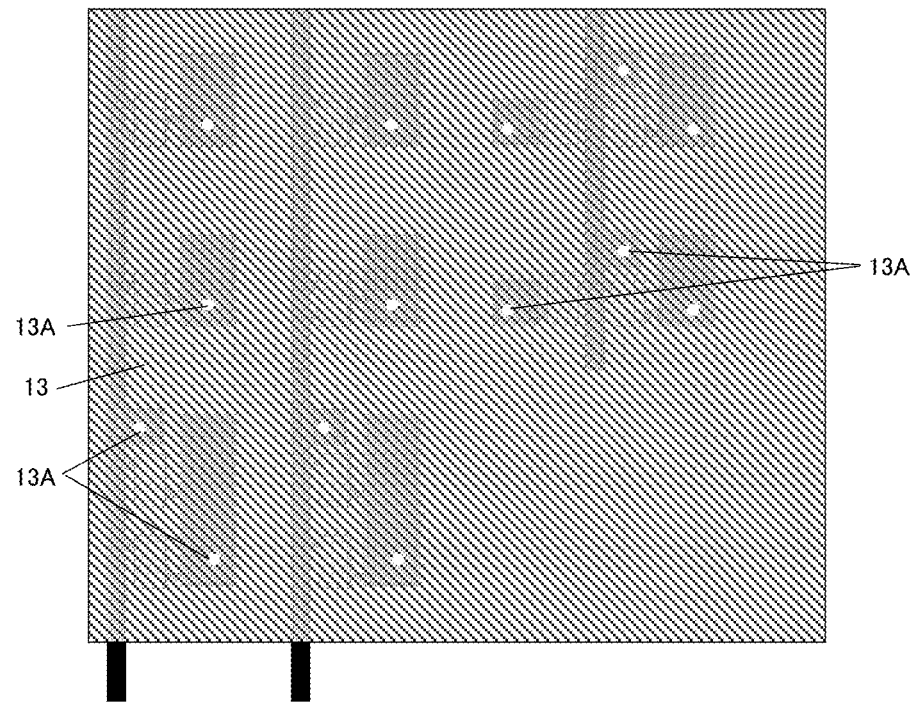
FIGS. 27A and 27B are plan views illustrating the manufacturing process of the thin film transistor array illustrated in FIG. 25.
Figure 27B:
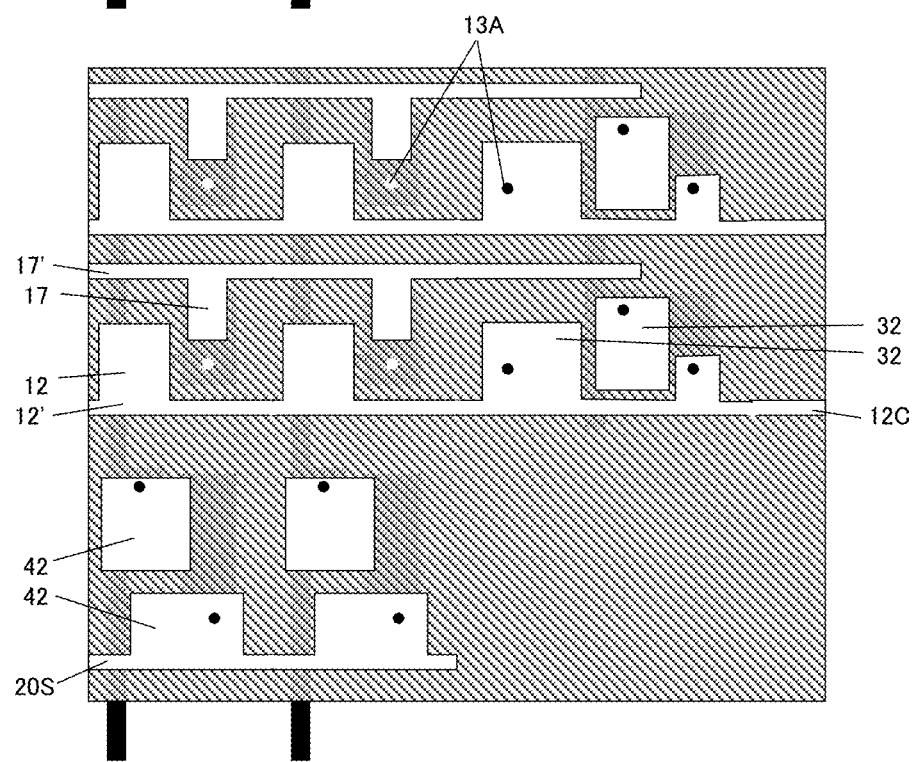

Thereafter, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 27A).

Ag ink was reverse-printed and thereafter fired at 180° C., so that a second electrode layer 4 having a pattern with a thickness of 50 nm was formed. The second electrode layer 4 includes gates 12, gate wires 12', capacitor electrodes 17, capacitor wires 17', gates 32 of the gate protective elements, gates 42 of the source protective elements, a source common electrode 20S, and gate connection electrodes 12C (see FIG. 27B).

Figure 28A:
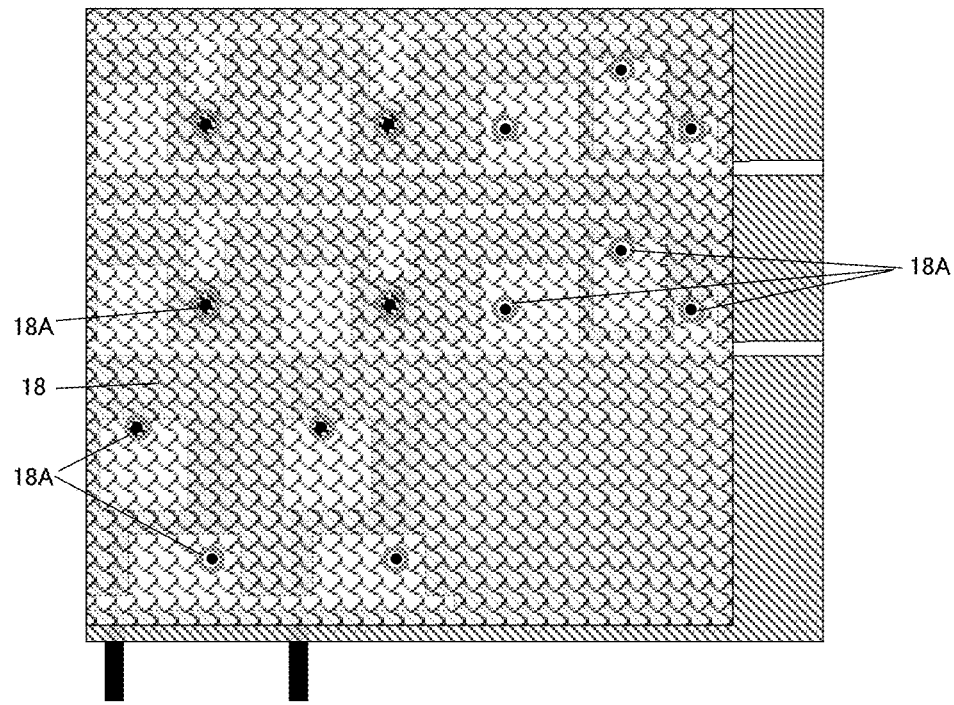
FIGS. 28A and 28B are plan views illustrating the manufacturing process of the thin film transistor array illustrated in FIG. 25.
Figure 28B:
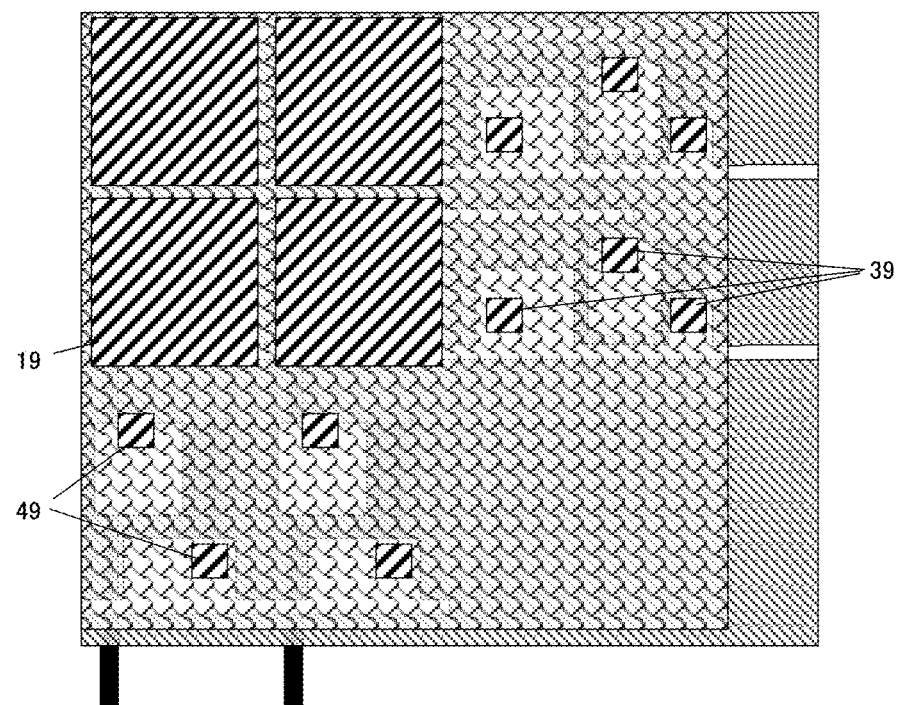

Next, epoxy resin was screen printed and thereafter fired, so that an interlayer insulating film 18 having openings 18A, i.e. a second insulating film 5 having openings 5A, was deposited (see FIG. 28A). Ag paste was screen printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 28B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 8

An example 8 of the present invention will be described hereinafter with reference to FIGS. 29 to 32B. An element illustrated in FIG. 29 was manufactured in the process steps illustrated in FIGS. 30A to 32B.

First, Ag ink was reverse-offset printed on a PEN substrate as an insulating substrate 1 and thereafter fired, so that a first electrode layer 2 was formed on the PEN substrate. The first electrode layer 2 includes sources 14, source wires 14', drains 15, pixel electrodes 15', sources 34 of gate protective elements, drains 35 of the gate protective elements, sources 44 of source protective elements, drains 45 of the source protective elements, a gate common electrode 20G, and source connection electrodes 14C (see FIG. 30A).

Next, a polythiophene solution was ink-jet printed and thereafter fired at 100° C., so that semiconductor layers 16, semiconductors 36 for the gate protective elements, and semiconductors 46 for the source protective elements were formed (see FIG. 30B).

Thereafter, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 31A).

Ag ink was reverse-printed and thereafter fired at 180° C., so that a second electrode layer 4 having a pattern with a thickness of 50 nm was formed. The second electrode layer 4 includes gates 12, gate wires 12', capacitor electrodes 17, capacitor wires 17', gates 32 of the gate protective elements, gates 42 of the source protective elements, a source common electrode 20S, and gate connection electrodes 12C (see FIG. 31B).

Figure 32A:
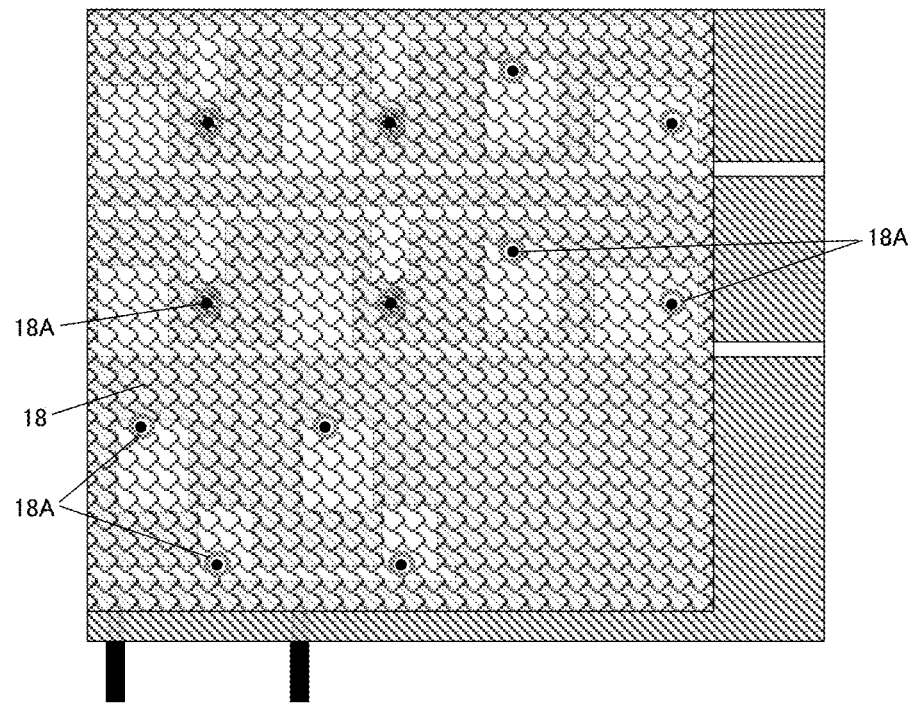
FIGS. 32A and 32B are plan views illustrating the manufacturing process of the thin film transistor array illustrated in FIG. 25.
Figure 32B:
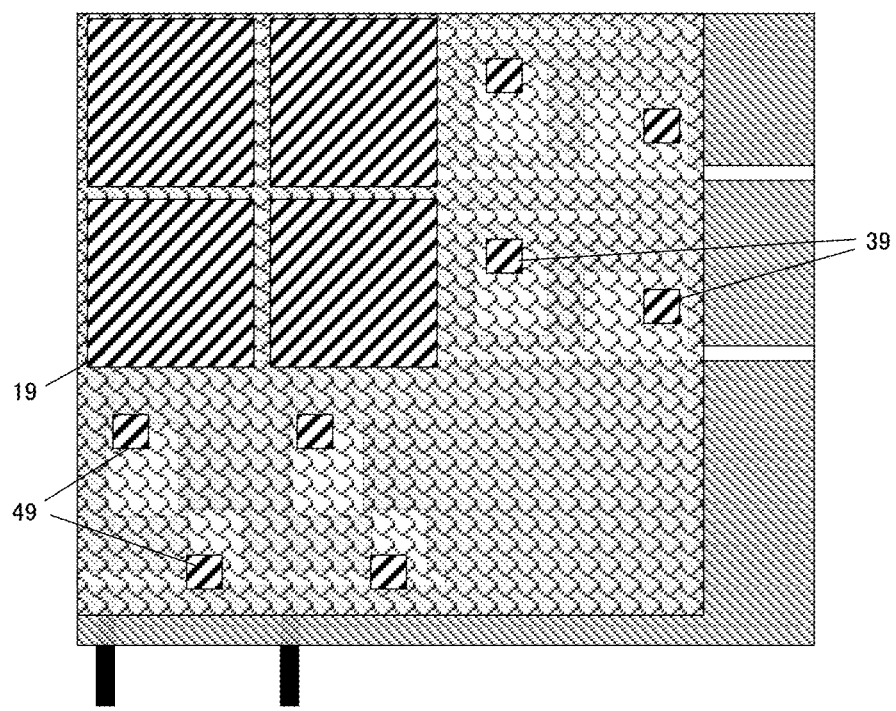

Next, epoxy resin was screen printed and thereafter fired, so that an interlayer insulating film 18 having openings 18A, i.e. a second insulating film 5 having openings 5A, was deposited (see FIG. 32A). Ag paste was screen printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 32B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 9

An example 9 of the present invention will be described hereinafter with reference to FIGS. 33 to 36B. An element illustrated in FIG. 33 was manufactured in the process steps illustrated in FIGS. 34A to 36B.

First, Ag ink was reverse-offset printed on a PEN substrate as an insulating substrate 1 and thereafter fired, so that a first electrode layer 2 was formed on the PEN substrate. The first electrode layer 2 includes sources 14, source wires 14', drains 15, pixel electrodes 15', sources 34 of gate protective elements, drains 35 of the gate protective elements, sources 44 of source protective elements, drains 45 of the source protective elements, a gate common electrode 20G, and source connection electrodes 14C (see FIG. 34A).

Next, a polythiophene solution was flexo printed and thereafter fired at 100° C., so that semiconductor layers 16, semiconductors 36 for the gate protective elements, and semiconductors 46 for the source protective elements were formed (see FIG. 34B).

Figure 35A:
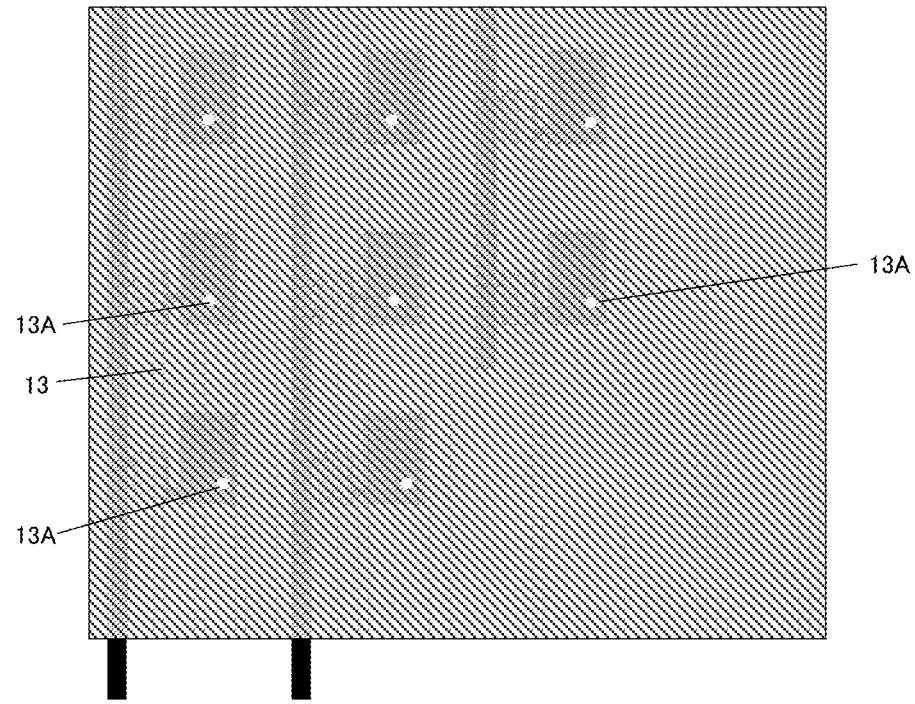
FIGS. 35A and 35B are plan views illustrating the manufacturing process of the thin film transistor array illustrated in FIG. 33.
Figure 35B:
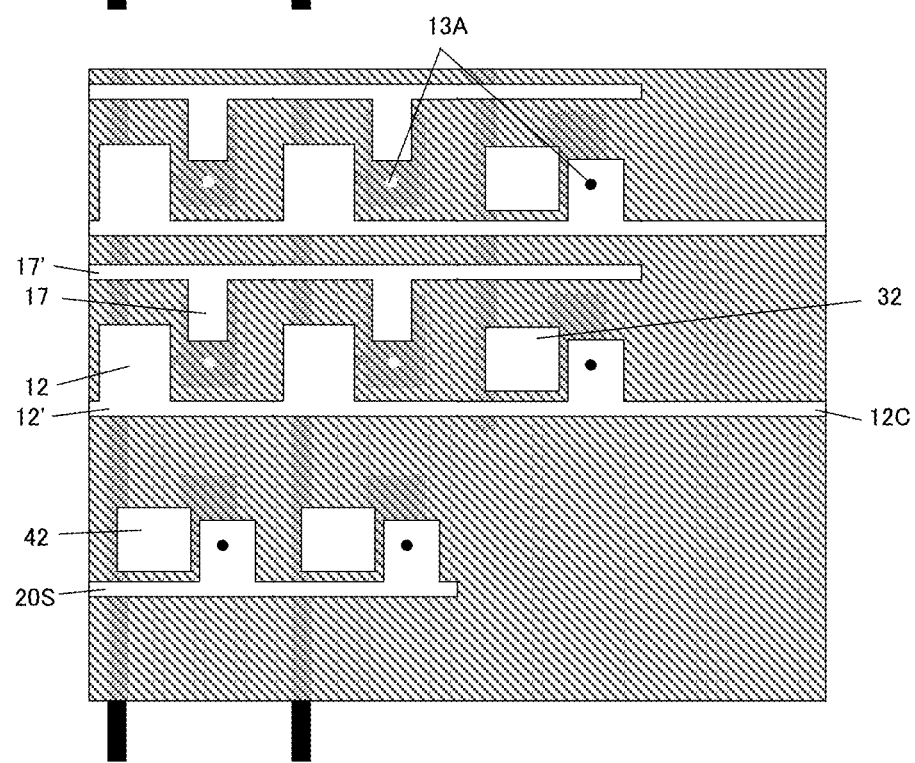

Thereafter, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 35A).

Ag ink was reverse-printed and thereafter fired at 180° C., so that a second electrode layer 4 having a pattern with a thickness of 50 nm was formed. The second electrode layer 4 includes gates 12, gate wires 12', capacitor electrodes 17, capacitor wires 17', gates 32 of the gate protective elements, gates 42 of the source protective elements, a source common electrode 20S, and gate connection electrodes 12C (see FIG. 35B).

Figure 36A:
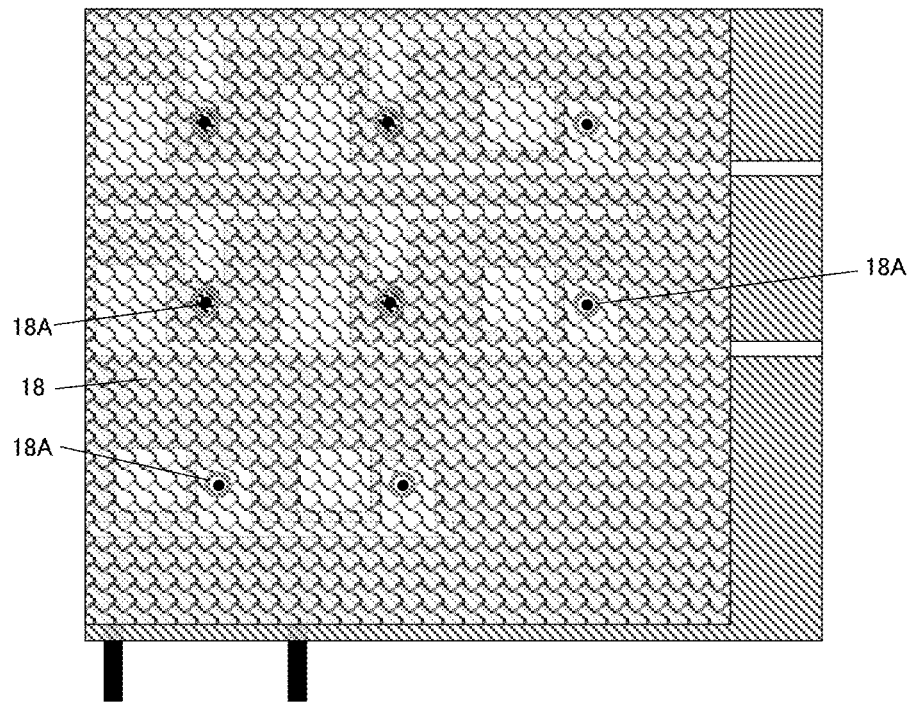
FIGS. 36A and 36B are plan views illustrating the manufacturing process of the thin film transistor array illustrated in FIG. 33.
Figure 36B:
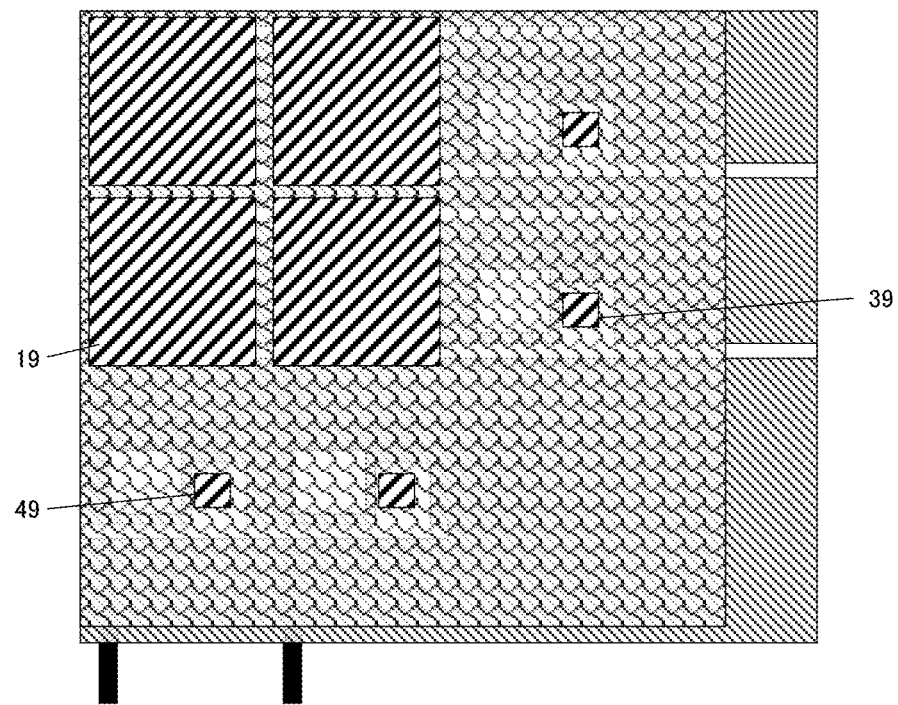

Next, epoxy resin was gravure-offset printed and thereafter fired, so that an interlayer insulating film 18 having openings 18A, i.e. a second insulating film 5 having openings 5A, was deposited (see FIG. 36A). Ag paste was gravure-offset printed and thereafter fired, so that a third electrode layer 6 was formed; the third electrode layer 6 includes upper pixel electrodes 19, connection reinforcement electrodes 39 for the gate protective elements, and connection reinforcement electrodes 49 for the source protective elements (see FIG. 36B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 10

An example 10 of the present invention will be described hereinafter with reference to FIGS. 37 to 40B. An element illustrated in FIG. 37 was manufactured in the process steps illustrated in FIGS. 38A to 40B.

First, Ag ink was reverse-offset printed on a PEN substrate as an insulating substrate 1 and thereafter fired, so that a first electrode layer 2 was formed on the PEN substrate. The first electrode layer 2 includes sources 14, source wires 14', drains 15, pixel electrodes 15', gate connection electrodes 12C, and source connection electrodes 14C (see FIG. 38A).

Next, a polythiophene solution was ink-jet printed and thereafter fired at 100° C., so that semiconductor layers 16 were formed (see FIG. 38B).

Figure 39A:
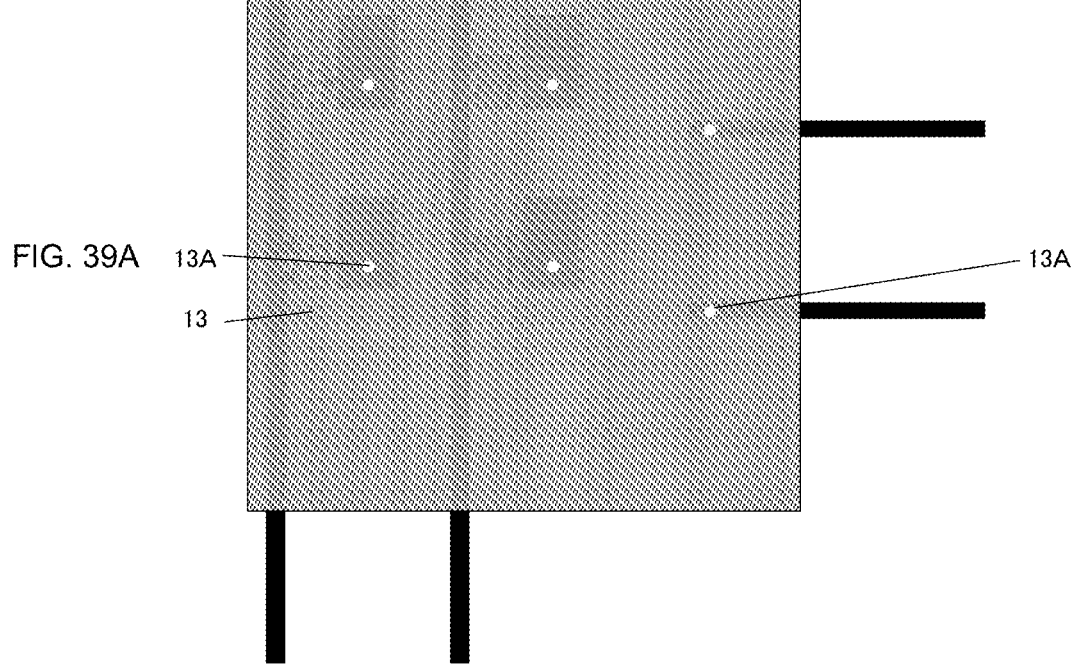
FIGS. 39A and 39B are plan views illustrating the manufacturing process of the thin film transistor array illustrated in FIG. 37.
Figure 39B:
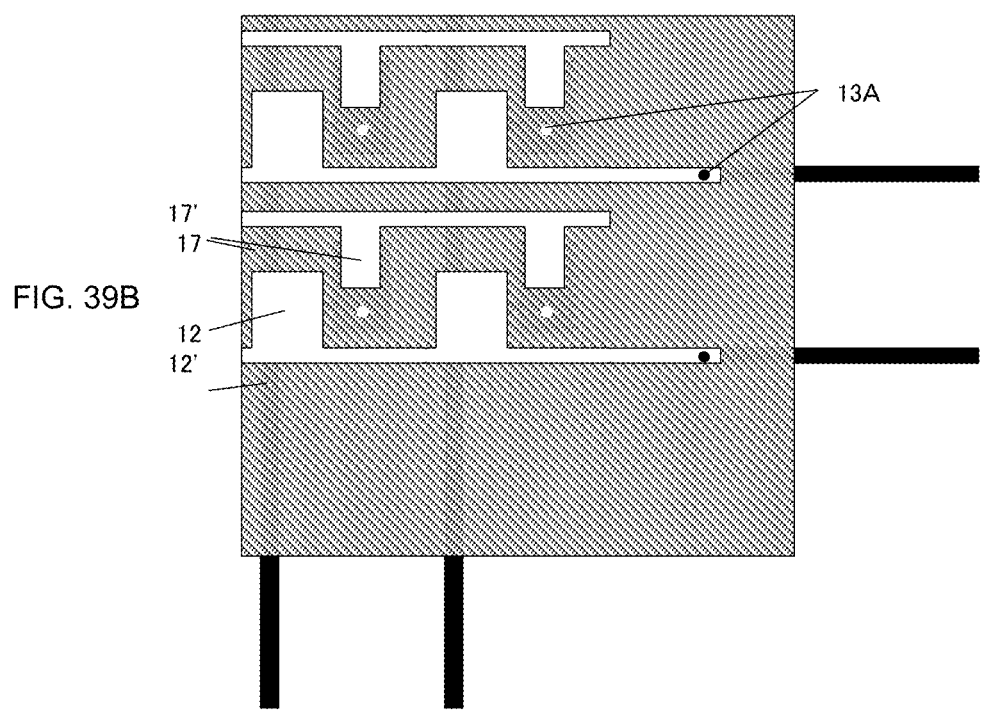

Thereafter, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 39A).

Ag ink was reverse-printed and thereafter fired at 180° C., so that a second electrode layer 4 having a pattern with a thickness of 50 nm was formed. The second electrode layer 4 includes gates 12, gate wires 12', capacitor electrodes 17, and capacitor wires 17' (see FIG. 39B).

Figure 40A:
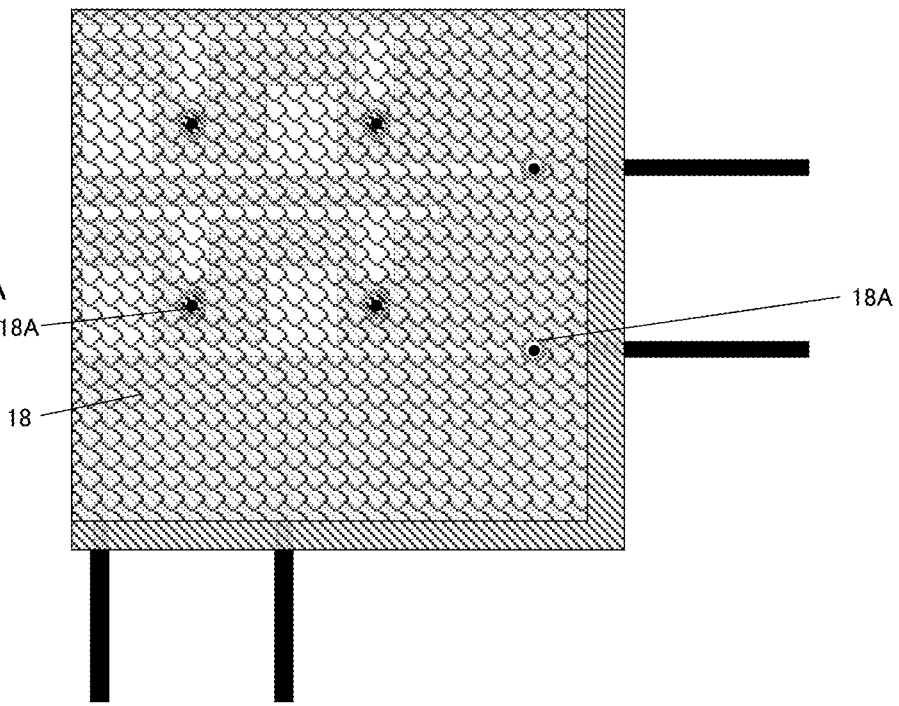
FIGS. 40A and 40B are plan views illustrating the manufacturing process of the thin film transistor array illustrated in FIG. 37.
Figure 40B:
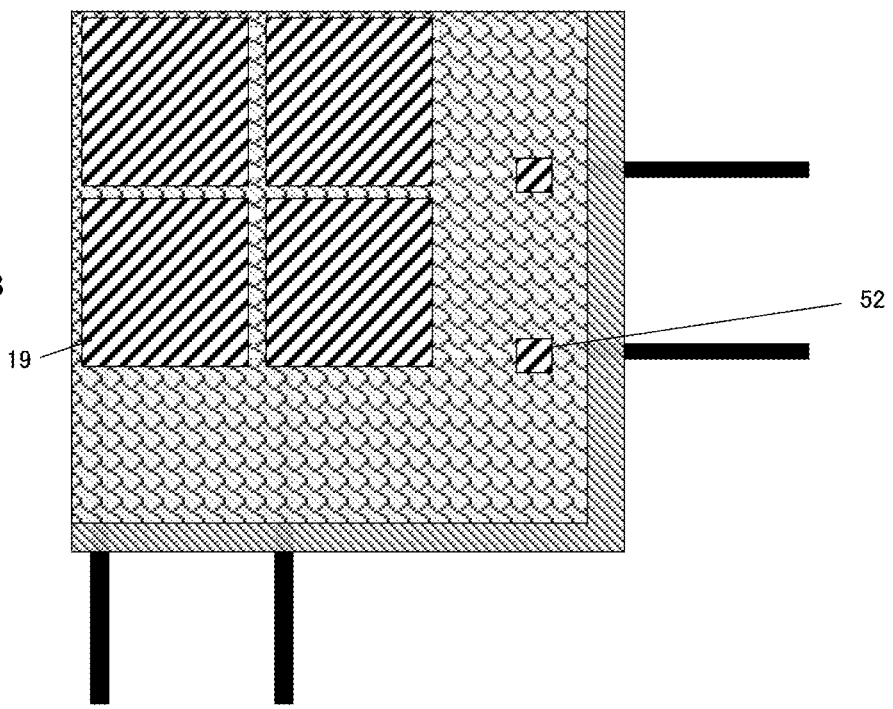

Next, epoxy resin was screen printed and thereafter fired, so that an interlayer insulating film 18 having openings 18A, i.e. a second insulating film 5 having openings 5A, was deposited (see FIG. 40A). Ag paste was screen printed and thereafter fired, so that a third electrode layer 6 was formed; the third electrode layer 6 includes upper pixel electrodes 19 and connection reinforcement electrodes 52 for the gate wires (see FIG. 40B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

Example 11

An example 11 of the present invention will be described hereinafter with reference to FIGS. 41 to 44B. An element illustrated in FIG. 41 was manufactured in the process steps illustrated in FIGS. 42A to 44B.

First, Ag ink was reverse-offset printed on a PEN substrate as an insulating substrate 1 and thereafter fired, so that a first electrode layer 2 was formed on the PEN substrate. The first electrode layer 2 includes sources 14, source wires 14', drains 15, and pixel electrodes 15' (see FIG. 42A).

Next, a polythiophene solution was flexo printed and thereafter fired at 100° C., so that semiconductor layers 16, semiconductors 36 for the gate protective elements, and semiconductors 46 for the source protective elements were formed (see FIG. 42B).

Figure 43A:
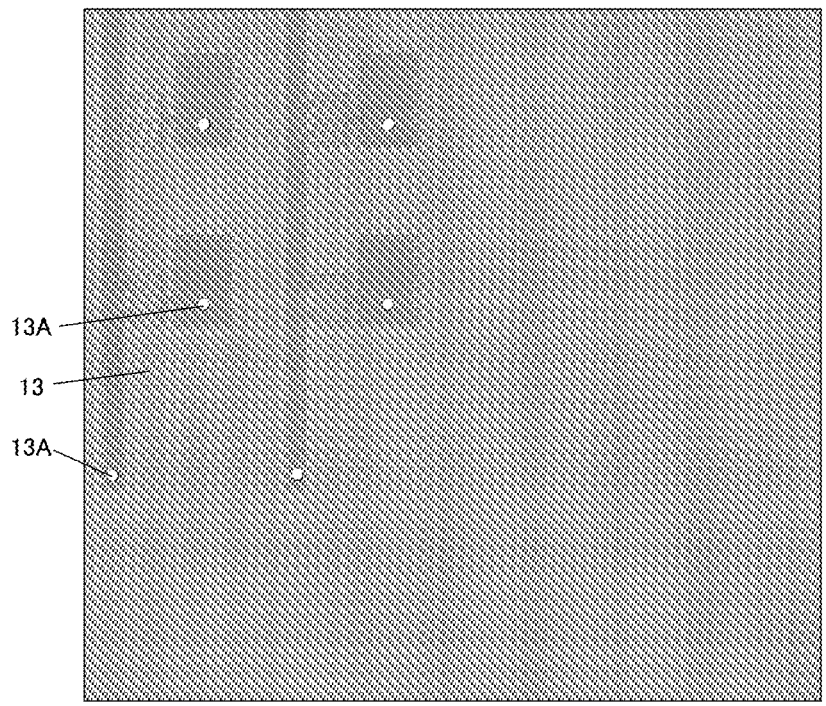
FIGS. 43A and 43B are plan views illustrating the manufacturing process of the thin film transistor array illustrated in FIG. 41.
Figure 43B:
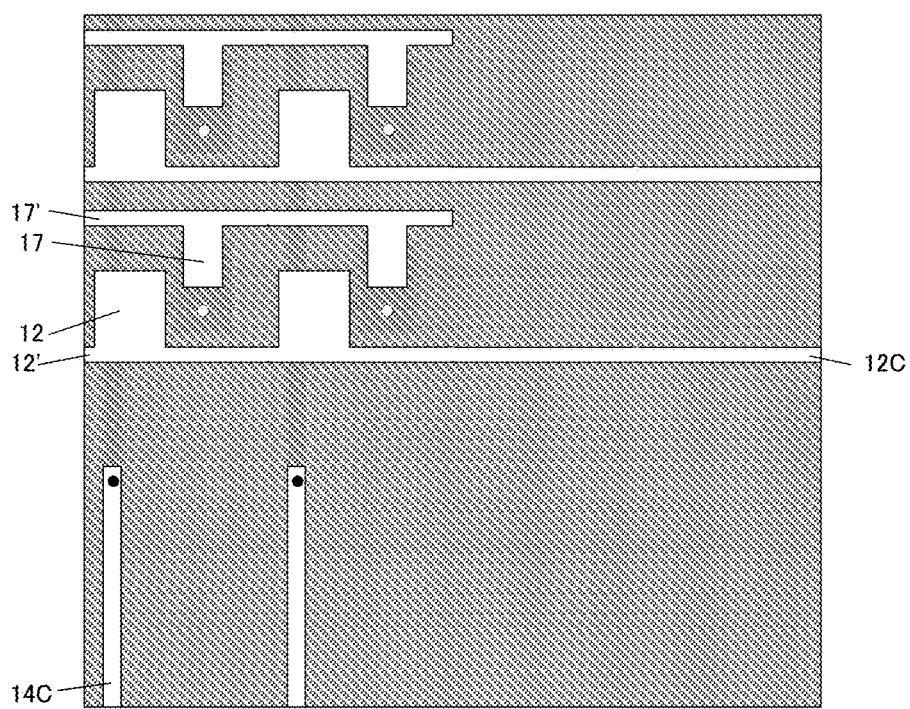

Thereafter, a light-sensitive organic material was applied by spin-coating, and an exposure and developing process was applied to the spin-coated organic material, so that a gate insulating film 13 having openings 13A, i.e. a first insulating film 3 having openings 3A, was deposited to have a thickness of 1 μm (see FIG. 43A).

Ag ink was reverse-printed and thereafter fired at 180° C., so that a second electrode layer 4 having a pattern with a thickness of 50 nm was formed. The second electrode layer 4 includes gates 12, gate wires 12', capacitor electrodes 17, capacitor wires 17', gate connection electrodes 12C, and source connection electrodes 14C (see FIG. 43B).

Figure 44A:
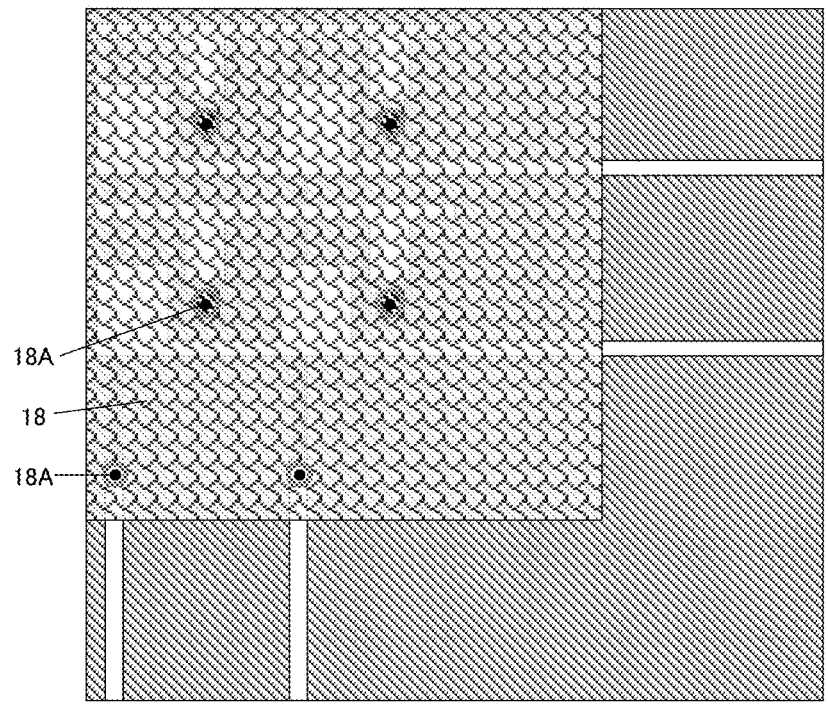
FIGS. 44A and 44B are plan views illustrating the manufacturing process of the thin film transistor array illustrated in FIG. 41.
Figure 44B:
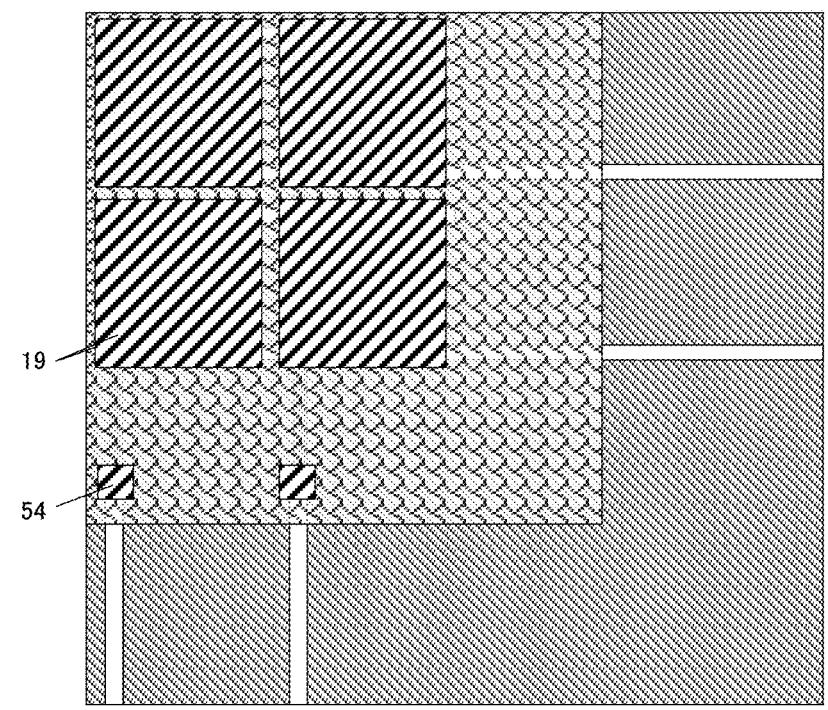

Next, epoxy resin was gravure-offset printed and thereafter fired, so that an interlayer insulating film 18 having openings 18A, i.e. a second insulating film 5 having openings 5A, was deposited (see FIG. 44A). Ag paste was gravure-offset printed and thereafter fired, so that a third electrode layer 6 was formed; the third electrode layer 6 includes upper pixel electrodes 19, and connection reinforcement electrodes 54 for the source wires (see FIG. 44B).

Thus, the thin film transistor array was manufactured. An electrophoretic display member was sandwiched by the thin film transistor array and a substrate having opposite electrodes, so that an electrophoretic display was manufactured. Functioning of each pixel of the display was confirmed.

INDUSTRIAL APPLICABILITY

The present invention is applied to displays and the like, such as liquid-crystal displays and organic light emitting displays.

As shown in the above descriptions, the present invention relates to layered structures, and, more particularly, to thin film transistors used for image display devices. Representative examples in accordance with the representative embodiments has been described herein, but the scope of the invention is not limited to the above description, and should be widely understood based on the scope of claim for patent. Further, based on the above description, it will be obvious that various changes and modifications can be made therein without departing from the scope of the invention.Description of characters 1 Substrate
2 First electrode layer
3 First insulating film
3A Opening of first insulating film
4 Second electrode layer
5 Second insulating film
5A Opening of second insulating film
6 Third electrode layer
10 Thin film transistor
12 Gate (gate electrode)
12' Gate wire
12C Gate connection electrode
13 Gate insulating film
13A Opening of gate insulating film
15 Source (source electrode)
14' Source wire
14C Source connection electrode
15 Drain (drain electrode)
15' Pixel electrode
16 Semiconductor
17 Capacitor electrode
17' Capacitor wire
18 Interlayer insulating film
18A Opening of interlayer insulating film
19 Upper pixel electrode
20 Common electrode
20G Gate common electrode
20S Source common electrode
30 Gate protective element
32 Gate of gate protective element
34 Source of gate protective element
35 Drain of gate protective element
36 Semiconductor for gate protective element
39 Connection reinforcement electrode for gate protective element
40 Source protective element
42 Gate of source protective element
44 Source of source protective element
45 Drain of source protective element
46 Semiconductor for source protective element
49 Connection reinforcement electrode for source protective element
52 Connection reinforcement electrode for gate wire
54 Connection reinforcement electrode for source wire

What is claimed is:

1. A layered structure comprising:
a first electrode layer on an insulating substrate, the first electrode layer including a gate wire; a gate electrode connected to the gate wire; a capacitor wire; and a capacitor electrode connected to the capacitor wire;
a first insulating film on the first electrode layer;
a second electrode layer on the first insulating film, the second electrode layer including a source wire; a source electrode connected to the source wire; a drain electrode; and a pixel electrode connected to the drain electrode;
a semiconductor located between the source electrode and the drain electrode, the gate electrode overlapping the semiconductor via the first insulating film, the capacitor electrode overlapping the pixel electrode via the first insulating film;
a second insulating film on the second electrode layer and having an opening on the pixel electrode;
a third electrode layer on the second insulating film, the third electrode layer comprising a plurality of reinforcement electrodes and including an upper pixel electrode connected to the pixel electrode via the opening, and
a floating-gate thin film transistor,
wherein the first electrode layer, an opening of the first insulating film, the second electrode layer, an opening of the second insulating film, and the third electrode layer have a stack structure that causes the first electrode layer and the second electrode layer to be connected,
the third electrode layer relaying or reinforcing, through the opening of the second insulating film, a connection between the first electrode layer and the second electrode layer,
a common electrode around the thin film transistor array, the common electrode comprising a gate common electrode and a source common electrode;

gate protective elements located between the gate wires and the gate common electrode;
source protective elements located between the source wires and the source common electrode, the common electrode being directly connected to a ground potential or the ground potential via a resistor,
wherein:
the gate common electrode is included in the second electrode layer,
the source common electrode is included in the first electrode layer,
at least one of the gate protective elements and the source protective elements comprises:
a pair of diode-connected thin film transistors connected in parallel to each other such that one of the diode-connected thin film transistors is opposite in direction to the other thereof;
a pair of diode-connected thin film transistors connected in series to each other such that one of the diode-connected thin film transistors is opposite in direction to the other thereof; or
a floating-gate thin film transistor, and
the third electrode layer relays or reinforces, as the connection between the first electrode layer and the second electrode layer, at least one of:
a short-circuit portion between a gate electrode and a source electrode of the gate protective element;
a short-circuit portion between a gate electrode and a source electrode of the source protective element;
a connection portion between the gate wire and the gate protective element; and
a connection portion between the source protective element and the source common electrode.

2. A thin film transistor array comprising, on an insulating substrate:
a first electrode layer including:
a gate wire;
a gate electrode connected to the gate wire;
a capacitor wire; and
a capacitor electrode connected to the capacitor wire;
a gate insulating film on the first electrode layer;
a second electrode layer on the gate insulating film, the second electrode layer including:
a source wire;
a source electrode connected to the source wire;
a drain electrode; and
a pixel electrode connected to the drain electrode;
a semiconductor located between the source electrode and the drain electrode, the gate electrode overlapping the semiconductor via the gate insulating film, the capacitor electrode overlapping the pixel electrode via the gate insulating film;
an interlayer insulating film having an opening on the pixel electrode;
a third electrode layer including an upper pixel electrode connected to the pixel electrode via the opening,
a common electrode around the thin film transistor array, the common electrode comprising a gate common electrode and a source common electrode;
gate protective elements located between the gate wires and the gate common electrode; and
source protective elements located between the source wires and the source common electrode, the common electrode being directly connected to a ground potential or the ground potential via a resistor,
wherein the first electrode layer, an opening of the gate insulating film, the second electrode layer, the opening of the interlayer insulating film, and the third electrode layer have a stack structure that causes the first electrode layer and the second electrode layer to be connected,
wherein the third electrode layer relays or reinforces, through the opening of the interlayer insulating film, a connection between the first electrode layer and the second electrode layer formed on the gate insulating film, and
wherein the third electrode layer comprises a plurality of reinforcement electrodes,
wherein
the gate common electrode is included in the second electrode layer,
the source common electrode is included in the first electrode layer,
at least one of the gate protective elements and the source protective elements comprises:
a pair of diode-connected thin film transistors connected in parallel to each other such that one of the diode-connected thin film transistors is opposite in direction to the other thereof;
a pair of diode-connected thin film transistors connected in series to each other such that one of the diode-connected thin film transistors is opposite in direction to the other thereof; or
a floating-gate thin film transistor, and
the third electrode layer relays or reinforces, as the connection between the first electrode layer and the second electrode layer, at least one of:
a short-circuit portion between a gate electrode and a source electrode of the gate protective element;
a short-circuit portion between a gate electrode and a source electrode of the source protective element;
a connection portion between the gate wire and the gate protective element; and
a connection portion between the source protective element and the source common electrode.

3. The thin film transistor array according to claim 2, wherein:
a gate connection electrode and a source connection electrode of the thin film transistor array are included in the first electrode layer, and
the third electrode layer relays or reinforces, as the connection between the first electrode layer and the second electrode layer, a connection portion between the source connection electrode and the source wire.

4. The thin film transistor array according to claim 2, wherein:
a gate connection electrode and a source connection electrode of the thin film transistor array are included in the second electrode layer, and
the third electrode layer relays or reinforces, as the connection between the first electrode layer and the second electrode layer, a connection portion between the gate wire and the gate connection electrode.

5. A thin film transistor array comprising, on an insulating substrate:
a first electrode layer including:
a source wire;
a source electrode connected to the source wire;
a drain electrode; and
a pixel electrode connected to the drain electrode;
semiconductors between the source electrodes and the drain electrodes;

a gate insulating film having an opening on the pixel electrode;

a second electrode layer on the gate insulating film, the second electrode layer including:
  a gate wire;
  a gate electrode connected to the gate wire;
  a capacitor wire; and
  a capacitor electrode connected to the capacitor wire,
  the gate electrode overlapping the semiconductor via the gate insulating film, the capacitor electrode overlapping the pixel electrode via the gate insulating film;

an interlayer insulating film having an opening above the opening of the gate insulating film; and a third electrode layer including an upper pixel electrode connected to the pixel electrode via the opening of the interlayer insulating film, a common electrode around the thin film transistor array, the common electrode comprising a gate common electrode and a source common electrode;

a gate protective element located between the gate wire and the gate common electrode;

a source protective element located between the source wire and the source common electrode, the common electrode being directly connected to a ground potential or the ground potential via a resistor, wherein the first electrode layer, the opening of the gate insulating film, the second electrode layer, the opening of the interlayer insulating film, and the third electrode layer have a stack structure that causes the first electrode layer and the second electrode layer to be connected, wherein the third electrode layer relays or reinforces, through the opening of the interlayer insulating film, a connection between the first electrode layer and the second electrode layer formed on the gate insulating film, and wherein the third electrode layer comprises a plurality of reinforcement electrodes, wherein:
  the gate common electrode is included in the first electrode layer,
  the source common electrode is included in the second electrode layer, at least one of the gate protective element and the source protective element comprises:
  a pair of diode-connected thin film transistors connected in parallel to each other such that one of the diode-connected thin film transistors is opposite in direction to the other thereof;
  a pair of diode-connected thin film transistors connected in series to each other such that one of the diode-connected thin film transistors is opposite in direction to the other thereof; or
  a floating-gate thin film transistor, and the third electrode layer relays or reinforces, as the connection between the first electrode layer and the second electrode layer, at least one of:
  a short-circuit portion between a drain electrode and a gate electrode of the gate protective element;
  a short-circuit portion between a drain electrode and a gate electrode of the source protective element;
  a connection portion between the gate protective element and the gate wire; and
  a connection portion between the source common electrode and the source protective element.

6. The thin film transistor array according to claim 5, wherein:
  a gate connection electrode and a source connection electrode of the thin film transistor array are included in the first electrode layer, and
  the third electrode layer relays or reinforces, as the connection between the first electrode layer and the second electrode layer, a connection portion between the gate connection electrode and the gate wire.

7. The thin film transistor array according to claim 5, wherein:
  a gate connection electrode and a source connection electrode of the thin film transistor array are included in the second electrode layer, and
  the third electrode layer relays or reinforces, as the connection between the first electrode layer and the second electrode layer, a connection portion between the source wire and the source connection electrode.

* * * * *